United States Patent
Yorisue et al.

(10) Patent No.: US 11,163,234 B2
(45) Date of Patent: Nov. 2, 2021

(54) PHOTOSENSITIVE RESIN COMPOSITION AND METHOD FOR PRODUCING CURED RELIEF PATTERN

(71) Applicant: ASAHI KASEI KABUSHIKI KAISHA, Tokyo (JP)

(72) Inventors: Tomohiro Yorisue, Tokyo (JP); Mitsutaka Nakamura, Tokyo (JP); Taihei Inoue, Tokyo (JP); Tatsuya Hirata, Tokyo (JP); Takahiro Sasaki, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 310 days.

(21) Appl. No.: 16/062,229

(22) PCT Filed: Aug. 17, 2017

(86) PCT No.: PCT/JP2017/029554
§ 371 (c)(1),
(2) Date: Jun. 14, 2018

(87) PCT Pub. No.: WO2018/037997
PCT Pub. Date: Mar. 1, 2018

(65) Prior Publication Data
US 2018/0373147 A1    Dec. 27, 2018

(30) Foreign Application Priority Data

Aug. 22, 2016 (JP) .................. JP2016-161681
Nov. 24, 2016 (JP) .................. JP2016-228240
Dec. 8, 2016 (JP) .................. JP2016-238452
Mar. 10, 2017 (JP) .................. JP2017-046022

(51) Int. Cl.
| | |
|---|---|
| G03F 7/038 | (2006.01) |
| G03F 7/037 | (2006.01) |
| C08G 73/10 | (2006.01) |
| G03F 7/027 | (2006.01) |
| G03F 7/023 | (2006.01) |
| C08G 73/12 | (2006.01) |
| C08L 79/08 | (2006.01) |
| G03F 7/20 | (2006.01) |

(52) U.S. Cl.
CPC ............ *G03F 7/037* (2013.01); *C08G 73/10* (2013.01); *C08G 73/1003* (2013.01); *C08G 73/128* (2013.01); *C08L 79/08* (2013.01); *G03F 7/027* (2013.01); *G03F 7/0233* (2013.01); *G03F 7/0387* (2013.01); *G03F 7/0388* (2013.01); *G03F 7/2012* (2013.01)

(58) Field of Classification Search
CPC ........ G03F 7/027; G03F 7/0387; G03F 7/037; G03F 7/0388
USPC ...................................... 430/287.1
See application file for complete search history.

(56) References Cited

U.S. PATENT DOCUMENTS

| | | | |
|---|---|---|---|
| 6,162,580 | A | 12/2000 | Matsuoka et al. |
| 6,596,445 | B1 | 7/2003 | Matsumoto et al. |
| 2005/0244739 | A1 | 11/2005 | Kanatani et al. |
| 2015/0353685 | A1 | 12/2015 | Enomoto et al. |
| 2017/0298186 | A1* | 10/2017 | Takemura .......... C08G 73/1042 |

FOREIGN PATENT DOCUMENTS

| | | |
|---|---|---|
| CN | 104285184 | 1/2015 |
| JP | S63-15847 A | 1/1988 |
| JP | 05-086154 A | 4/1993 |
| JP | H06-342211 A | 12/1994 |
| JP | H11-133604 A | 5/1999 |
| JP | 2000-80068 A | 3/2000 |
| JP | 2003-286345 A | 10/2003 |
| JP | 2003-287889 A | 10/2003 |
| JP | 2004-271801 A | 9/2004 |
| JP | 2012-194520 A | 10/2012 |
| JP | 2016-079340 A | 5/2016 |
| KR | 10-1719045 | 3/2017 |
| WO | 2014/097633 A1 | 6/2014 |

OTHER PUBLICATIONS

International Preliminary Report on Patentability Application No. PCT/JP2017/029554, dated Mar. 7, 2019.
International Search Report from Patent Application No. PCT/JP2017/029554, dated Nov. 7, 2017.
Office action issued in Taiwan Family Member Patent Application No. 106128350, dated May 28, 2018.

* cited by examiner

*Primary Examiner* — John A McPherson
(74) *Attorney, Agent, or Firm* — Greenblum & Bernstein, P.L.C.

(57) ABSTRACT

A negative-type photosensitive resin composition that has a satisfactory imidization rate and can yield a resin layer with high chemical resistance, even under low-temperature curing conditions of 200° C. or below, the negative-type photosensitive resin composition containing a photopolymerization initiator (B) in a proportion of 0.1 part by mass to 20 parts by mass with respect to 100 parts by mass of a polyimide precursor (A), the polyimide precursor (A) being a polyamic acid ester or polyamic acid salt with a specific structure, and the weight-average molecular weight (Mw) of the polyimide precursor (A) being 3,000 or greater and less than 16,000, in terms of polystyrene, according to gel permeation chromatography (GPC).

4 Claims, No Drawings

PHOTOSENSITIVE RESIN COMPOSITION AND METHOD FOR PRODUCING CURED RELIEF PATTERN

FIELD

Technical Field Relating to First Embodiment of the Invention

The present invention relates to a negative-type photosensitive resin composition to be used to form a relief pattern on an insulating material for electronic parts, or on a passivation film, buffer coat film or interlayer dielectric film for a semiconductor device, and to a method for producing a cured relief pattern using it.

Technical Field Relating to Second Embodiment of the Invention

The present invention further relates to a photosensitive resin composition to be used to form a relief pattern on an insulating material for electronic parts, or on a passivation film, buffer coat film or interlayer dielectric film for a semiconductor device, and to a method for producing a polyimide using it, and a semiconductor device.

BACKGROUND

Background Art Relating to First Embodiment of the Invention

Conventionally, insulating materials for electronic parts and passivation films, surface protecting films or interlayer dielectric films of semiconductor devices have employed polyimide resins, polybenzooxazole resins and phenol resins, which have excellent heat resistance, electrical characteristics and mechanical properties. Among such resins, those that are provided in the form of photosensitive resin compositions can easily form heat-resistant relief pattern films by thermal imidization treatment involving coating, exposure, development and curing of the compositions. Such photosensitive resin compositions allow this process to be drastically shortened, compared to conventional non-photosensitive materials.

At the same time, recent years have brought changes to the methods of mounting printed wiring boards for semiconductor devices, from the viewpoint of increasing integration and function and reducing chip sizes. There has been a trend away from the conventional mounting methods using metal pins and lead-tin eutectic solder, and toward structures wherein polyimide coating films directly contact with solder bumps, such as BGA (ball grid array) and CSP (chip-size packages), that allow high-density mounting. When forming such bump structures, the coating film is required to have high heat resistance and chemical resistance. Methods have been disclosed for adding thermal crosslinking agents to compositions containing polyimide precursors, in order to increase the heat resistance and chemical resistance of polyimide coating films (see PTL 1, for example).

Background Art Relating to Second Embodiment of the Invention

Conventionally, insulating materials for electronic parts and passivation films, surface protecting films or interlayer dielectric films of semiconductor devices have employed polyimide resins which have excellent heat resistance, electrical characteristics and mechanical properties. Among polyimide resins, those provided in the form of photosensitive polyimide precursor compositions can easily form heat-resistant relief pattern films by thermal imidization treatment involving coating, exposure, development and curing of the compositions (see PTL 2, for example). Such photosensitive polyimide precursor compositions allow this process to be drastically shortened, compared to conventional non-photosensitive polyimide materials.

Photosensitive polyimides can be classified as negative-types and positive-types, according to their mechanism of photosensitivity. Negative-types have the resin remaining on the exposed sections after exposure and development. Positive-types have the resin remaining on the unexposed sections after exposure and development. Positive-types have more excellent resolution and are therefore generally more widely used for purposes requiring fine patterns, but they must have strict in-plane uniformity for their film thickness. Negative-types, on the other hand, exhibit excellent reliability though having inferior resolution compared to positive-types, and are therefore widely used for purposes in which reliability is needed over pattern precision, but so far they have not been required to have rigorous in-plane uniformity of film thickness.

CITATION LIST

Patent Literature

[PTL 1] Japanese Unexamined Patent Publication No. 2003-287889

[PTL 2] Japanese Unexamined Patent Publication HEI No. 06-342211

SUMMARY

Technical Problem

Problems to be Solved by First Embodiment of the Invention

When obtaining a polyimide resin film by curing of a polyimide precursor to cause dehydrating cyclization, a high temperature of 300° C. or higher is usually required. However, curing under such conditions can potentially lower chip yields, depending on the device. Recently, therefore, processes for curing at low temperatures of 200° C. and below are desired.

However, when a polyimide precursor has been cured at a low temperature of 200° C. or below, the imide ring-forming reaction (imidization) is insufficient and the polyimide precursor remains in the resin film. This has led to a problem because the chemical resistance of the polyimide resin film is not adequate.

The present invention has been designed in light of these circumstances of the prior art, and its object is to provide a negative-type photosensitive resin composition having a satisfactory imidization rate even under low-temperature curing conditions of 200° C. or below, and yielding a resin layer with high chemical resistance, as well as a method for producing a cured relief pattern using the photosensitive resin composition.

Problems to be Solved by Second Embodiment of the Invention

Recently, with increasingly high performance of electronic devices it has become a goal to achieve both resolution and reliability for photosensitive polyimides as well. Therefore, even for negative-type photosensitive polyimides, for which reliability has conventionally been emphasized with relatively low requirement for resolution, it has become a goal to achieve higher resolution and more rigorous in-plane uniformity of film thickness.

The present invention has been designed in light of these circumstances of the prior art. Specifically, it is an object of the invention to provide a negative-type photosensitive polyimide resin composition with increased in-plane uniformity of film thickness when formed into a film.

Solution to Problem

Means for Solving the First Problem

The present inventors have found that, by using a photosensitive resin with a specific weight-average molecular weight (Mw), it is possible for imide ring-forming reaction (imidization) of polyimides to proceed satisfactorily even under low-temperature curing conditions of 200° C. or below, thereby obtaining a resin layer with high chemical resistance, and have thereupon completed this invention. Specifically, the present invention provides the following.

[1]

A negative-type photosensitive resin composition comprising:

(A) a polyimide precursor at 100 parts by mass; and (B) a photopolymerization initiator at 0.1 part by mass to 20 parts by mass; wherein the polyimide precursor (A) is a polyamic acid ester or polyamic acid salt represented by the following formula (1):

[Chemical Formula 1]

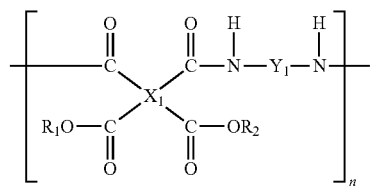
(1)

{wherein $X_1$ is a tetravalent organic group of 6 to 40 carbon atoms, $Y_1$ is a divalent organic group of 6 to 40 carbon atoms, n is an integer of 2 to 50, and $R_1$ and $R_2$ each independently represent a hydrogen atom, a group represented by the following formula (2):

[Chemical Formula 2]

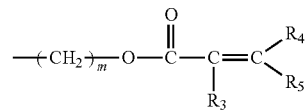
(2)

(wherein $R_3$, $R_4$ and $R_5$ are each independently a hydrogen atom or a monovalent organic group of 1 to 3 carbon atoms, and m is an integer of 2 to 10), or a group represented by the following formula (3):

[Chemical Formula 3]

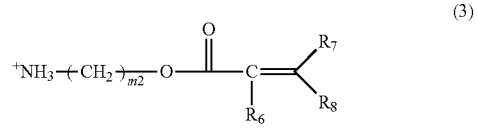
(3)

(wherein $R_6$, $R_7$ and $R_8$ are each independently a hydrogen atom or an organic group of 1 to 3 carbon atoms, and $m_2$ is an integer of 2 to 10), with the proviso that $R_1$ and $R_2$ are not both hydrogen}, and the weight-average molecular weight (Mw) of the polyimide precursor (A) is 3,000 or greater and less than 16,000 in terms of polystyrene, according to gel permeation chromatography (GPC).

[2]

The negative-type photosensitive resin composition according to [1], wherein in formula (1), $X_1$ is at least one tetravalent organic group selected from among the following formulas (4) to (6):

[Chemical Formula 4]

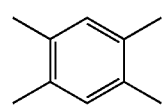
(4)

[Chemical Formula 5]

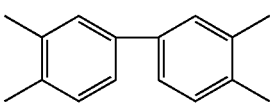
(5)

[Chemical Formula 6]

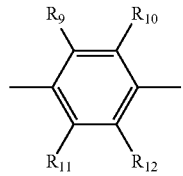
(6)

in formula (1), $Y_1$ is at least one divalent organic group selected from among groups represented by the following formula (7):

[Chemical Formula 7]

(7)

(wherein $R_9$-$R_{12}$ are each a hydrogen atom or a monovalent aliphatic group of 1 to 4 carbon atoms, which may be different from each other or the same), the following formula (8):

[Chemical Formula 8]

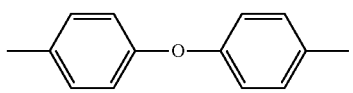
(8)

or the following formula (9):

[Chemical Formula 9]

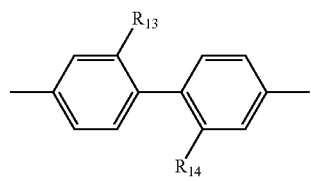
(9)

(wherein $R_{13}$-$R_{14}$ are each independently a fluorine atom or a trifluoromethyl or methyl group).

[3]

The negative-type photosensitive resin composition according to [2], wherein in formula (1), $X_1$ includes formula (6) and $Y_1$ includes formula (8).

[4]

The negative-type photosensitive resin composition according to [3], wherein the weight-average molecular weight (Mw) of the polyimide precursor (A) is 3,000 or greater and 13,000 or less, in terms of polystyrene, according to gel permeation chromatography (GPC).

[5]

The negative-type photosensitive resin composition according to [4], wherein the weight-average molecular weight (Mw) of the polyimide precursor (A) is 3,000 or greater and less than 10,000, in terms of polystyrene, according to gel permeation chromatography (GPC).

[6]

The negative-type photosensitive resin composition according to [2], wherein in formula (1), $X_1$ includes formula (6) and $Y_1$ includes formula (7).

[7]

The negative-type photosensitive resin composition according to [6], wherein the weight-average molecular weight (Mw) of the polyimide precursor (A) is 3,000 or greater and 13,000 or less, in terms of polystyrene, according to gel permeation chromatography (GPC).

[8]

The negative-type photosensitive resin composition according to [2], wherein in formula (1), $X_1$ includes formula (5) and $Y_1$ includes formula (8).

[9]

The negative-type photosensitive resin composition according to [8], wherein the weight-average molecular weight (Mw) of the polyimide precursor (A) is 3,000 or greater and 13,000 or less, in terms of polystyrene, according to gel permeation chromatography (GPC).

[10]

The negative-type photosensitive resin composition according to [2], wherein in formula (1), $X_1$ includes formula (5), and $Y_1$ includes at least one selected from the group consisting of formulas (7) and (9).

[11]

The negative-type photosensitive resin composition according to [10], wherein the weight-average molecular weight (Mw) of the polyimide precursor (A) is 3,000 or greater and 13,000 or less, in terms of polystyrene, according to gel permeation chromatography (GPC).

[12]

The negative-type photosensitive resin composition according to [12], wherein in formula (1), $X_1$ includes formula (4) and $Y_1$ includes formula (7).

[13]

The negative-type photosensitive resin composition according to [12], wherein the weight-average molecular weight (Mw) of the polyimide precursor (A) is 3,000 or greater and 13,000 or less, in terms of polystyrene, according to gel permeation chromatography (GPC).

[14]

A positive-type photosensitive resin composition comprising:

(A2) a polybenzooxazole precursor at 100 parts by mass; and (B2) a photoacid generator at 0.1 part by mass to 20 parts by mass; wherein the polybenzooxazole precursor (A2) is a compound of the following formula (12):

[Chemical Formula 10]

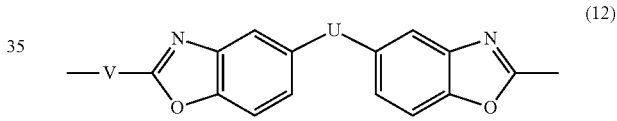
(12)

{wherein U and V are divalent organic groups}, and the weight-average molecular weight (Mw) of the polybenzooxazole precursor (A2) is 3,000 or greater and less than 16,000 in terms of polystyrene, according to gel permeation chromatography (GPC).

[15]

The positive-type photosensitive resin composition according to [14], wherein in formula (12), U is a divalent organic group of 1 to 30 carbon atoms.

[16]

The positive-type photosensitive resin composition according to [14], wherein in formula (12), U is a straight-chain alkylene group of 1 to 8 carbon atoms and having one or all of the hydrogen atoms replaced with fluorine.

[17]

The positive-type photosensitive resin composition according to any one of [14] to [16], wherein in formula (12), V is a divalent organic group containing an aromatic group.

[18]

The positive-type photosensitive resin composition according to [17], wherein in formula (12), V includes at least one structure represented by the following formulas (13) to (15).

[Chemical Formula 11]

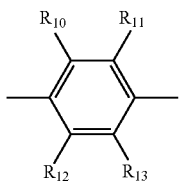
(13)

($R_{10}$, $R_{11}$, $R_{12}$ and $R_{13}$ are hydrogen atoms or monovalent aliphatic groups of 1 to 5 carbon atoms, which may be the same or different.)

[Chemical Formula 12]

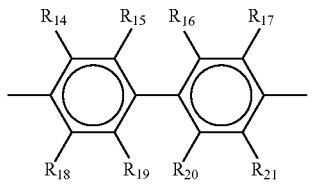
(14)

($R_{14}$-$R_{21}$ are hydrogen atoms, halogen atoms or monovalent organic groups of 1 to 5 carbon atoms, which may be different from each other or the same.)

[Chemical Formula 13]

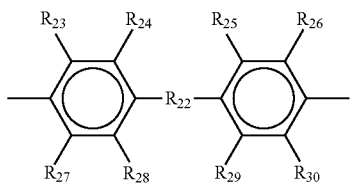
(15)

($R_{22}$ is a divalent group, and $R_{23}$-$R_{30}$ are hydrogen atoms, halogen atoms or monovalent aliphatic groups of 1 to 5 carbon atoms, which may be the same or different.)

[19]

The positive-type photosensitive resin composition according to [18], wherein in formula (12), V includes a structure represented by the following formula (16).

[Chemical Formula 14]

$$\text{---}\underset{}{\bigcirc}\text{---O---}\underset{}{\bigcirc}\text{---} \quad (16)$$

[20]

A method for producing a cured relief pattern, comprising:

(1) a step of coating a photosensitive resin composition according to any one of [1] to [19] onto a substrate to form a photosensitive resin layer on the substrate, (2) a step of exposing the photosensitive resin layer to light, (3) a step of developing the exposed photosensitive resin layer to form a relief pattern, and (4) a step of heat treating the relief pattern to form a cured relief pattern.

[21]

The method for producing a cured relief pattern according to [20], wherein the substrate is made of copper or a copper alloy.

Means for Solving the Second Problem

The present inventors have found that the aforementioned object is achieved by using a negative-type photosensitive resin composition with a specific viscosity, containing a polyimide precursor having a reactive substituent on the ends, and the invention has been completed upon this finding. Specifically, the present invention provides the following.

[1]

A negative-type photosensitive resin composition containing a photosensitive polyimide precursor having on the ends of the main chain a reactive substituent that reacts by heat or light, and having a viscosity of 80 poise or lower.

[2]

The photosensitive resin composition according to [1], wherein the reactive substituent includes at least one selected from the group consisting of the following groups:

acryl, methacryl, vinyl, alkenyl, cycloalkenyl, alkadienyl, cycloalkadienyl, styryl, ethynyl imino, isocyanato, cyanato, cycloalkyl, epoxy, oxetanyl, carbonate, hydroxyl, mercapto, methylol and alkoxyalkyl groups.

[3]

The photosensitive resin composition according to [2], wherein the reactive substituent includes at least one selected from the group consisting of acryl, methacryl, vinyl, alkenyl, cycloalkenyl, alkadienyl, cycloalkadienyl, styryl and ethynyl groups.

[4]

The photosensitive resin composition according to [3], wherein the reactive substituent includes a methacryl group.

[15]

The photosensitive resin composition according to any one of [1] to [4], wherein the photosensitive polyimide precursor is a photosensitive polyimide precursor including a structure represented by the following formula (A1):

[Chemical Formula 15]

$$\left[ \begin{array}{c} \overset{O}{\underset{\|}{C}} \overset{O}{\underset{\|}{C}} \overset{H}{\underset{|}{N}} - Y - \overset{H}{\underset{|}{N}} \\ R_5O - \overset{\|}{\underset{O}{C}} \overset{X}{\underset{\|}{C}} - OR_6 \end{array} \right] \quad (A1)$$

{In formula (A1), X is a tetravalent organic group, Y is a divalent organic group, $R_5$ and $R_6$ are each independently a hydrogen atom, a monovalent organic group represented by the following formula (R1):

[Chemical Formula 16]

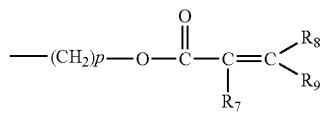

(R1)

(In formula (R1), $R_7$, $R_8$ and $R_9$ are each independently a hydrogen atom or a $C_1$-$C_3$ organic group, and p is an integer selected from 1 to 10), or a $C_1$-$C_4$ saturated aliphatic group, with the proviso that $R_5$ and $R_6$ are not both hydrogen}, and at least one end of the main chain of the photosensitive polyimide precursor has a structure of the following formula (E1) or (F1).

[Chemical Formula 17]

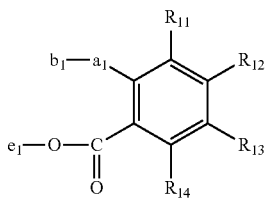

(E1)

(In the formula, a1 includes at least one group that is an amide bond, imide bond, urea bond or urethane bond, b1 is a reactive substituent that crosslinks by heat or light, e1 is a monovalent organic group of 1 to 30 carbon atoms, $R_{11}$ and $R_{14}$ are each independently a hydrogen atom or a monovalent organic group of 1 to 30 carbon atoms, and $R_{12}$ and $R_{13}$ are each independently a hydrogen atom, a monovalent organic group of 1 to 30 carbon atoms, or part of an aromatic ring or an aliphatic ring. (This is with the proviso that $R_{12}$ and $R_{13}$ are not both hydrogen.)

[Chemical Formula 18]

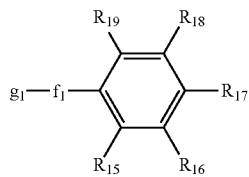

(F1)

(In the formula, f1 includes at least one group that is an amide bond, imide bond, urea bond, urethane bond or ester bond, g1 is a reactive substituent that crosslinks by heat or light, $R_{15}$-$R_{19}$ are each independently a hydrogen atom, a monovalent organic group of 1 to 30 carbon atoms, or part of an aromatic ring or an aliphatic ring. (This is with the proviso that $R_{16}$, $R_{17}$ and $R_{18}$ are not all hydrogen.)

[6]
The negative-type photosensitive resin composition according to [5], wherein b1 and g1 are reactive substituents having double bonds at the ends.

[7]
The negative-type photosensitive resin composition according to [5] or [6], wherein at least one end of the main chain of the photosensitive polyimide precursor includes the structure of formula (F1).

[8]
The negative-type photosensitive resin composition according to [7], wherein f1 includes at least one group from among amide, imide, urea and urethane groups.

[9]
The photosensitive resin composition according to [5], wherein b1 includes at least one selected from the group consisting of acryl, methacryl, vinyl, alkenyl, cycloalkenyl, alkadienyl, cycloalkadienyl, styryl, ethynyl, imino, isocyanato, cyanato, cycloalkyl, epoxy, oxetanyl, carbonate, hydroxyl, mercapto, methylol and alkoxyalkyl groups.

[10]
The photosensitive resin composition according to [9], wherein b1 includes at least one selected from the group consisting of acryl, methacryl, vinyl, alkenyl, cycloalkenyl, alkadienyl, cycloalkadienyl, styryl and ethynyl groups.

[11]
The photosensitive resin composition according to [10], wherein the reactive substituent that crosslinks by heat or light b1 includes a methacryl group.

[12]
The photosensitive resin composition according to [5], wherein the reactive substituent that crosslinks by heat or light g1 includes at least one selected from the group consisting of acryl, methacryl, vinyl, alkenyl, cycloalkenyl, alkadienyl, cycloalkadienyl, styryl, ethynyl, imino, isocyanato, cyanato, cycloalkyl, epoxy, oxetanyl, carbonate, hydroxyl mercapto, methylol and alkoxyalkyl groups.

[13]
The photosensitive resin composition according to [12], wherein the reactive substituent that crosslinks by heat or light g1 includes at least one selected from the group consisting of acryl, methacryl, vinyl, alkenyl, cycloalkenyl, alkadienyl, cycloalkadienyl, styryl and ethynyl groups.

[14]
The photosensitive resin composition according to [13], wherein the reactive substituent that crosslinks by heat or light g1 includes a methacryl group.

[15]
The negative-type photosensitive resin composition according to [5], wherein in formula (A1), X contains at least one tetravalent organic group selected from among the following formulas (B1) to (B3):

[Chemical Formula 19]

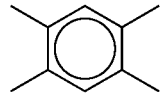

(B1)

[Chemical Formula 20]

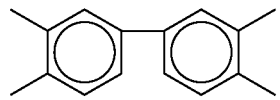

(B2)

[Chemical Formula 21]

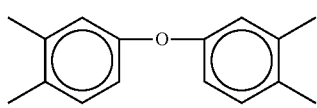

(B3)

and Y is at least one divalent organic group selected from among the following formulas (C1) to (C3):

[Chemical Formula 22]

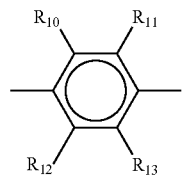

(In formula (C1), $R_{10}$-$R_{13}$ are hydrogen atoms or $C_1$-$C_4$ monovalent aliphatic groups, which may be different from each other or the same.)

[Chemical Formula 23]

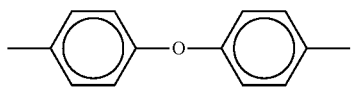

[Chemical Formula 24]

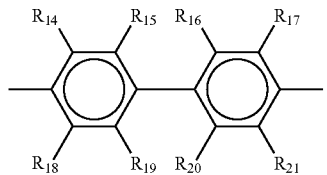

(In formula (C3), $R_{14}$-$R_{21}$ are hydrogen atoms, halogen atoms or $C_1$-$C_4$ monovalent organic groups, which may be different from each other or the same.).

[16]

The negative-type photosensitive resin composition according to [15], wherein in formula (A1), X includes formula (B3) and Y includes formula (C2).

[17]

The negative-type photosensitive resin composition according to [16], wherein the weight-average molecular weight (Mw) of the polyimide precursor (A) is 3,000 or greater and 13,000 or less, in terms of polystyrene, according to gel permeation chromatography (GPC).

[18]

The negative-type photosensitive resin composition according to [17], wherein the weight-average molecular weight (Mw) of the polyimide precursor (A) is 3,000 or greater and less than 10,000, in terms of polystyrene, according to gel permeation chromatography (GPC).

[19]

The negative-type photosensitive resin composition according to [15], wherein in formula (A1), X includes formula (B3) and Y includes formula (C1).

[20]

The negative-type photosensitive resin composition according to [19], wherein the weight-average molecular weight (Mw) of the polyimide precursor (A) is 3,000 or greater and 13,000 or less, in terms of polystyrene, according to gel permeation chromatography (GPC).

[21]

The negative-type photosensitive resin composition according to [15], wherein in formula (A1), X includes formula (B2) and Y includes formula (C2).

[22]

The negative-type photosensitive resin composition according to [21], wherein the weight-average molecular weight (Mw) of the polyimide precursor (A) is 3,000 or greater and 13,000 or less, in terms of polystyrene, according to gel permeation chromatography (GPC).

[23]

The negative-type photosensitive resin composition according to [15], wherein in formula (A1), X includes formula (B2), and $Y_1$ includes at least one selected from the group consisting of formulas (C1) and (C3).

[24]

The negative-type photosensitive resin composition according to [23], wherein the weight-average molecular weight (Mw) of the polyimide precursor (A) is 3,000 or greater and 13,000 or less, in terms of polystyrene, according to gel permeation chromatography (GPC).

[25]

The negative-type photosensitive resin composition according to [15], wherein in formula (A1), X includes formula (B1) and Y includes formula (C1).

[26]

The negative-type photosensitive resin composition according to [25], wherein the weight-average molecular weight (Mw) of the polyimide precursor (A) is 3,000 or greater and 13,000 or less, in terms of polystyrene, according to gel permeation chromatography (GPC).

[27]

The photosensitive resin composition according to any one of [1] to [26], wherein the viscosity is 40 poise or lower.

[28]

The photosensitive resin composition according to [27], wherein the viscosity is 20 poise or lower.

[29]

A negative-type photosensitive resin composition containing a photosensitive polyimide precursor having, at the ends of the main chain, a reactive substituent that reacts by heat or light, wherein the photosensitive polyimide precursor includes a structure represented by the following formula (A1):

[Chemical Formula 25]

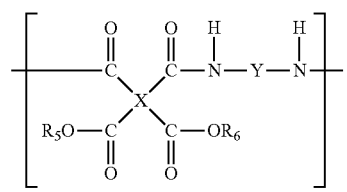

{In formula (A1), X is a tetravalent organic group, Y is a divalent organic group, $R_5$ and $R_6$ are each independently a hydrogen atom, a monovalent organic group represented by the following formula (R1):

[Chemical Formula 26]

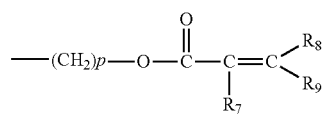

(In formula (R1), $R_7$, $R_8$ and $R_9$ are each independently a hydrogen atom or a $C_1$-$C_3$ organic group, and p is an integer selected from 1 to 10.), or a $C_1$-$C_4$ saturated aliphatic group, with the proviso that $R_5$ and $R_6$ are not both hydrogen}, and at least one end of the main chain of the photosensitive polyimide precursor has a structure of the following formula (E1) or (F1).

[Chemical Formula 27]

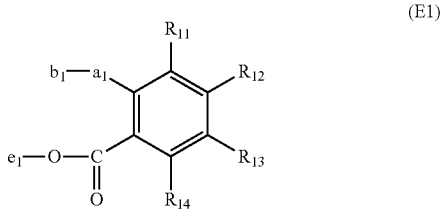

(E1)

(In the formula, a1 includes at least one bond that is an amide bond, imide bond, urea bond or urethane bond, b1 is a reactive substituent that crosslinks by heat or light, e1 is a monovalent organic group of 1 to 30 carbon atoms, $R_{11}$ and $R_{14}$ are each independently a hydrogen atom or a monovalent organic group of 1 to 30 carbon atoms, and $R_{12}$ and $R_{13}$ are each independently a hydrogen atom, a monovalent organic group of 1 to 30 carbon atoms, or part of an aromatic ring or an aliphatic ring. (This is with the proviso that $R_{12}$ and $R_{13}$ are not both hydrogen.)

[Chemical Formula 28]

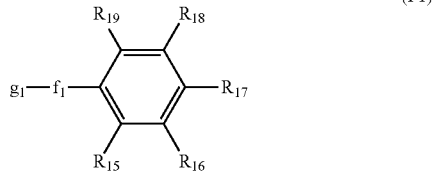

(F1)

(In the formula, f1 includes at least one bond that is an amide bond, imide bond, urea bond, urethane bond or ester bond, g1 is a reactive substituent that crosslinks by heat or light, $R_{15}$-$R_{19}$ are each independently a hydrogen atom, a monovalent organic group of 1 to 30 carbon atoms, or part of an aromatic ring or an aliphatic ring. (This is with the proviso that $R_{16}$, $R_{17}$ and $R_{18}$ are not all hydrogen.)

[30]

The negative-type photosensitive resin composition according to [29], wherein b1 and g1 are reactive substituents having double bonds at the ends.

[31]

The negative-type photosensitive resin composition according to [29] or [30], wherein at least one end of the main chain of the photosensitive polyimide precursor includes the structure of formula (F1).

[32]

The negative-type photosensitive resin composition according to [31], wherein f1 includes at least one group from among amide, imide, urea and urethane groups.

[33]

A method for producing a cured relief pattern, comprising the following steps:

(1) a coating step in which a photosensitive resin composition according to any one of [1] to [32] is coated onto a substrate to form a photosensitive resin layer on the substrate, (2) an exposure step in which the photosensitive resin layer is exposed to light, (3) a developing step in which the exposed photosensitive resin layer is developed to form a relief pattern, and (4) a heating step in which the relief pattern is heat treated to form a cured relief pattern.

[34]

A method for producing the photosensitive resin composition according to any one of [1] to [32], wherein the photosensitive polyimide precursor is synthesized by the following steps:

a step of polycondensation reaction of a diamine monomer and an acid dianhydride monomer with one of them in excess, to obtain a polyimide, and a step of reacting the amine or acid anhydride remaining at one end of the polyimide with a compound having a reactive substituent that reacts by heat or light, to introduce the reactive substituent at the end of the main chain of the polyimide.

Advantageous Effects of Invention

Effect of the First Embodiment

According to the invention, a photosensitive resin with a specific weight-average molecular weight (Mw) is used to allow imide ring-forming reaction (imidization) of a polyimide to proceed satisfactorily even under low-temperature curing conditions of 200° C. or below. Thus, according to the invention it is possible to provide a photosensitive resin composition that can yield a resin layer with high chemical resistance, that has low residue of the polyimide precursor in the resin film, and a method for producing a cured relief pattern using the photosensitive resin composition Effect of the Second Embodiment According to the invention it is possible to provide a negative-type photosensitive resin composition having excellent in-plane uniformity of film thickness when coated onto a substrate as a film.

DESCRIPTION OF EMBODIMENTS

First Embodiment

An embodiment for carrying out the invention (hereunder referred to simply as "this embodiment") will now be explained in detail. This embodiment serves merely for illustration of the invention and is not intended to limit the invention in any way. The present invention may be implemented with appropriate modifications that are within the scope of its gist.

The first aspect of this embodiment is as follows.

<Negative-Type Photosensitive Resin Composition>

The present invention is a negative-type photosensitive resin composition comprising 100 parts by mass of a polyimide precursor (A) and 0.1 part by mass to 20 parts by mass of a photopolymerization initiator (B), the weight-average molecular weight (Mw) of the polyimide precursor (A) being 3,000 or greater and less than 16,000 in terms of polystyrene, according to gel permeation chromatography (GPC).

Polyimide Precursor (A)

The polyimide precursor (A) to be used for the invention will now be described. The polyimide precursor (A) of the invention is composed mainly of at least one type of resin selected from the group consisting of polyamic acid esters and polyamic acid salts. The term "composed mainly of" means containing the resin at 50 mass % or greater, and preferably 60 mass % or greater, of the total resin. Another resin may also be included if necessary.

According to the invention, the polyimide precursor (A) is preferably a photosensitive resin, in order to form a relief pattern. The photosensitive resin is a resin that becomes a negative-type photosensitive resin composition by use together with the photopolymerization initiator (B) described below, and that produces the phenomenon of dissolution or non-dissolution in the subsequent developing step.

The polyimide precursor (A) is composed mainly of at least one type of resin selected from the group consisting of polyamic acid esters and polyamic acid salts.

For the negative-type photosensitive resin composition of the invention, one of the most preferred examples for the polyimide precursor (A), from the viewpoint of heat resistance and photosensitivity, is a polyamic acid ester or polyamic acid salt represented by the following formula (1):

[Chemical Formula 29]

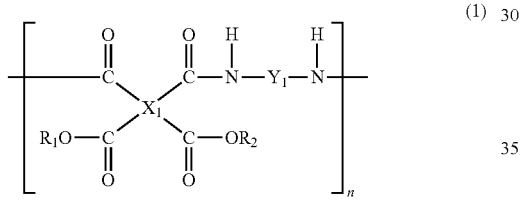

(1)

{wherein $X_1$ is a tetravalent organic group of 6 to 40 carbon atoms, $Y_1$ is a divalent organic group of 6 to 40 carbon atoms, n is an integer of 2 to 50, and $R_1$ and $R_2$ are each independently a hydrogen atom a group represented by the following formula (2) or (3):

[Chemical Formula 30]

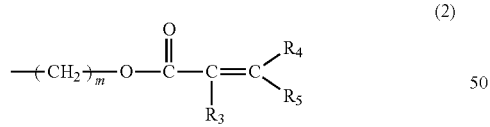

(2)

(wherein $R_3$, $R_4$ and $R_5$ are each independently a hydrogen atom or a monovalent organic group of 1 to 3 carbon atoms, and m is an integer of 2 to 10), or a group represented by the following formula (3):

[Chemical Formula 31]

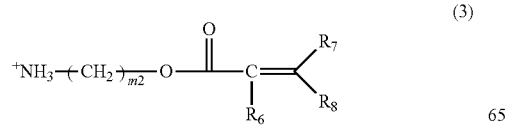

(3)

(wherein $R_6$, $R_7$ and $R_8$ are each independently a hydrogen atom or an organic group of 1 to 3 carbon atoms, and $m_2$ is an integer of 2 to 10),
with the proviso that $R_1$ and $R_2$ are not both hydrogen).

In formula (1), the tetravalent organic group represented by $X_1$ is preferably an organic group of 6 to 40 carbon atoms, from the viewpoint of both heat resistance and photosensitivity. More preferably, it is an aromatic group or alicyclic aliphatic group having the —$COOR_1$ group, —$COOR_2$ group and —CONH— group in a mutually ortho positional relationship. The tetravalent organic group represented by $X_1$ is preferably an organic group of 6 to 40 carbon atoms containing an aromatic ring. More preferably, it may be a structure represented by the following formula (30):

[Chemical Formula 32]

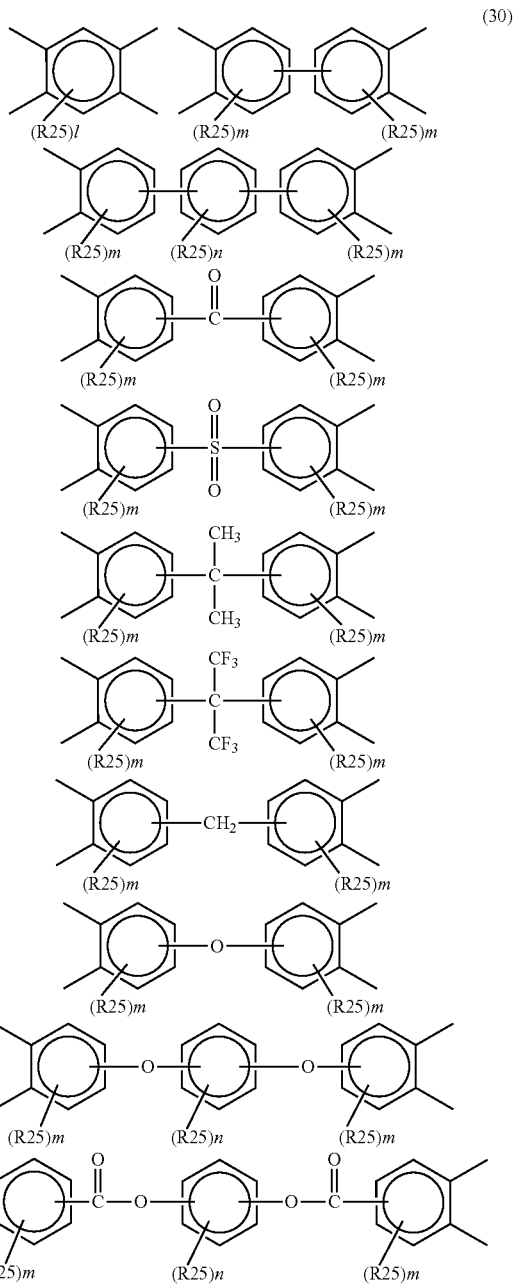

(30)

-continued

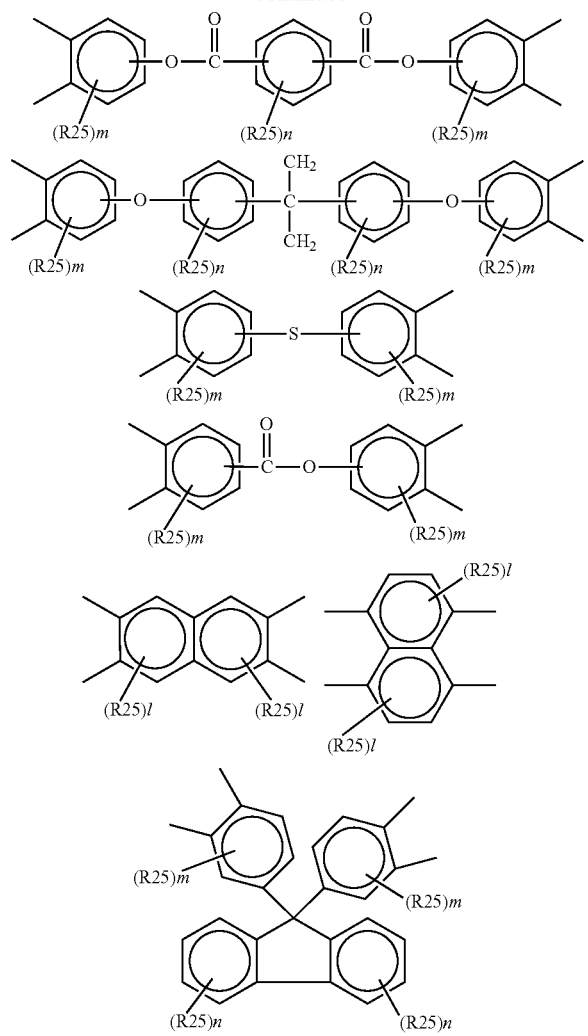

{wherein R25 is a monovalent group selected from among hydrogen atoms, fluorine atoms, hydrocarbon groups of 1 to 10 carbon atoms and fluorine-containing hydrocarbon groups of 1 to 10 carbon atoms, 1 is an integer of 0 to 2, m is an integer of 0 to 3, and n is an integer of 0 to 4}.

More preferred examples among tetravalent organic groups represented by $X_1$ in formula (1) include one or more organic groups selected from among the following formulas (4) to (6).

[Chemical Formula 33]

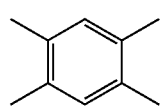

(4)

[Chemical Formula 34]

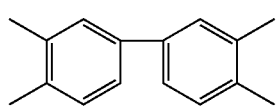

(5)

-continued

[Chemical Formula 35]

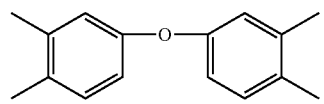

(6)

These organic groups are particularly preferred for their excellent chemical resistance, photosensitivity and copper void-minimizing effects, but there is no limitation to them. The structure of $X_1$ may be one with a single type or a combination of two or more types.

In formula (1), the divalent organic group represented by $Y_1$ is preferably an organic group of 6 to 40 carbon atoms from the viewpoint of heat resistance, photosensitivity and copper void-minimizing effect, and it may have the structure represented by the following formula (31):

[Chemical Formula 36]

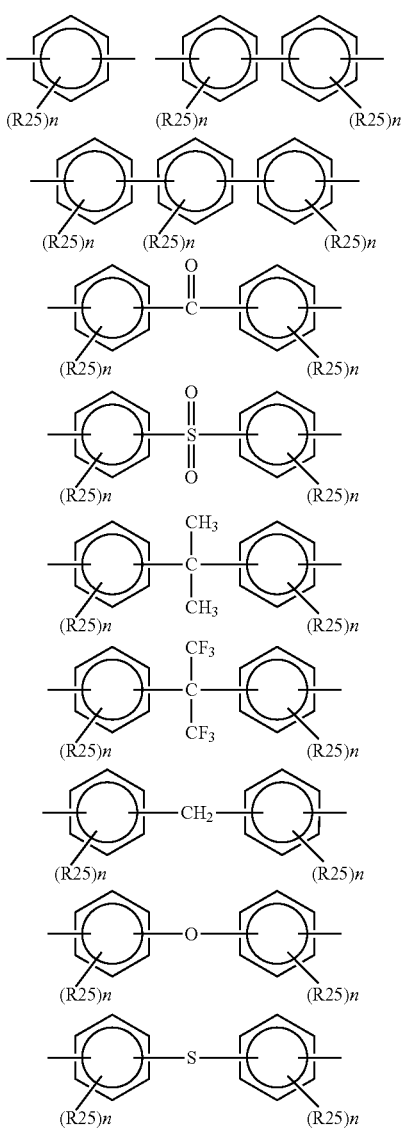

(31)

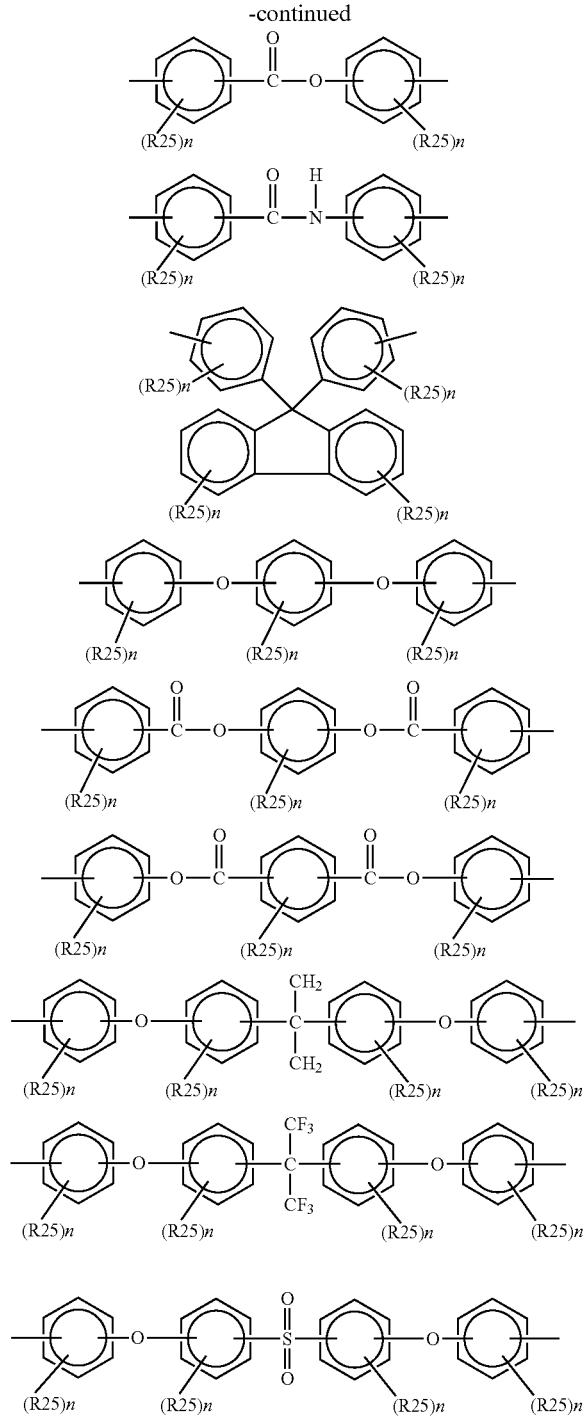

{wherein R25 is a monovalent group selected from among hydrogen atoms, fluorine atoms, hydrocarbon groups of 1 to 10 carbon atoms and fluorine-containing hydrocarbon groups of 1 to 10 carbon atoms, and n is an integer selected from among 0 to 4}, for example.

More preferred examples among divalent organic groups represented by $Y_1$ in formula (I) include one or more divalent organic groups selected from among groups represented by formula (7):

[Chemical Formula 37]

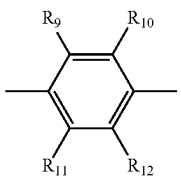

(7)

(wherein $R_9$-$R_{12}$ are hydrogen atoms or monovalent aliphatic groups of 1 to 4 carbon atoms, which may be different from each other or the same), and the following formula (8);

[Chemical Formula 38]

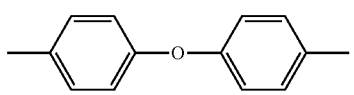

(8)

or the following formula (9):

[Chemical Formula 39]

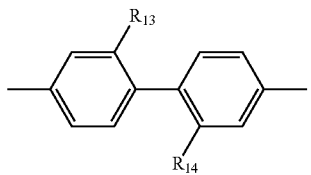

(9)

(wherein $R_{13}$-$R_{14}$ are each independently a fluorine atom or trifluoromethyl group, or a methyl group).

Among these, structures wherein $X_1$ includes formula (5) and $Y_1$ includes formula (7), (8) or (9) are preferred from the viewpoint of chemical resistance and copper void-minimizing effect.

Among these, structures wherein $X_1$ includes formula (4) and $Y_1$ includes formula (7) are preferred from the viewpoint of chemical resistance and copper void-minimizing effect.

Among these, structures wherein $X_1$ includes formula (6) are preferred for excellent chemical resistance and copper void-minimizing effect. From the viewpoint of chemical resistance and copper void-minimizing effect, in particular, a structure wherein $X_1$ includes formula (6) and a structure wherein $Y_1$ includes formula (8) or (7) are preferred, and a structure wherein $X_1$ includes formula (6) and a structure wherein $Y_1$ includes formula (8) are most preferred.

These combinations are particularly preferred for their excellent chemical resistance and copper void-minimizing effects, but there is no limitation to them The negative-type photosensitive resin composition of this embodiment may be an ester bond type or ionic bond type, as the form for imparting photosensitivity. For the former, the method is introducing a compound having a photopolymerizable group, i.e. an olefinic double bond, by an ester bond, onto a side chain of the polyimide precursor (A). For the latter, the method is adding a photopolymerizable group by bonding the carboxyl group of a polyimide precursor and the amino group of a (meth) acrylic compound with an amino group, by ionic bonding.

For use as an ester bond-type photosensitive resin composition, $R_1$ and $R_2$ in formula (1) are each independently a hydrogen atom, or the following formula (2):

[Chemical Formula 40]

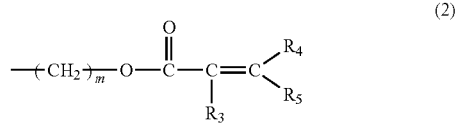

(wherein $R_3$, $R_4$ and $R_5$ are each independently a hydrogen or a monovalent organic group of 1 to 3 carbon atoms, and m is an integer of 2 to 10). This is with the proviso that $R_1$ and $R_2$ are not both hydrogen. $R_3$ in formula (2) is preferably a hydrogen atom or a methyl group, and $R_4$ and $R_5$ are preferably hydrogen atoms, from the viewpoint of photosensitivity. Also, from the viewpoint of photosensitivity, m is an integer of 2 to 10, and preferably an integer of 2 to 4.

When the negative-type photosensitive resin composition of this embodiment is to be used as an ionic bond-type photosensitive resin, $R_1$ and $R_2$ in formula (1) are each independently a hydrogen atom or the following formula (3):

[Chemical Formula 41]

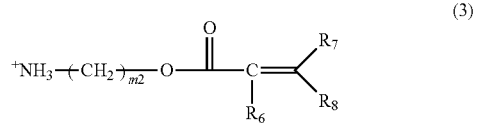

(wherein $R_6$, $R_7$ and $R_8$ are each independently a hydrogen atom or an organic group of 1 to 3 carbon atoms, and $m_2$ is an integer of 2 to 10). This is with the proviso that $R_1$ and $R_2$ are not both hydrogen. $R_6$ in formula (3) is preferably a hydrogen atom or a methyl group, and $R_7$ and $R_8$ are preferably hydrogen atoms, from the viewpoint of photosensitivity.

Also, from the viewpoint of photosensitivity, $m_2$ is an integer of 2 to 10, and preferably an integer of 2 to 4.

For the ester bond-type polyimide precursor, first a tetracarboxylic dianhydride containing a tetravalent organic group $X_1$ is reacted with an alcohol having a photopolymerizable unsaturated double bond and an optional saturated aliphatic alcohol of 1 to 4 carbon atoms, to prepare a partially esterified tetracarboxylic acid (hereunder also referred to as "acid/ester"). This is then used in amide polycondensation with a diamine containing the aforementioned divalent organic group $Y_1$ to obtain the product.

(Preparation of Acid/Ester)

According to the invention, tetracarboxylic dianhydrides containing a tetravalent organic group $X_1$, that may be suitably used to prepare an ester bond-type polyimide precursor, include the tetracarboxylic dianhydrides represented by formula (30), as well as, for example, pyromellitic anhydride, diphenyl ether-3,3',4,4'-tetracarboxylic dianhydride, benzophenone-3,3',4,4'-tetracarboxylic dianhydride, biphenyl-3,3',4,4'-tetracarboxylic dianhydride, diphenylsulfone-3,3',4,4'-tetracarboxylic dianhydride, diphenylmethane-3,3',4,4'-tetracarboxylic dianhydride, 2,2-bis(3,4-phthalic anhydride)propane and 2,2-bis(3,4-phthalic anhydride)-1,1,1,3,3,3-hexafluoropropane, and preferably pyromellitic anhydride, diphenyl ether-3,3',4,4'-tetracarboxylic dianhydride, benzophenone-3,3',4,4'-tetracarboxylic dianhydride and biphenyl-3,3',4,4'-tetracarboxylic dianhydride, although there is no limitation to these. These may of course be used alone, or mixtures of two or more of them may be used.

According to the invention, examples of alcohols having a photopolymerizable unsaturated double bond, that may be suitably used to prepare an ester bond-type polyimide precursor, include 2-acryloyloxyethyl alcohol, 1-acryloyloxy-3-propyl alcohol, 2-acrylamideethyl alcohol, methylolvinyl ketone, 2-hydroxyethylvinyl ketone, 2-hydroxy-3-methoxypropyl acrylate, 2-hydroxy-3-butoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamide ethyl alcohol, methylolvinyl ketone, 2-hydroxyethylvinyl ketone, 2-hydroxy-3-methoxypropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate and 2-hydroxy-3-cyclohexyloxypropyl methacrylate.

These alcohols may also be used in partial admixture with methanol, ethanol, n-propanol, isopropanol, n-butanol or tert-butanol, for example, as a saturated aliphatic alcohol of 1 to 4 carbon atoms.

The aforementioned tetracarboxylic dianhydrides and alcohols that are preferred for the invention may be stirred, dissolved and mixed in a solvent such as described below, in the presence of a basic catalyst such as pyridine, at a temperature of 20 to 50° C. for 4 to 10 hours, to promote esterification reaction of the acid anhydride and obtain the desired acid/ester.

(Preparation of Polyimide Precursor)

An appropriate dehydrating condensation agent such as dicyclohexylcarbodiimide, 1-ethoxycarbonyl-2-ethoxy-1,2-dihydroquinoline, 1,1-carbonyldioxy-di-1,2,3-benzotriazole or N,N'-disuccinimidyl carbonate may be loaded into and mixed with the acid/ester (typically a solution in the solvent described below), while cooling on ice, to convert the acid/ester to a polyacid anhydride. Next, a solution or dispersion of a diamine containing a divalent organic group $Y_1$ that may be suitably used for the invention, in a separate solvent, may be added dropwise into the obtained polyacid anhydride of the acid/ester, and amide polycondensation carried out to obtain the desired polyimide precursor. Alternatively, the acid/ester thionyl chloride or the like may be used to convert the acid portion to an acid chloride, and then reaction carried out with a diamine compound in the presence of a base such as pyridine, to obtain the desired polyimide precursor.

Examples of diamines containing a divalent organic group $Y_1$ that may be suitably used for the invention include, in addition to diamines having the structure represented by formula (31) above, also p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl]ether, bis[4-(3-aminophenoxy)phenyl]ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl)propane, 2,2-bis[4-(4-aminophenoxy)phenyl]hexafluoropropane, 1,4-bis(3-aminopropyldimethylsilyl)benzene, ortho-tolidinesulfone and 9,9-bis(4-aminophenyl)fluorene, as well as any of these wherein one of the hydrogens on the benzene ring is replaced with a methyl, ethyl, hydroxymethyl, hydroxyethyl or halogen group, such as 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl, 2,2'-dimethylbenzidine, 2,2'-bis(trifluoromethyl)-4,4'-diaminobiphenyl, 2,2'-bis(fluoro)-4,4'-diaminobiphenyl or 4,4'-diaminooctafluorobiphenyl. Preferred are p-phenylenediamine, m-phenylenediamine, 4,4'-diaminodiphenyl ether, 2,2'-dimethylbenzidine, 2,2'-bis(trifluoromethyl)-4,4'-diaminobiphenyl, 2,2'-bis(fluoro)-4,4'-diaminobiphenyl, 4,4'-diaminooctafluorobiphenyl, and mixtures of the same, with no particular limitation to these.

After completion of the amide polycondensation reaction, the by-products of water absorption with the dehydrating condensation agent copresent in the reaction mixture are filtered, if necessary. Next, water, an aliphatic lower alcohol or a poor solvent for the liquid mixture is loaded into the obtained polymer component and the polymer component is separated out. By further repeating redissolution and reprecipitation and separation procedures, the polymer is purified, and is then vacuum dried to isolate the desired polyimide precursor. In order to increase the purity, a solution of the polymer may be passed through a column packed with an anion- and/or cation-exchange resin that has been swelled with an appropriate organic solvent, to remove the ionic impurities.

The ionic bond-type polyimide precursor, on the other hand, can typically be obtained by reacting a diamine with a tetracarboxylic dianhydride. In this case, either or both $R_1$ and $R_2$ in formula (1) is a hydrogen atom.

The tetracarboxylic dianhydride is preferably an anhydride of tetracarboxylic acid including the structure of formula (30) above, and the diamine is preferably a diamine including the structure of formula (31) above. By adding a (meth) acrylic compound with an amino group, described below, to the obtained polyamide precursor, a photopolymerizable group can be added by ionic bonding between the carboxyl group and the amino group.

Examples of (meth) acrylic compounds with amino groups include dialkylaminoalkyl acrylates or methacrylates such as dimethylaminoethyl acrylate, dimethylaminoethyl methacrylate, diethylaminoethyl acrylate, diethylaminoethyl methacrylate, dimethylaminopropyl acrylate, dimethylaminopropyl methacrylate, diethylaminopropyl acrylate, diethylaminopropyl methacrylate, dimethylaminobutyl acrylate, dimethylaminobutyl methacrylate, diethylaminobutyl acrylate and diethylaminobutyl methacrylate. From the viewpoint of photosensitivity, dialkylaminoalkyl acrylates or methacrylates wherein the alkyl groups on the amino group have 1 to 10 carbon atoms and the alkyl chain has 1 to 10 carbon atoms are preferred.

The content of (meth) acrylic compounds with such amino groups is 1 to 20 parts by mass, and from the viewpoint of photosensitivity 2 to 15 parts by mass, with respect to 100 parts by mass of the polyimide precursor (A). Excellent photosensitivity is obtained if the content of the (meth) acrylic compound with an amino group is 1 part by mass or greater, and excellent thick film curability is obtained if the content is no greater than 20 parts by mass, with respect to 100 parts by mass of the polyimide precursor (A).

A known substituent that reacts by photoirradiation or heat may be introduced at the polymer ends of the polyimide precursor obtained by reacting the acid/ester and diamine. Examples of known substituents that react by photoirradiation or heat include acrylate groups, allyl groups, alkoxymethyl groups, aldehyde groups, isocyanate groups, isothiocyanate groups, epoxy groups, oxazoline groups, oxetane groups, carbodiimide groups, glycidyl groups, triazinethiol groups, bismaleimide groups, benzoxazine groups, methacrylate groups and methylol groups, with no limitation to these. Also, two or more of these known substituents that react by photoirradiation or heat may be introduced.

During preparation of the polyimide precursor, a diaminosiloxane such as 1,3-bis(3-aminopropyl)tetramethyldisiloxane or 1,3-bis(3-aminopropyl)tetraphenyldisiloxane may be copolymerized for the purpose of increasing the adhesiveness with various substrates and the resin layer formed on the substrate by coating the photosensitive resin composition of the invention on the substrate.

The preferred range for the weight-average molecular weight (Mw) of the polyimide precursor (A) of this embodiment is 3,000 or greater and less than 16,000 in terms of polystyrene, according to gel permeation chromatography (GPC). By using a polyimide precursor (A) with a weight-average molecular weight (Mw) in this range, it is possible to satisfactorily promote imide ring-forming reaction (imidization) of a polyimide even under curing conditions of 200° C. or below, and to obtain a resin layer that has high chemical resistance and is able to reduce generation of copper voids. If the weight-average molecular weight (Mw) is greater than this range, the molecular motion of the polyimide precursor (A) under the curing conditions will be inadequate and imidization will proceed with greater difficulty, resulting in insufficient chemical resistance of the obtained resin layer and a tendency toward generation of copper voids. On the other hand, if the weight-average molecular weight (Mw) is less than this range, the molecular motion of the polyimide precursor (A) under the curing conditions will be more active and imidization will more readily proceed. On the other hand, if the weight-average molecular weight (Mw) is low, resulting in insufficient chemical resistance of the resin layer obtained after curing and a tendency toward generation of copper voids. By using a polyimide precursor (A) with a weight-average molecular weight (Mw) in this range, it is possible to obtain a satisfactory imidization rate even under curing conditions of 200° C. or below, with satisfactory chemical resistance of the obtained cured film, and to obtain a resin that can inhibit generation of copper voids. A more preferred range for the weight-average molecular weight (Mw) of the polyimide precursor (A) is 3,000 or greater and 15,000 or less, even more preferably 3,000 or greater and 13,000 or less, yet more preferably 3,000 or greater and 11,000 or less, even yet more preferably 3,000 or greater and 10,000 or less, even yet more preferably 3,000 or greater and less than 10,000, even yet more preferably 3,000 or greater and 9,500 or less, and especially preferably 3,000 or greater and 9,000 or less.

The lower limit for the weight-average molecular weight (Mw) of the polyimide precursor (A) is 4,000 or greater, 5,000 or greater, 6,000 or greater or 7,000 or greater. The upper limit for the weight-average molecular weight (Mw) of the polyimide precursor (A) is 15,000 or less, 13,000 or less, 12,000 or less, 11,000 or less, 10,000 or less, or less than 10,000.

The method of controlling the weight-average molecular weight (Mw) of the polyimide precursor (A) is not particularly restricted, but the following methods are known. For example, it can be controlled by appropriately controlling the molar ratio of addition between the acid/ester containing a tetravalent organic group $X_1$ and the diamine containing a divalent organic group $Y_1$, during amino polycondensation. The weight-average molecular weight (Mw) can be reduced by adding either the acid/ester containing the tetravalent organic group $X_1$ or the diamine containing the divalent organic group $Y_1$ in excess.

The method of measuring the weight-average molecular weight (Mw) for this embodiment may be gel permeation chromatography (GPC), and calculation may be from a calibration curve drawn using standard polystyrene. Tetrahydrofuran and N-methyl-2-pyrrolidone are recommended as developing solvents for gel permeation chromatography (GPC). It is recommended to select standard monodisperse polystyrene from among the organic solvent-based reference samples STANDARD SM-105 by Showa Denko K.K.

The imidization rate can be easily calculated by the following method. First, the infrared absorption spectrum of the polymer is measured, and the presence of absorption peaks for the imide structure attributed to polyimide (near 1780 cm$^{-1}$ and near 1377 cm$^{-1}$) is confirmed. Next, the polymer is heat treated at 350° C. for 1 hour and the infrared absorption spectrum after heat treatment is measured. The peak intensity near 1377 cm$^{-1}$ is compared with the intensity before heat treatment, to calculate the imidization rate in the polymer before heat treatment.

Photopolymerization Initiator (B)

The photopolymerization initiator (B) to be used for the invention will now be described. The content of the photopolymerization initiator (B) in the negative-type photosensitive resin composition is 0.1 part by mass to 20 parts by mass with respect to 100 parts by mass of the polyimide precursor (A). The content is 0.1 part by mass or greater from the viewpoint of photosensitivity and patterning properties, and the content is no greater than 20 parts by mass from the viewpoint of curability or physical properties of the film of the cured photosensitive resin layer.

The photopolymerization initiator (B) is preferably a photoradical polymerization initiator, preferred photopolymerization initiators including benzophenone derivatives such as benzophenone, methyl o-benzoylbenzoate, 4-benzoyl-4'-methyldiphenyl ketone, dibenzyl ketone and fluorenone, acetophenone derivatives such as 2,2'-diethoxyacetophenone, 2-hydroxy-2-methylpropiophenone and 1-hydroxycyclohexylphenyl ketone, thioxanthone derivatives such as thioxanthone, 2-methylthioxanthone, 2-isopropylthioxanthone and diethylthioxanthone, benzyl derivatives such as benzyl, benzyldimethylketal and benzyl-β-methoxyethylacetal, benzoin derivatives such as benzoin and benzoinmethyl ether, oximes such as 1-phenyl-1,2-butanedione-2-(o-methoxycarbonyl)oxime, 1-phenyl-1,2-propanedione-2-(o-methoxycarbonvyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o-ethoxycarbonyl)oxime and 1-phenyl-3-ethoxypropanetrione-2-(o-benzoyl)oxime, N-arylglycines such as N-phenylglycine, peroxides such as benzoyl perchloride, and aromatic biimidazoles, titanocenes, α-(n-octanesulfonyloxvimino)-4-methoxybenzyl cyanide and the like, with no limitation to these.

Particularly preferred among the photopolymerization initiators mentioned above are oxime ester compounds represented by the following formula (10):

[Chemical Formula 42]

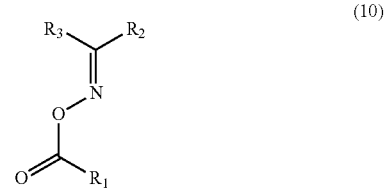

(10)

(wherein $R_1$-$R_3$ are each independently a hydrogen atom or a monovalent organic group), from the viewpoint of inhibiting copper voids.

As $R_1$-$R_3$ there are preferably used, each independently, hydrogen atoms, groups selected from among straight-chain, branched or cyclic alkyl, alkylaryl, arylalkyl and hydroxyalkyloxy groups of 1 to 20 carbon atoms, or groups selected from among straight-chain, branched or cyclic alkyl, alkylaryl, arylalkyl and hydroxyalkyloxy groups of 1 to 20 carbon atoms containing heterocyclic atoms.

When a polyimide coating film is to be used as an interlayer dielectric film, it must maintain high adhesiveness between the copper or alloy copper of the metal wiring layer materials, after reliability testing. However, if reliability testing is carried out using a conventional polyimide resin, the copper component of the rewiring layer migrates into the polyimide layer. When this occurs, voids are formed at the interface between the copper layer and the polyimide layer, lowering the adhesiveness, and creating the problems of shorting or wire breakage in the rewiring layer.

By using an oxime ester-based photoinitiator or a specific polyimide, it is possible to increase the adhesiveness between the copper layer and polyimide layer, and to minimize generation of voids.

From the viewpoint of minimizing copper voids, the photopolymerization initiator (B) used is even more preferably an oxime ester compound represented by the following formula (11):

[Chemical Formula 43]

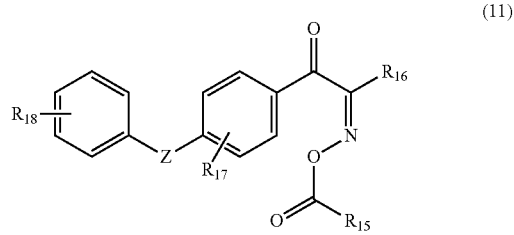

(11)

{wherein Z is a sulfur or oxygen atom, $R_{15}$ is a methyl group, phenyl group or divalent organic group, and $R_{16}$-$R_{18}$ are each independently a hydrogen atom or a monovalent organic group}.

As $R_{16}$-$R_{18}$ there are preferably used, each independently, hydrogen atoms, groups selected from among straight-chain, branched or cyclic alkyl, alkylaryl, arylalkyl and hydroxyalkyloxy groups of 1 to 20 carbon atoms. Specifically, there may be mentioned hydrogen, methyl, ethyl, n-propyl, isopropyl, n-butyl, isobutyl, sec-butyl, tert-butyl, n-pentyl, isopentyl, neopentyl, tert-pentyl, n-hexyl, isohexyl n-octyl, isooctyl, n-decyl, isodecyl, cyclopropyl, cyclobutyl, cyclopentyl, cyclohexyl, methylcyclopentyl, cyclopentylmethyl, methylcyclohexyl, cyclohexylmethyl, phenyl, tolyl, xylyl, benzyl, hydroxyethyloxy and hydroxypropyloxy groups.

Specific examples that may be suitably used as the photopolymerization initiator (B) include at least one selected from among the following formula.

[Chemical Formula 44]

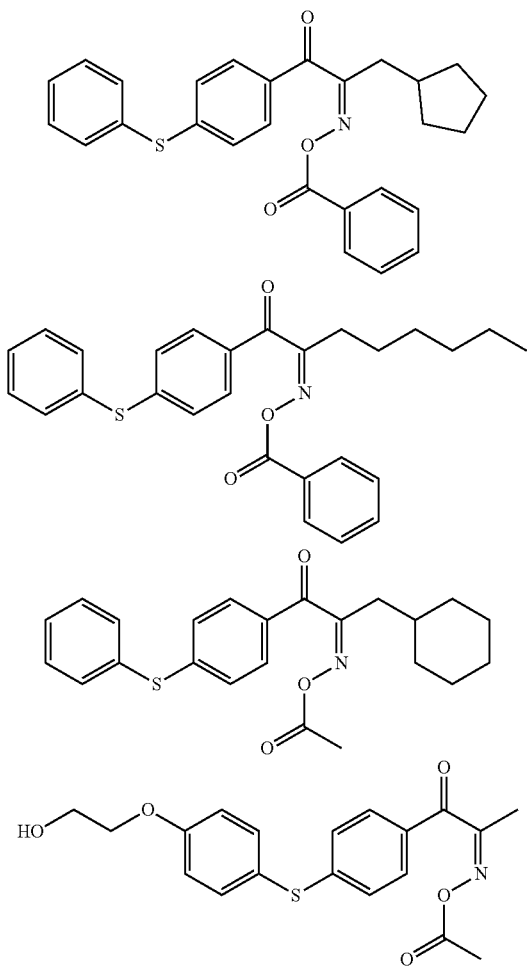

Trade names include Irgacure OXE-01 by BASF, TR-PBG-305 and TR-PBG-3057 by Tronly Co., Ltd., and NCI-930 by Adeka Corp.

By using such an oxime ester-based photoinitiator it is possible to obtain a resin layer having a satisfactory imidization rate, high chemical resistance, and minimal generation of copper voids.

Moreover, as mentioned above, when the polyimide precursor (A) represented by formula (1) is an ionic bond-type, a (meth)acrylic compound having an amino group may be used to add a photopolymerizable group to a side chain of the polyimide precursor (A) via an ionic bond. In this case, the (meth)acrylic compound having an amino group is used as the photopolymerization initiator (B). Examples of (meth) acrylic compounds with amino groups include, as mentioned above, dialkylaminoalkyl acrylates or methacrylates such as dimethylaminoethyl acrylate, dimethylaminoethyl methacrylate, diethylaminoethyl acrylate, diethylaminoethyl methacrylate, dimethylaminopropyl acrylate, dimethylaminopropyl methacrylate, diethylaminopropyl acrylate, diethylaminopropyl methacrylate, dimethylaminobutyl acrylate, dimethylaminobutyl methacrylate, diethylaminobutyl acrylate and diethylaminobutyl methacrylate. From the viewpoint of photosensitivity, dialkylaminoalkyl acrylates or methacrylates wherein the alkyl groups on the amino group have 1 to 10 carbon atoms and the alkyl chain has 1 to 10 carbon atoms are preferred.

The content of (meth)acrylic compounds with such amino groups is 1 to 20 parts by mass, and from the viewpoint of photosensitivity 2 to 15 parts by mass, with respect to 100 parts by mass of the polyimide precursor (A). Excellent photosensitivity is obtained if the content of the (meth) acrylic compound with an amino group, as the photopolymerization initiator (B), is 1 part by mass or greater, and excellent thick film curability is obtained if the content is no greater than 20 parts by mass, with respect to 100 parts by mass of the polyimide precursor (A).

The polyimide precursor resin composition and polyamide resin composition, as negative-type resin compositions according to this embodiment, may include a solvent for dissolution of the resin.

For this embodiment, the photosensitive resin composition used is a positive-type photosensitive resin composition containing a polybenzooxazole precursor (A2) and a photoacid generator (B2).

The photosensitive resin to be used in the polybenzooxazole precursor composition may be a poly(o-hydroxyamide) including a repeating unit represented by the following formula (12).

[Chemical Formula 45]

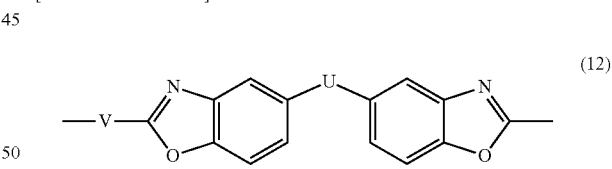

[In the formula, U and V are divalent organic groups}

From the viewpoint of chemical resistance and minimizing copper voids, U is preferably a divalent organic group of 1 to 30 carbon atoms, more preferably a straight-chain alkylene group of 1 to 15 carbon atoms (the hydrogen of the straight-chain alkylene may be optionally substituted with a halogen atom), and most preferably a straight-chain alkylene group of 1 to 8 carbon atoms and having some or all of the hydrogen atoms replaced with fluorine atoms.

From the viewpoint of chemical resistance and minimizing copper voids, V is preferably a divalent organic group including an aromatic group, and more preferably a divalent organic group including at least one structure represented by the following formulas (13) to (15).

[Chemical Formula 46]

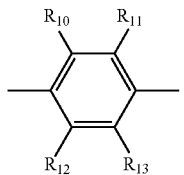
(13)

($R_{10}$, $R_{11}$, $R_{12}$ and $R_{13}$ are hydrogen atoms or monovalent aliphatic groups of 1 to 5 carbon atoms, which may be the same or different.)

[Chemical Formula 47]

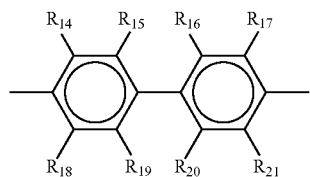
(14)

($R_{14}$-$R_{21}$ are hydrogen atoms, halogen atoms or monovalent organic groups of 1 to 5 carbon atoms, which may be different from each other or the same.)

[Chemical Formula 48]

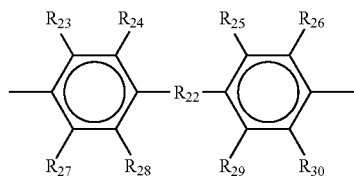
15

($R_{22}$ is a divalent group, and $R_{23}$-$R_{30}$ are hydrogen atoms, halogen atoms or monovalent aliphatic groups of 1 to 5 carbon atoms, which may be the same or different.)

In formula (8), $R_{22}$ is a divalent organic group of 1 to 40 carbon atoms or a halogen atom, for example.

From the viewpoint of chemical resistance, minimizing copper voids and adhesiveness, V is most preferably a divalent organic group including a structure represented by the following formula (16).

[Chemical Formula 49]

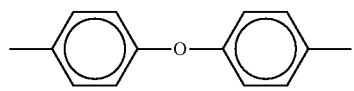
(16)

From the viewpoint of chemical resistance, minimizing copper voids and adhesiveness, V is preferably a divalent organic group of 1 to 40 carbon atoms, more preferably a divalent straight-chain aliphatic group of 1 to 40 carbon atoms, and most preferably a divalent straight-chain aliphatic group of 1 to 20 carbon atoms.

The polybenzooxazole precursor can generally be synthesized from a dicarboxylic acid derivative and a hydroxy group-containing diamine. Specifically, it can be synthesized by converting a dicarboxylic acid derivative to a dihalide derivative, and then reacting it with a diamine. A dichloride derivative is preferred as the dihalide derivative.

A dichloride derivative can be synthesized by allowing a halogenating agent to act on a dicarboxylic acid derivative. The halogenating agent used may be thionyl chloride, phosphoryl chloride, phosphorus oxychloride, phosphorus pentachloride or the like, which are commonly used for acid chloridation of carboxylic acids.

The method of synthesizing the dichloride derivative may be a method of reacting a dicarboxylic acid derivative with the halogenating agent in a solvent, or a method of reacting it with an excess of a halogenating agent and then distilling off the excess portion.

Examples of dicarboxylic acids to be used as dicarboxylic acid derivatives include isophthalic acid, terephthalic acid, 2,2-bis(4-carboxyphenyl)-1,1,1,3,3,3-hexafluoropropane, 4,4'-dicarboxybiphenyl, 4,4'-dicarboxydiphenyl ether, 4,4'-dicarboxytetraphenylsilane, bis(4-carboxyphenyl)sulfone, 2,2-bis(p-carboxyphenyl)propane, 5-tert-butylisophthalic acid, 5-bromoisophthalic acid, 5-fluoroisophthalic acid, 5-chloroisophthalic acid, 2,6-naphthalenedicarboxylic acid, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid adipic acid, octafluoroadipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid and diglycolic acid. Mixtures of these may also be used.

Examples of hydroxy group-containing diamines include 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,3,3,3-hexafluoropropane and 2,2-bis(4-amino-3-hydroxyphenyl)-1,1,1,3,3,3-hexafluoropropane. Mixtures of these may also be used.

Photoacid Generator (B2)

A photoacid generator has the function of increasing the aqueous alkali solubility of the photoirradiated sections. Photoacid generators include diazonaphthoquinone compounds, aryldiazonium salts, diaryliodonium salts and triarylsulfonium salts. Diazonaphthoquinone compounds have high sensitivity and are preferred among these.

The preferred range for the weight-average molecular weight (Mw) of the polybenzooxazole precursor (A2) of this embodiment is 3,000 or greater and less than 16,000 in terms of polystyrene, according to gel permeation chromatography (GPC). By using a polybenzooxazole precursor (A2) with a weight-average molecular weight (Mw) in this range, it is possible to satisfactorily promote imide ring-forming reaction of a polybenzooxazole even under curing conditions of 200° C. or below, and to obtain a resin layer that has high chemical resistance and is able to reduce generation of copper voids. If the weight-average molecular weight (Mw) is greater than this range, the molecular motion of the polybenzooxazole precursor (A2) under the curing conditions will be inadequate and ring formation will proceed with greater difficulty, resulting in insufficient chemical resistance of the obtained resin layer and a tendency toward generation of copper voids. On the other hand, if the weight-average molecular weight (Mw) is less than this range, the molecular motion of the polybenzooxazole precursor (A2) under the curing conditions will be more active and imidization will more readily proceed. On the other hand, if the weight-average molecular weight (Mw) is low, resulting in insufficient chemical resistance of the resin layer obtained after curing and a tendency toward generation of copper voids. By using a polybenzooxazole precursor (A2) with a weight-average molecular weight (Mw) in this range, it is possible to obtain a satisfactory ring formation rate even under curing conditions of 200° C. or below, with satisfactory chemical resistance of the obtained cured film, and to obtain a resin that can inhibit generation of copper voids.

A more preferred range for the weight-average molecular weight (Mw) of the polybenzooxazole precursor (A2) is 3,000 or greater and 15,000 or less, even more preferably 3,000 or greater and 13,000 or less, yet more preferably 3,000 or greater and 11,000 or less, even yet more preferably 3,000 or greater and 10,000 or less, even yet more preferably 3,000 or greater and less than 10,000, even yet more preferably 3,000 or greater and 9,500 or less, and especially preferably 3,000 or greater and 9,000 or less. The lower limit for the weight-average molecular weight (Mw) of the polybenzooxazole precursor (A2) is 4,000 or greater, 5,000 or greater, 6,000 or greater or 7,000 or greater. The upper limit for the weight-average molecular weight (Mw) of the polybenzooxazole precursor (A2) is 15,000 or lower, 13,000 or lower, 12,000 or lower, 11,000 or lower, 10,000 or lower, or lower than 10,000.

The method of controlling the weight-average molecular weight (Mw) of the polybenzooxazole precursor (A2) is not particularly restricted, but the following methods are known. For example, it can be carried out by appropriately controlling the molar ratio of addition between the dicarboxylic acid containing a divalent organic group $X_1$ and the aminophenol containing a divalent organic group $Y_1$, during the polycondensation. The weight-average molecular weight (Mw) can be reduced by adding either the dicarboxylic acid containing the divalent organic group $X_1$ or the aminophenol containing the divalent organic group $Y_1$ in excess.

The method of measuring the weight-average molecular weight (Mw) for this embodiment may be gel permeation chromatography (GPC), and calculation may be from a calibration curve drawn using standard polystyrene. Tetrahydrofuran and N-methyl-2-pyrrolidone are recommended as developing solvents for gel permeation chromatography (GPC). It is recommended to select the standard monodisperse polystyrene from among the organic solvent-based reference samples STANDARD SM-105 by Showa Denko K.K.

<Solvent>

Solvents include amides, sulfoxides, ureas, ketones, esters, lactones, ethers, halogenated hydrocarbons, hydrocarbons and alcohols.

For example, N-methyl-2-pyrrolidone, N,N-dimethylacetamide, N,N-dimethylformamide, dimethyl sulfoxide, tetramethylurea, acetone, methyl ethyl ketone, methyl isobutyl ketone, cyclopentanone, cyclohexanone, methyl acetate, ethyl acetate, butyl acetate, diethyl oxalate, ethyl lactate, methyl lactate, butyl lactate, γ-butyrolactone, propyleneglycol monomethyl ether acetate, propyleneglycol monomethyl ether, benzyl alcohol, phenyl glycol, tetrahydrofurfuryl alcohol, ethyleneglycol dimethyl ether, diethyleneglycol dimethyl ether, tetrahydrofuran, morpholine, dichloromethane, 1,2-dichloroethane, 1,4-dichlorobutane, chlorobenzene, o-dichlorobenzene, anisole, hexane, heptane, benzene, toluene, xylene, mesitylene and the like may be used. Preferred among these are N-methyl-2-pyrrolidone, dimethyl sulfoxide, tetramethylurea, butyl acetate, ethyl lactate, γ-butyrolactone, propyleneglycol monomethyl ether acetate, propyleneglycol monomethyl ether, diethyleneglycol dimethyl ether, benzyl alcohol, phenyl glycol and tetrahydrofurfuryl alcohol, from the viewpoint of solubility of the resin, stability of the resin composition and adhesion onto substrates.

Most preferred among such solvents are those that completely dissolve the polymer product, examples of which include N-methyl-2-pyrrolidone, N,N-dimethylacetamide, N,N-dimethylformamide, dimethyl sulfoxide, tetramethylurea and γ-butyrolactone.

The amount of solvent used in the photosensitive resin composition of the invention is in the range of preferably 100 to 1000 parts by mass, more preferably 120 to 700 parts by mass and even more preferably 125 to 500 parts by mass, with respect to 100 parts by mass of the polyimide precursor (A).

The photosensitive resin composition of the invention may further contain a component other than components (A) and (B).

For example, when a photosensitive resin composition of the invention is to be used to form a cured film on a substrate made of copper or a copper alloy, a nitrogen-containing heterocyclic compound such as an azole compound or purine derivative may be optionally added to reduce discoloration on the copper.

Azole compounds include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl)triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(α,α-dimethylbenzyl)phenyl]-benzotriazole, 2-(3,5-di-t-butyl-2-hydroxyphenyl)benzotriazole, 2-(3-t-butyl-5-methyl-2-hydroxyphenyl)-benzotriazole, 2-(3,5-di-t-amyl-2-hydroxyphenyl)benzotriazole, 2-(2'-hydroxy-5'-t-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole and 1-methyl-1H-tetrazole.

Particularly preferred are tolyltriazole, 5-methyl-1H-benzotriazole and 4-methyl-1H-benzotriazole. These azole compounds may be used alone, or mixtures of two or more of them may be used.

Specific examples of purine derivatives include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl)adenine, guanineoxime, N-(2-hydroxyethyl)adenine, 8-aminoadenine, 6-amino-8-phenyl- 9H-purine, 1-ethyladenine, 6-ethylaminopurine, 1-benzyladenine, N-methylguanine, 7-(2-hydroxyethyl)guanine, N-(3-chlorophenyl)guanine, N-(3-ethylphenyl)guanine, 2-azaadenine, 5-azaadenine, 8-azaadenine, 8-azaguanine, 8-azapurine, 8-azaxanthine, 8-azahypoxanthine, and derivatives of the same.

When the negative-type photosensitive resin composition contains the aforementioned azole compound or purine derivative, its content is preferably 0.1 to 20 parts by mass with respect to 100 parts by mass of the polyimide precursor (A), and more preferably 0.5 to 5 parts by mass, from the viewpoint of photosensitivity. If the content of the azole compound is at least 0.1 part by mass with respect to 100 parts by mass of the polyimide precursor (A), discoloration of the copper or copper alloy surface will be reduced when the negative-type photosensitive resin composition of the invention has been formed on a copper or copper alloy. If the azole compound content is no greater than 20 parts by mass, on the other hand, the photosensitivity will be excellent.

A hindered phenol compound may optionally be added to the negative-type photosensitive resin composition of the invention in order to minimize discoloration on the copper surface. Hindered phenol compounds include 2,6-di-t-butyl-4-methylphenol, 2,5-di-t-butyl-hydroquinone, octadecyl-3-(3,5-di-t-butyl-4-hydroxyphenyl)propionate, isooctyl-3-(3,5-di-t-butyl-4-hydroxyphenyl)propionate, 4,4'-methylenebis(2,6-di-t-butylphenol), 4,4'-thio-bis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis[3-(3,5-di-t-butyl-4-hydroxyphenyl)propionate], 2,2-thiodiethylenebis[3-(3,5-di-t-butyl-4-hydroxyphenyl)propionate], N,N'-hexamethylenebis(3,5-di-t-butyl-4-hydroxy-hydrocinnamamide), 2,2'-methylene-bis(4-methyl-6-t-butylphenol), 2,2'-methylene-bis(4-ethyl-6-t-butylphenol), pentaerythrityl-tetrakis[3-(3,5-di-t-butyl-4-hydroxyphenyl)propionate], tris-(3,5-di-t-butyl-4-hydroxybenzyl)-isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione and 1,3,5-tris(4-t-butyl-5-ethyl-3-hydroxy-2-methylbenzyl)-1,3,5-triazine-2,4,6-(1H,3H,5H)-trione, with no limitation to these. Particularly preferred among these is 1,3,5-tris(4-t-butyl-3-hydroxy-2,6-dimethylbenzyl)-1,3,5-triazine-2,4,6-(1H,3H,5H)-trione.

The content of the hindered phenol compound is preferably 0.1 to 20 parts by mass with respect to 100 parts by mass of the polyimide precursor (A). It is more preferably 0.5 to 10 parts by mass from the viewpoint of photosensitivity. If the content of the hindered phenol compound is at least 0.1 part by mass with respect to 100 parts by mass of the polyimide precursor (A), discoloration and corrosion of the copper or copper alloy surface will be prevented, when the negative-type photosensitive resin composition of the invention has been formed on a copper or copper alloy, for example. If the hindered phenol compound content is no greater than 20 parts by mass, on the other hand, the photosensitivity will be excellent.

The negative-type photosensitive resin composition of the invention may also contain an organic titanium compound. By containing an organic titanium compound, it will be able to form a photosensitive resin layer with excellent substrate adhesiveness even when cured at a low temperature of 200° C. or below.

Organic titanium compounds that may be used include those having an organic chemical substance bonded to a titanium atom via a covalent bond or ionic bond.

Specific examples of organic titanium compounds are listed below as I) to VII):

I) Titanium chelate compounds: More preferred are titanium chelates having two or more alkoxy groups, since it will be possible to obtain storage stability of the negative-type photosensitive resin composition, and a satisfactory pattern. Specific examples include titanium bis(triethanolamine) diisopropoxide, titanium di(n-butoxide)bis(2,4-pentane dionate, titanium diisopropoxide bis(2,4-pentane dionate), titanium diisopropoxide bis(tetramethylheptane dionate) and titanium diisopropoxide bis(ethyl acetoacetate).

II) Tetraalkoxytitanium compounds: For example, titanium tetra(n-butoxide), titanium tetraethoxide, titanium tetra(2-ethylhexoxide), titanium tetraisobutoxide, titanium tetraisopropoxide, titanium tetramethoxide, titanium tetramethoxy propoxide, titanium tetramethyl phenoxide, titanium tetra(n-nonyloxide), titanium tetra(n-propoxide), titanium tetrastearyloxide and titanium tetrakis[bis {2,2-(allyloxymethyl)butoxide)}].

III) Titanocene compounds: For example, pentamethylcyclopentadienyltitanium trimethoxide, bis($\eta^5$-2,4-cyclopentadien-1-yl)bis(2,6-difluorophenyl)titanium and bis($\eta^5$-2,4-cyclopentadien-1-yl)bis(2,6-difluoro-3-(1H-pyrrol-1-yl)phenyl)titanium.

IV) Monoalkoxytitanium compounds: For example, titanium tris(dioctyl phosphate) isopropoxide and titanium tris(dodecylbenzene sulfonate)isopropoxide.

V) Titanium oxide compounds: For example, titanium oxide bis(pentanedionate), titanium oxide bis(tetramethylheptanedionate) and phthalocyaninetitanium oxide.

VI) Titanium tetraacetylacetonate compounds: For example, titanium tetraacetylacetonate.

VII) Titanate coupling agents: For example, isopropyltridodecylbenzenesulfonyl titanate.

Among these, the organic titanium compound is preferably one or more compounds selected from the group consisting of I) titanium chelate compounds, II) tetraalkoxytitanium compounds and III) titanocene compounds, from the viewpoint of exhibiting more satisfactory chemical resistance. Particularly preferred are titanium diisopropoxide bis(ethyl acetoacetate), titanium tetra(n-butoxide), and bis($\eta^5$-2,4-cyclopentadien-1-yl)bis(2,6-difluoro-3-(1H-pyrrol-1-yl)phenyl)titanium.

When an organic titanium compound is added, its content is preferably 0.05 to 10 parts by mass and more preferably 0.1 to 2 parts by mass, with respect to 100 parts by mass of the polyimide precursor (A). If the content is 0.05 part by mass or greater, satisfactory heat resistance and chemical resistance will be exhibited. If it is no greater than 10 parts by mass, on the other hand, the storage stability will be excellent.

An adhesion aid may also be optionally added in order to increase the adhesion of the film formed using the negative-type photosensitive resin composition of the invention with the base material. Adhesion aids include silane coupling agents such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-(triethoxysilyl)propyl]phthalamic acid, benzophenone-3,3'-bis(N-[3-triethoxvsilyl]propylamide)-4,4'-dicarboxylic acid, benzene-1,4-bis(N-[3-triethoxysilyl]propylamide)-2,5-dicarboxylic acid, 3-(triethoxysilyl)propylsuccinic anhydride, N-phenylaminopropyltrimethoxysilane, 3-ureidopropyltrimethoxysilane, 3-ureidopropyltriethoxysilane and 3-(trialkoxysilyl)propylsuccinic anhydride, and aluminum-based adhesion aids such as aluminum tris(ethyl acetoacetate), aluminum tris(acetylacetonate) and ethyl acetoacetate aluminum diisopropylate.

Among these adhesion aids it is more preferred to use a silane coupling agent, from the viewpoint of adhesive force. When the negative-type photosensitive resin composition contains an adhesion aid, the content of the adhesion aid is preferably in the range of 0.5 to 25 parts by mass with respect to 100 parts by mass of the polyimide precursor (A).

Silane coupling agents include 3-mercaptopropyltrimethoxysilane (KBM803, trade name of Shin-Etsu Chemical Co., Ltd., SILA-ACE S810, trade name of Chisso Corp.), 3-mercaptopropyltriethoxysilane (SIM6475.0, trade name of Azmax Corp.), 3-mercaptopropylmethyldimethoxysilane (LS 1375, trade name of Shin-Etsu Chemical Co., Ltd., SIM6474.0, trade name of Azmax Corp.), mercaptomethyltrimethoxysilane (SIM6473.5C, trade name of Azmax Corp.), mercaptomethylmethyldimethoxysilane (SIM6473.0, trade name of Azmax Corp.), 3-mercaptopropyldiethoxymethoxysilane, 3-mercaptopropylethoxydimethoxysilane, 3-mercaptopropyltripropoxysilane, 3-mercaptopropyldiethoxypropoxysilane, 3-mercaptopropylethoxydipropoxysilane, 3-mercaptopropyldimethoxypropoxysilane, 3-mercaptopropylmethoxydipropoxysilane, 2-mercaptoethyltrimethoxysilane, 2-mercaptoethyldiethoxymethoxysilane, 2-mercaptoethylethoxydimethoxysilane, 2-mercaptoethyltripropoxysilane, 2-mercaptoethyltripropoxysilane, 2-mercaptoethylethoxydipropoxysilane, 2-mercaptoethyldimethoxypropoxysilane, 2-mercaptoethylmethoxydipropoxysilane, 4-mercaptobutyltrimethoxysilane, 4-mercaptobutyltriethoxysilane, 4-mercaptobutyltripropoxysilane and N-(3-triethoxysilylpropyl)urea (LS3610, trade name of Shin-Etsu Chemical Co., Ltd., SIU9055.0, trade name of Azmax Corp.), N-(3-trimethoxysilylpropyl)urea (SIU9058.0, trade name of Azmax Corp.), N-(3-diethoxymethoxysilylpropyl)urea, N-(3-ethoxydimethoxysilylpropyl)urea, N-(3-tripropoxysilylpropyl)urea, N-(3-diethoxvpropoxysilylpropyl)urea, N-(3-ethoxydipropoxysilylpropyl)urea, N-(3-dimethoxypropoxysilylpropyl)urea, N-(3-methoxydipropoxysilylpropyl)urea, N-(3-trimethoxysilylethyl)urea, N-(3-ethoxydimethoxysilylethyl)urea, N-(3-tripropoxysilylethyl)urea, N-(3-tripropoxysilylethyl)urea, N-(3-ethoxydipropoxysilylethyl)urea, N-(3-dimethoxypropoxysilylethyl)urea, N-(3-methoxydipropoxysilylethyl)urea, N-(3-trimethoxysilylbutyl)urea, N-(3-triethoxysilylbutyl)urea, N-(3-tripropoxysilylbutyl)urea, 3-(m-aminophenoxy)propyltrimethoxysilane (SLA0598.0, trade name of Azmax Corp.), m-aminophenyltrimethoxysilane (SLA0599.0, trade name of Azmax Corp.), p-aminophenyltrimethoxysilane (SLA0599.1, trade name of Azmax Corp.), aminophenyltrimethoxysilane (SLA0599.2, trade name of Azmax Corp.), 2-(trimethoxysilylethyl)pyridine (SIT8396.0, trade name of Azmax Corp.), 2-(triethoxysilylethyl)pyridine, 2-(dimethoxysilylmethylethyl)pyridine, 2-(diethoxysilylmethylethyl)pyridine, (3-triethoxysilylpropyl)-t-butyl carbamate, (3-glycidoxypropyl)triethoxysilane, tetramethoxysilane, tetraethoxysilane, tetra-n-propoxysilane, tetra-i-propoxysilane, tetra-n-butoxysilane, tetra-i-butoxysilane, tetra-t-butoxysilane, tetrakis(methoxyethoxysilane), tetrakis(methoxy-n-propoxysilane), tetrakis(ethoxyethoxysilane), tetrakis(methoxyethoxyethoxysilane), bis(trimethoxysilyl)ethane, bis(trimethoxysilyl)hexane, bis(triethoxysilyl)methane, bis(triethoxvsilyl)ethane, bis(triethoxysilyl)ethylene, bis(triethoxysilyl)octane, bis(triethoxysilyl)octadiene, bis[3-(triethoxysilyl)propyl] disulfide, bis[3-(triethoxysilyl)propyl] tetrasulfide, di-t-butoxydiacetoxysilane, di-i-butoxyaluminoxytriethoxysilane, bis(pentadionato)titanium-O,O'-bis(oxyethyl)-aminopropyltriethoxysilane, phenylsilanetriol, methylphenylsilanediol, ethylphenylsilanediol, n-propylphenylsilanediol, isopropylphenylsilanediol, n-butyldiphenylsilanediol, isobutylphenylsilanediol, tert-butylphenylsilanediol, diphenylsilanediol, dimethoxydiphenylsilane, diethoxydiphenylsilane, dimethoxydi-p-tolylsilane, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol n-butyldiphenylsilanol isobutyldiphenylsilanol, tert-butyldiphenylsilanol and triphenylsilanol, with no limitation to these. These may be used alone or in combinations of more than one.

Among the silane coupling agents mentioned above, the silane coupling agent is preferably phenylsilanetriol trimethoxyphenylsilane, trimethoxy(p-tolyl)silane, diphenylsilanediol, dimethoxydiphenylsilane, diethoxydiphenylsilane, dimethoxydi-p-tolylsilane, triphenylsilanol, or a silane coupling agent represented by the following structure, from the viewpoint of storage stability.

[Chemical Formula 50]

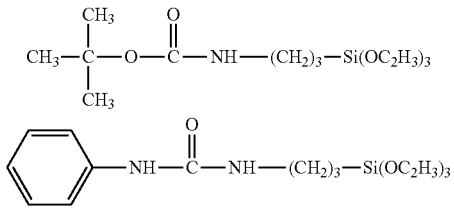

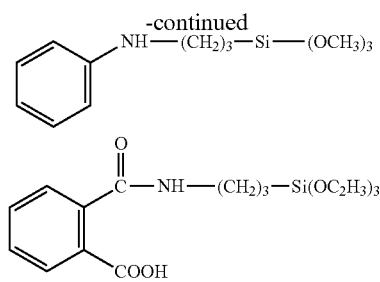

When a silane coupling agent is used, the content is preferably 0.01 to 20 parts by mass with respect to 100 parts by mass of the polyimide precursor (A).

The negative-type photosensitive resin composition of the invention may also have a sensitizing agent optionally added in order to increase the photosensitivity. Examples of sensitizing agents include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino) chalcone, p-dimethylaminocinnamylideneindanone, p-dimethylaminobenzylideneindanone, 2-(p-dimethylaminophenylbiphenylene)-benzothiazole, 2-(p-dimethylaminophenylvinylene)benzothiazole, 2-(p-dimethylaminophenyhlvinylene)isonaphthothiazole, 1,3-bis(4'-dimethylaminobenzal)acetone, 1,3-bis(4'-diethylamino benzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzthiazole, 2-(p-dimethylaminostyryl)naphtho(1,2-d)thiazole and 2-(p-dimethylaminobenzoyl)styrene. Any of these may be used alone or in combinations of 2 to 5 different types, for example.

The content of the sensitizing agent is preferably 0.1 to 25 parts by mass with respect to 100 parts by mass of the polyimide precursor (A).

The negative-type photosensitive resin composition of the invention may have a monomer with a photopolymerizable unsaturated bond optionally added in order to increase the relief pattern resolution. Such a monomer is preferably a (meth)acrylic compound that undergoes radical polymerization reaction by a photopolymerization initiator, and it may be, but is not particularly restricted to, the following compounds: mono- or diacrylates and methacrylates of ethylene glycol or polyethylene glycol, such as diethyleneglycol dimethacrylate and tetraethyleneglycol dimethacrylate, mono- or diacrylates and methacrylates of propylene glycol or polypropylene glycol, mono, di- or triacrylate and methacrylate of glycerol, cyclohexane diacrylate and dimethacrylate, diacrylate and dimethacrylate of 1,4-butanediol, diacrylate and dimethacrylate of 1,6-hexanediol, diacrylate and dimethacrylate of neopentyl glycol, mono- or diacrylate and methacrylate of bisphenol A, benzene trimethacrylate, isobornyl acrylate and methacrylate, acrylamide and its derivatives, methacrylamide and its derivatives, trimethylolpropane triacrylate and methacrylate, di- and triacrylate and methacrylate of glycerol, di-, tri- or tetraacrylate and methacrylate of pentaerythritol, and ethylene oxide or propylene oxide addition products of these compounds.

When the photosensitive resin composition contains a monomer having the aforementioned photopolymerizable unsaturated bond in order to increase the relief pattern resolution, the content of the monomer having the photopolymerizable unsaturated bond is preferably 1 to 50 parts by mass with respect to 100 parts by mass of the polyimide precursor (A).

In the form of a solution containing a solvent, a thermal polymerization inhibitor may be optionally added in order to improve the viscosity during storage and the stability of the photosensitivity. Examples of such thermal polymerization inhibitors that may be used include hydroquinone, N-nitrosodiphenylamine, p-tert-butylcatechol, phenothiazine, N-phenylnaphthylamine, ethylenediaminetetraacetic acid, 1,2-cyclohexanediaminetetraacetic acid, glycol etherdiaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino) phenol, N-nitroso-N-phenylhydroxylamine ammonium salt and N-nitroso-N-(1-naphthyl)hydroxylamine ammonium salt.

For the negative-type photosensitive resin composition of the invention, there may be appropriately added dyes and surfactants that have conventionally been used as additives for photosensitive resin compositions, as well as heat acid generators, dissolution accelerators, and adhesion aids for increased adhesiveness with the base material.

More specifically, in regard to such additives, methyl violet, crystal violet and malachite green may be mentioned as examples of dyes. Examples of surfactants include nonionic surfactants comprising polyglycols such as polypropylene glycol or polyoxyethylene lauryl ether, or their derivatives, fluorine-based surfactants, examples of which include FLUORAD (trade name of Sumitomo-3M), MEGAFAC (trade name of Dainippon Ink and Chemicals, Inc.) and LUMIFLON (trade name of Asahi Glass Co., Ltd.), and organic siloxane surfactants, examples of which include KP341 (trade name of Shin-Etsu Chemical Co., Ltd.), DBE (trade name of Chisso Corp.) and GRANOL (trade name of Kyoeisha Chemical Co., Ltd.). Examples of adhesion aids include alkylimidazolines, butyric acid, alkyl acids, polyhydroxystyrene, polyvinyl methyl ether, t-butylnovolac, epoxysilane, epoxy polymers and the like, as well as various silane coupling agents.

The content of the dye and surfactant is preferably 0.1 to 30 parts by mass with respect to 100 parts by mass of the polyimide precursor (A).

Alternatively, from the viewpoint of exhibiting satisfactory thermal properties and mechanical properties for the cured product even when the curing temperature has been lowered, a heat acid generator may be optionally added.

A heat acid generator is preferably added from the viewpoint of exhibiting satisfactory thermal properties and mechanical properties for the cured product even when the curing temperature has been lowered.

Heat acid generators include onium salts, salts formed from strong acids and bases, and imidosulfonates, which have the function of producing an acid by heat.

Examples of onium salts include aiyldiazonium salts, diaryliodonium salts such as diphenyliodonium salts;

di(alkylaryl)iodonium salts such as di(t-butylphenyl)iodonium salts;

trialkylsulfonium salts such as trimethylsulfonium salts;

dialkylmonoarylsulfonium salts such as dimethylphenylsulfonium salts;

diarylmonoalkyliodonium salts such as diphenylmethylsulfonium salts; and triarylsulfonium salts.

Preferred among these are di(t-butylphenyl)iodonium salt of para-toluenesulfonic acid, di(t-butylphenyl)iodonium salt of trifluoromethanesulfonic acid, trimethylsulfonium salt of trifluoromethanesulfonic acid, dimethylphenylsulfonium salt of trifluoromethanesulfonic acid, diphenylmethylsulfonium salt of trifluoromethanesulfonic acid, di(t-butylphenyl) iodonium salt of nonafluorobutanesulfonic acid, diphenyliodonium salt of camphorsulfonic acid, diphenyliodonium salt of ethanesulfonic acid, dimethylphenylsulfonium salt of benzenesulfonic acid and diphenylmethylsulfonium salt of toluenesulfonic acid.

In addition to the aforementioned onium salts, there may also be used, as salts formed from strong acids and bases, salts such as pyridinium salts, formed from the following strong acids and bases. Strong acids include arylsulfonic acids such as p-toluenesulfonic acid and benzenesulfonic acid, perfluoroalkylsulfonic acids such as camphorsulfonic acid, trifluoromethanesulfonic acid and nonafluorobutanesulfonic acid, and alkylsulfonic acids such as methanesulfonic acid, ethanesulfonic acid and butanesulfonic acid. Bases include alkylpyridines such as pyridine and 2,4,6-trimethylpyridine, and N-alkylpyridines or halogenated N-alkylpyridines such as 2-chloro-N-methylpyridine.

Examples of imidosulfonates that may be used include phthalimidosulfonates, naphthoyl imidosulfonate, but there is no limitation so long as the compounds generate acids by heat.

When a heat acid generator is used, the content is preferably 0.1 to 30 parts by mass, more preferably 0.5 to 10 parts by mass and even more preferably 1 to 5 parts by mass with respect to 100 parts by mass of the polyimide precursor (A).

<Method for Producing Cured Relief Pattern>

The invention further provides a method for producing a cured relief pattern, comprising (1) a step of coating the aforementioned negative-type photosensitive resin composition according to the invention onto a substrate to form a resin layer on the substrate, (2) a step of exposing the resin layer to light, (3) a step of developing the exposed resin layer to form a relief pattern, and (4) a step of curing the relief pattern to form a cured relief pattern. Typical modes for each of the steps will now be described.

(1) Step of Coating Negative-Type Photosensitive Resin Composition onto Substrate to Form Resin Layer on the Substrate In this step, a negative-type photosensitive resin composition of the invention is coated onto a base material and then dried if necessary, to form a resin layer. The coating method may be a method conventionally used for coating of photosensitive resin compositions, and for example, a method of coating with a spin coater, bar coater, blade coater, curtain coater, screen printer or the like, or a method of spray coating with a spray coater, may be used.

The method of forming a relief pattern using the negative-type photosensitive resin composition of the invention may be not only coating of the negative-type photosensitive resin composition onto a substrate to form a resin layer on the substrate, but also lamination of a layer of the negative-type photosensitive resin composition on a substrate with the negative-type photosensitive resin composition in the form of a film, to form a resin layer. Moreover, a film of the negative-type photosensitive resin composition of the invention may be formed on a support base, and the support base removed after lamination when the film is used, or removed before lamination.

If necessary, the coating film composed of the negative-type photosensitive resin composition may be dried. The drying method used may be air-drying, heat drying with an oven or hot plate, or vacuum drying. Specifically, for air-drying or heat drying, the drying may be carried out under conditions of 20° C. to 140° C. for 1 minute to 1 hour. A resin layer can be formed on a substrate in this manner.

(2) Resin Layer Light Exposure Step

In this step, the resin layer that has been formed is exposed to an ultraviolet ray light source using an exposure device with a contact aligner, mirror projection and stepper, either directly or through a patterned photomask or reticle.

Next, if necessary, it may be subjected to post-exposure baking (PEB) and/or pre-development baking with a prescribed combination of temperature and time, for the purpose of improving the photosensitivity. The range of baking conditions is preferably a temperature of 40 to 120° C. and a time of 10 seconds to 240 seconds, but there is no limitation to this range so long as the properties of the negative-type photosensitive resin composition of the invention are not inhibited.

(3) Step of Developing Resin Layer after Exposure to Form Relief Pattern

In this step, the unexposed sections of the exposed photosensitive resin layer are developed and removed. The developing method may be a conventionally known photoresist developing method, selected from among any methods such as a rotating spray method, paddle method or dipping method with ultrasonic treatment. Following development, post-development baking may be carried out with the desired combination of temperature and time, as necessary for the purpose of adjusting the relief pattern shape.

The developing solution used for developing is preferably a good solvent for the negative-type photosensitive resin composition, or a combination of a good solvent and a poor solvent. Preferred examples of good solvents include N-methylpyrrolidone, N-cyclohexyl-2-pyrrolidone, N,N-dimethylacetamide, cyclopentanone, cyclohexanone, γ-butyrolactone and α-acetyl-γ-butyrolactone, and preferred examples of poor solvents include toluene, xylene, methanol, ethanol, isopropyl alcohol, ethyl lactate, propyleneglycol methyl ether acetate and water. When a good solvent and a poor solvent are used in admixture, the proportion of the poor solvent with respect to the good solvent is preferably adjusted by the solubility of the polymer in the photosensitive resin composition. The solvents may be used in combinations of two or more, such as several.

(4) Step of Curing Relief Pattern to Form Cured Relief Pattern

In this step, the relief pattern obtained by the previous development is cured to convert it to a cured relief pattern. The curing method may be selected from among various methods including those using a hot plate, using an oven, or using a temperature program-settable heating oven. The curing may be carried out under conditions of 150° C. to 400° C. for 30 minutes to 5 hours, for example. The atmosphere gas for curing may be air, or an inert gas such as nitrogen or argon may be used.

<Semiconductor Device>

The present invention further provides a semiconductor device comprising a cured relief pattern obtained by the method for producing a cured relief pattern of the invention described above. The invention also provides a semiconductor device comprising a base material as the semiconductor element, and a cured relief pattern of a resin formed on the base material by the method for producing a cured relief pattern described above. The invention can also be applied for a method for producing a semiconductor device, a part of the steps of which is the aforementioned method for producing a cured relief pattern, using a semiconductor element as the base material. The semiconductor device of the invention can be produced by forming a cured relief pattern, formed by the method for producing a cured relief pattern described above, as a surface protecting film, interlayer dielectric film, rewiring insulating film, flip-chip device protective film or a protective film for a semiconductor device having a bump structure, and combining that with a known method for producing a semiconductor device.

In addition to application in semiconductor devices as described above, the negative-type photosensitive resin composition of the invention is also useful for use in interlayer dielectric films for multilayer circuits, cover coats for flexible copper-clad sheets, solder resist films and liquid crystal oriented films.

Second Embodiment

Embodiments of the invention will now be explained in detail. Throughout the present specification, when multiple structures represented by the same symbol in a general formula are present in a molecule, they may be the same or different.

The second aspect of this embodiment is as follows.
<Photosensitive Resin Composition>

The photosensitive resin composition of the invention is a negative-type photosensitive resin containing a photosensitive polyimide precursor having a reactive substituent on the ends of the main chain, the composition having a viscosity of 80 poise or lower.
[Photosensitive Polyimide Precursor]

The photosensitive polyimide precursor having a reactive substituent on the ends, to be used for the invention, will now be explained.

Preferred photosensitive polyimide precursors to be used for the invention are those having i-line absorbance of 0.1 to 2.0. The i-line absorbance is measured for a 10 μm-thick film obtained after coating the photosensitive polyimide precursor as a simple solution and pre-baking.

In order to form forward tapering at the sides of the openings in the cured relief pattern obtained from the photosensitive resin composition, the photosensitive resin composition of the invention preferably contains a photosensitive polyimide precursor satisfying the conditions specified above.
<Method of Determining i-Line Absorbance>

The i-line absorbance of a 10 μm-thick film can be measured with a common spectrophotometer, after prebaking a coating film of the photosensitive polyimide precursor formed alone on quartz glass. If the thickness of the formed film is not 10 μm, the absorbance obtained for the film can be determined as the i-line absorbance for a 10 μm thickness by conversion to 10 μm thickness according to Lambert-Beer's law.

If the i-line absorbance is less than 0.1, the structure of the photosensitive polyimide precursor satisfying this condition will be limited, and therefore the mechanical properties and thermal properties will be inferior. If the i-line absorbance is greater than 2.0, the i-line absorbance of the coating film will be too great, preventing light from reaching the bottom parts. With negative-types, therefore, this may result in a lack of curing at the bottom parts of the coating film.

The photosensitive polyimide precursor of the invention is preferably composed mainly of at least one type of resin selected from the group consisting of polyamic acid, polyamic acid ester, polyamic acid salt and polyamic acid amide. The term "composed mainly of" means containing the resin at 60 mass % or greater, and preferably 80 mass % or greater, of the total resin. The photosensitive polyimide precursor may also include other resins as necessary.

The weight-average molecular weight (Mw) of the photosensitive polyimide precursor is preferably 1,000 or greater and more preferably 3,000 or greater, in terms of polystyrene according to gel permeation chromatography (GPC), from the viewpoint of the heat resistance and mechanical properties of the film obtained after heat treatment. The upper limit for the weight-average molecular weight (Mw) is preferably no greater than 100,000. From the viewpoint of solubility in the developing solution, the upper limit for the weight-average molecular weight (Mw) is more preferably no greater than 50,000.

The reactive substituent that reacts by heat or light at the ends of the main chain of the photosensitive polyimide precursor of the invention is at least one type selected from among acryl methacryl, vinyl, alkenyl, cycloalkenyl, alkadienyl, cycloalkadienyl, styryl, ethynyl, imino, isocyanato, cyanato, cycloalkyl, epoxy, oxetanyl, carbonate, hydroxyl, mercapto, methylol and alkoxyalkyl groups, for example. From the viewpoint of in-plane uniformity, acryl, methacryl, vinyl, alkenyl, cycloalkenyl, alkadienyl, cycloalkadienyl, styryl and ethynyl groups are preferably used.

The photosensitive polyimide precursor to be used for the invention is synthesized by polycondensation reaction in which the amine portion of a diamine monomer and the acid anhydride portion of an acid dianhydride monomer form amide bonds. Since the polycondensation is carried out with either the diamine monomer or the acid dianhydride monomer in excess, upon completion of the polycondensation, amine groups remain on the ends of the main chain when the diamine is in excess, and acid anhydride groups remain on the ends of the main chain when the acid dianhydride is in excess. The amine or acid anhydride groups react with the compound having a reactive substituent that reacts by heat or light, thereby allowing the reactive substituent that reacts by heat or light to be introduced onto the ends of the main chain. Introduction of the reactive substituent onto the diamine monomer or acid dianhydride monomer is not introduction onto the ends of the main chain.

The differences between the invention and the prior art documents will now be explained. For simplicity's sake, the acid dianhydride monomer of the polyimide precursor will be schematically represented as "A", and the diamine monomer as "B". The acid dianhydride monomer A has a substituent X on a side chain while the diamine monomer B has a substituent Y on a side chain. The reactive substituent M is introduced onto the ends of the main chain. That is, the polyimide precursor of the invention is represented as follows. The example shown here has B at the end, but A may also be at the end.

[Chemical Formula 51]

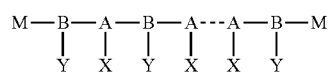

The polyimide precursor of the invention also includes cases where the end group M is the same as the substituent Y or X of the monomer. Therefore, the invention also includes polyimide precursors schematically represented as follows.

[Chemical Formula 52]

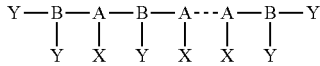

According to the invention, therefore, the reactive group M in the polyimide precursor is "actively" introduced at the ends of the "main chain" after polymerization, and differs from the substituent Y originally present in the monomer. Consequently, even if the end groups M happen to be the same as the substituent Y originally present in the monomer, they should both be distinguished.

In contrast, while polyamide precursors are mentioned in the prior art documents (for example, Japanese Unexamined Patent Publication No. 2011-123219), some of them do not have the ends of the main chain modified. The polyamide precursors described in the prior art document are schematically represented as follows. The example shown here has B at the end, but A may also be at the end.

[Chemical Formula 53]

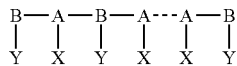

Thus, in cases where the ends of the main chain after polymerization have not been actively modified, even if reactive substituents Y and X were present on the ends of the main chain, they are not reactive groups M as specified according to the invention. Furthermore, introduction of reactive substituents X and Y into the monomer A or monomer B is not the same as their introduction onto the ends of the main chain.

Here, "reacts by heat or light" means that some chemical change takes place due to heat or light. This includes, for example, crosslinking by heat or light, as with a methacryloxy group, or removal of a protecting group by heat or light, as with a t-butylcarbonate group.

Specifically, as will be explained below, before reactive functional groups that react by heat or light are introduced onto the ends of the main chain, the ends of the main chain of the photosensitive polyimide precursor are usually amino groups or acid anhydride groups, or carboxyl groups. Reactive substituents that react by heat or light are introduced at the ends, either directly or through a divalent substituent of 1 to 20 carbon atoms, such as an alkyl or aromatic group. Introduction at the end groups may be either at the monomer stage or after polymerization. The rate of introduction of reactive substituents at the ends is preferably 50% or higher and more preferably 80% or higher. Several different reactive substituents may also be introduced at the ends.

For the photosensitive resin composition of the invention, one of the most preferred examples for the photosensitive polyimide precursor, from the viewpoint of heat resistance and photosensitivity, is an ester-type photosensitive polyimide precursor including a structure represented by the following formula (A1):

[Chemical Formula 54]

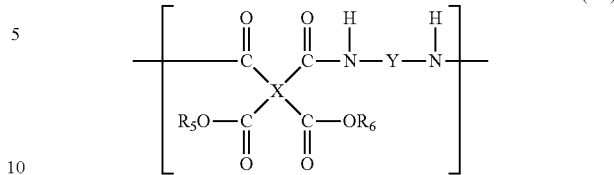

{In formula (A1), X is a tetravalent organic group, Y is a divalent organic group, and $R_5$ and $R_6$ are each independently a hydrogen atom, a monovalent organic group represented by the following formula (R1):

[Chemical Formula 55]

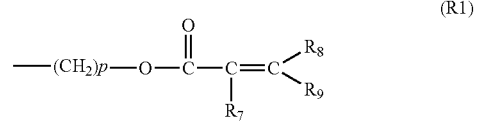

(In formula (R1), $R_7$, $R_8$ and $R_9$ are each independently a hydrogen atom or a $C_1$-$C_3$ organic group, and p is an integer selected from among 1 to 10),
or a $C_1$-$C_4$ saturated aliphatic group, with the proviso that $R_5$ and $R_6$ are not both hydrogen). The symbol p may be 2 to 10.

In formula (A1), the tetravalent organic group represented by X is preferably an organic group of 6 to 40 carbon atoms, from the viewpoint of both heat resistance and photosensitivity. More preferably, it is an aromatic group or alicyclic aliphatic group having the —COOR group, —COOR$_2$ group and —CONH— group in a mutually ortho positional relationship. The tetravalent organic group represented by X is preferably an organic group of 6 to 40 carbon atoms containing an aromatic ring. More preferably, it may be a structure represented by the following formula (30):

[Chemical Formula 56]

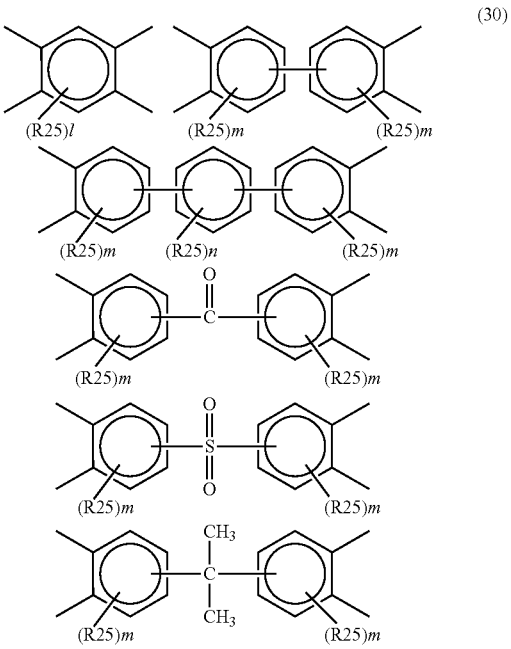

-continued

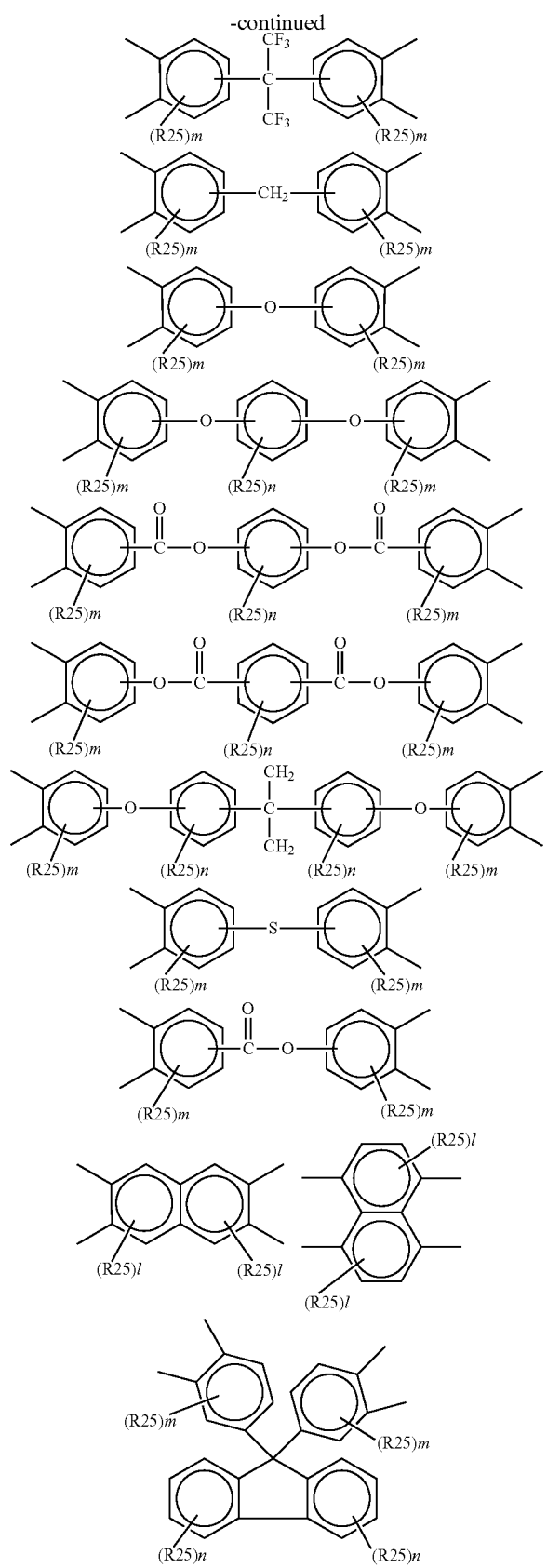

{wherein R25 is a monovalent group selected from among hydrogen atoms, fluorine atoms, $C_1$-$C_{10}$ hydrocarbon groups and $C_1$-$C_{10}$ fluorine-containing hydrocarbon groups, l is an integer selected from among 0 to 2, m is an integer selected from among 0 to 3, and n is an integer selected from among 0 to 4}, with no limitation to these. The structure of X may be of a single type or a combination of two or more types. X groups having the structures represented by the above formulas are particularly preferred from the viewpoint of both heat resistance and photosensitivity.

More preferred examples among tetravalent organic groups represented by X in formula (A1) include one or more organic groups selected from among the following formulas (B1) to (B3).

[Chemical Formula 57]

(B1)

[Chemical Formula 58]

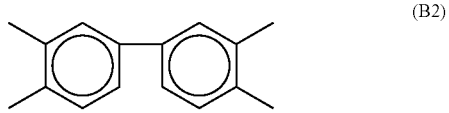

(B2)

[Chemical Formula 59]

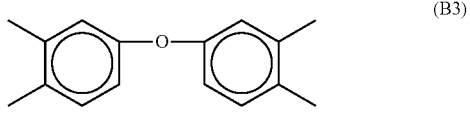

(B3)

These organic groups are most preferred from the viewpoint of increasing the in-plane uniformity of film thickness, but there is no limitation to them. The structure of X may be of a single type or a combination of two or more types.

In formula (A1), the divalent organic group represented by Y is preferably an aromatic group of 6 to 40 carbon atoms, from the viewpoint of both heat resistance and photosensitivity. For example, it may be a structure represented by the following formula (31):

[Chemical Formula 60]

(31)

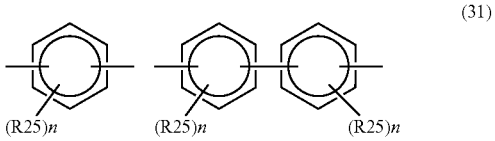

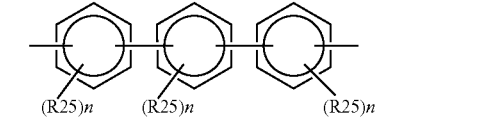

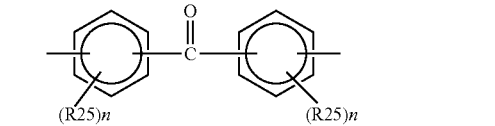

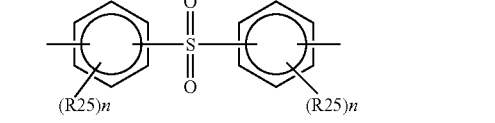

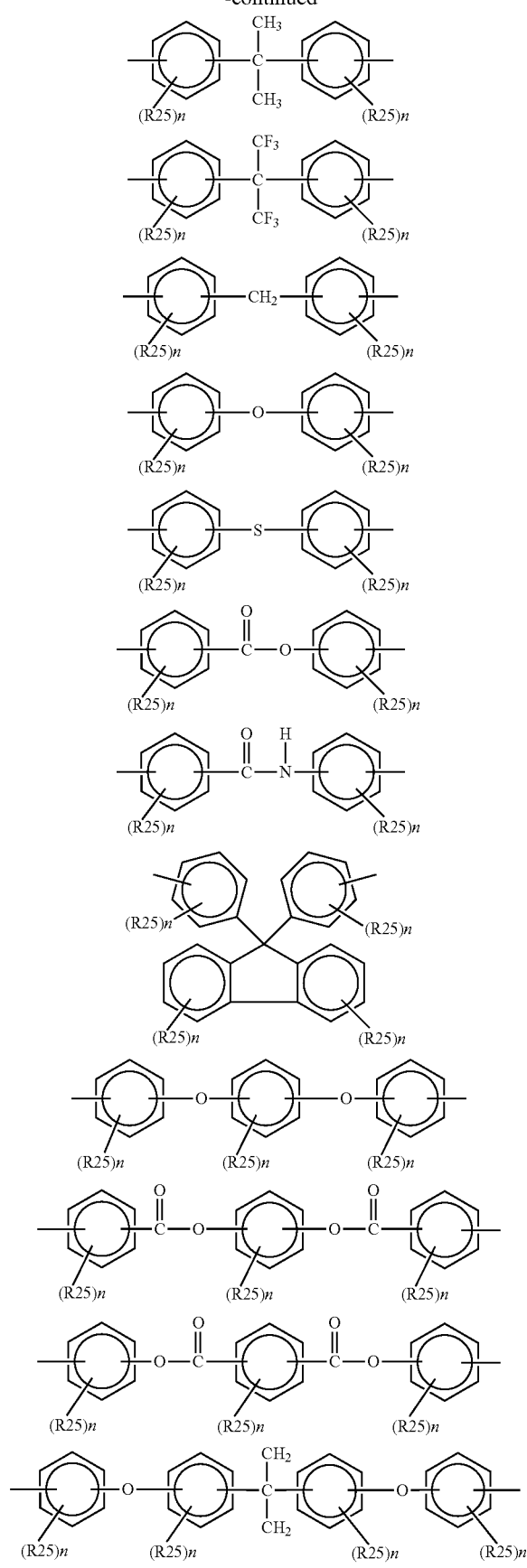

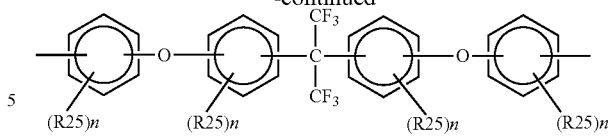

{wherein $R_{25}$ is a monovalent group selected from among hydrogen atoms, fluorine atoms, $C_1$-$C_{10}$ hydrocarbon groups and $C_1$-$C_{10}$ fluorine-containing hydrocarbon groups, and n is an integer selected from among 0 to 4}, with no limitation to these. The structure of Y may be of a single type or a combination of two or more types. Y groups having the structures represented by formula (31) above are particularly preferred from the viewpoint of both heat resistance and photosensitivity.

For $R_5$ and $R_6$ in formula (A1), $R_7$ in formula (R1) is preferably a hydrogen atom or a methyl group. $R_8$ and $R_9$ are preferably hydrogen atoms, from the viewpoint of photosensitivity. Also, from the viewpoint of photosensitivity, p is an integer of between 2 and 10, inclusive, and preferably an integer of between 2 and 4, inclusive.

More preferred examples among divalent organic groups represented by Y in formula (A1) include one or more divalent organic groups selected from among the following formulas (C1) to (C3).

[Chemical Formula 61]

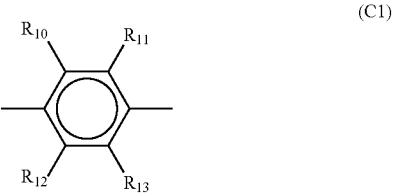

(C1)

(In formula (C1), $R_{10}$-$R_{13}$ are hydrogen atoms or $C_1$-$C_4$ monovalent aliphatic groups, which may be different from each other or the same.)

[Chemical Formula 62]

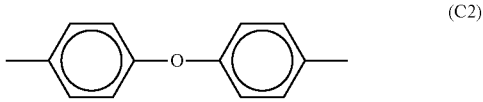

(C2)

[Chemical Formula 63]

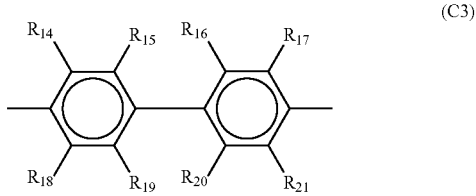

(C3)

(In formula (C3), $R_{14}$-$R_{21}$ are hydrogen atoms, halogen atoms or $C_1$-$C_4$ monovalent organic groups, which may be different from each other or the same.). These organic groups are most preferred from the viewpoint of increasing the in-plane uniformity of film thickness, but there is no limitation to them. Particularly preferred among these are ones wherein Y in formula (A1) contains (C3) above.

Most preferably for the photosensitive resin composition of the invention, X in formula (A1) contains the following (B3):

[Chemical Formula 64]

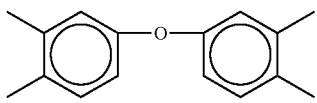

(B3)

and Y contains the following (C2):

[Chemical Formula 65]

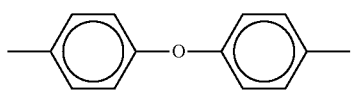

(C2)

which will allow the in-plane uniformity of film thickness to be increased.

Also most preferably for the photosensitive resin composition of the invention, X in formula (A1) includes the following (B3):

[Chemical Formula 66]

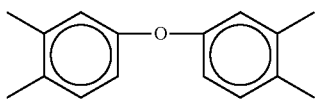

(B3)

and Y contains the following (C3):

[Chemical Formula 67]

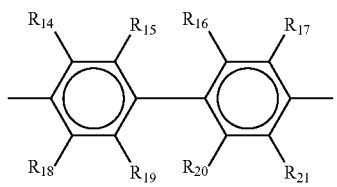

(C3)

which will allow the in-plane uniformity of film thickness to be increased.

Also, most preferably for the photosensitive resin composition of the invention, X in formula (A1) contains the following (B2):

[Chemical Formula 68]

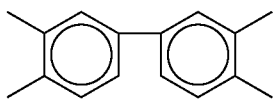

(B2)

and Y contains the following (C2):

[Chemical Formula 69]

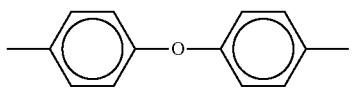

(C2)

which will allow the in-plane uniformity of film thickness to be increased.

Also, preferably for the photosensitive resin composition of the invention, X in formula (A1) includes the following (B3):

[Chemical Formula 70]

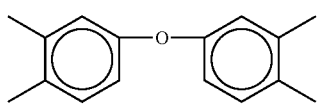

(B3)

and Y contains the following (C1):

[Chemical Formula 71]

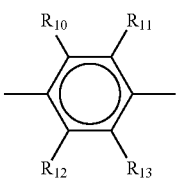

(C1)

which will allow the in-plane uniformity of film thickness to be increased.

Preferred among these are structures wherein X includes formula (B3) and Y includes formula (C2) or (C1).

Preferred among these are structures wherein X includes formula (B2) and Y includes formula (C1), (C2) or (C3).

Preferred among these are structures wherein X includes formula (B1) and Y includes formula (C1).

These combinations are particularly preferred for their excellent chemical resistance and copper void-minimizing effects, but there is no limitation to them Most preferred among such combinations are structures wherein X includes formula (B3) and Y includes formula (C2), from the viewpoint of chemical resistance and copper void-minimizing effect.

The preferred range for the weight-average molecular weight (Mw) of the polyimide precursor (A) of this embodiment is 3,000 or greater and less than 16,000 in terms of polystyrene, according to gel permeation chromatography (GPC). By using a polyimide precursor (A) with a weight-average molecular weight (Mw) in this range, it is possible to satisfactorily promote imide ring-forming reaction (imidization) of a polyimide even under curing conditions of 200° C. or below, and to obtain a resin layer that has high chemical resistance and is able to reduce generation of copper voids. If the weight-average molecular weight (Mw) is greater than this range, the molecular motion of the polyimide precursor (A) under the curing conditions will be inadequate and imidization will proceed with greater difficulty, resulting in insufficient chemical resistance of the obtained resin layer and a tendency toward generation of copper voids. On the other hand, if the weight-average molecular weight (Mw) is less than this range, the molecular motion of the polyimide precursor (A) under the curing conditions will be more active and imidization will more readily proceed. On the other hand, if the weight-average molecular weight (Mw) is low, resulting in insufficient chemical resistance of the resin layer obtained after curing and a tendency toward generation of copper voids. By using a polyimide precursor (A) with a weight-average molecular weight (Mw) in this range, it is possible to obtain a satisfactory imidization rate even under curing conditions of 200° C. or below, with satisfactory chemical resistance of the obtained cured film, and to obtain a resin that can inhibit generation of copper voids.

A more preferred range for the weight-average molecular weight (Mw) of the polyimide precursor (A) is 3,000 or greater and 15,000 or less, even more preferably 3,000 or greater and 13,000 or less, yet more preferably 3,000 or greater and 11,000 or less, even yet more preferably 3,000 or greater and 10,000 or less, even yet more preferably 3,000 or greater and less than 10,000, even yet more preferably 3,000 or greater and 9,500 or less, and especially preferably 3,000 or greater and 9,000 or less.

The lower limit for the weight-average molecular weight (Mw) of the polyimide precursor (A) is 4,000 or greater, 5,000 or greater, 6,000 or greater or 7,000 or greater. The upper limit for the weight-average molecular weight (Mw) of the polyimide precursor (A) is 15,000 or less, 13,000 or less, 12,000 or less, 11,000 or less, 10,000 or less, or less than 10,000.

The method of controlling the weight-average molecular weight (Mw) of the polyimide precursor (A) is not particularly restricted, but the following methods are known. For example, it can be carried out by appropriately controlling the molar ratio of addition between the acid/ester containing a tetravalent organic group $X_1$ and the diamine containing a divalent organic group $Y_1$, during amino polycondensation. The weight-average molecular weight (Mw) can be reduced by adding either the acid/ester containing the tetravalent organic group $X_1$ or the diamine containing the divalent organic group $Y_1$ in excess.

The method of measuring the weight-average molecular weight (Mw) for this embodiment may be gel permeation chromatography (GPC), and calculation may be from a calibration curve drawn using standard polystyrene. Tetrahydrofuran and N-methyl-2-pyrrolidone are recommended as developing solvents for gel permeation chromatography (GPC). It is recommended to select the standard monodisperse polystyrene from among the organic solvent-based reference samples STANDARD SM-105 by Showa Denko K.K.

When a photosensitive polyimide precursor is used, the form for imparting photosensitivity to the photosensitive resin composition may be an ester bond type or ionic bond type. For the former, the method is introduction of a compound having a photopolymerizable group. i.e. an olefinic double bond, by an ester bond, onto a side chain of the polyimide precursor. For the latter, the method is addition of a photopolymerizable group by bonding the carboxyl group of a polyimide precursor and the amino group of a (meth) acrylic compound with an amino group, by ionic bonding.

The ester bond-type polyimide precursor can be obtained in the following manner. Specifically, first a tetracarboxylic dianhydride including the aforementioned tetravalent organic group X is reacted with an alcohol having a photopolymerizable unsaturated double bond and optionally a saturated aliphatic alcohol of 1 to 4 carbon atoms, to prepare a partially esterified tetracarboxylic acid (hereunder also referred to as "acid/ester"). The acid/ester can then be used in amide polycondensation with a diamine including the aforementioned divalent organic group Y.

Preferably, at least one of the ends of the main chain of the photosensitive polyimide precursor has the structure of the following formula (E1) or (F1).

[Chemical Formula 72]

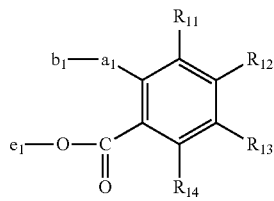

(E1)

(In the formula, a1 includes at least one bond that is an amide bond, imide bond, urea bond or urethane bond, b1 is a reactive substituent that crosslinks by heat or light, e1 is a monovalent organic group of 1 to 30 carbon atoms, $R_{11}$ and $R_{14}$ are each independently a hydrogen atom or a monovalent organic group of 1 to 30 carbon atoms, and $R_{12}$ and $R_{13}$ are each independently a hydrogen atom, a monovalent organic group of 1 to 30 carbon atoms, or part of an aromatic ring or an aliphatic ring. (This is with the proviso that $R_{12}$ and $R_{13}$ are not both hydrogen.)

[Chemical Formula 73]

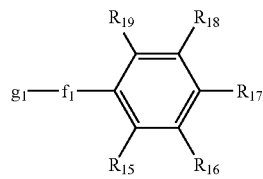

(F1)

(In the formula, f1 includes at least one bond that is an amide bond, imide bond, urea bond, urethane bond or ester bond, g1 is a reactive substituent that crosslinks by heat or light, $R_{15}$-$R_{19}$ are each independently a hydrogen atom, a monovalent organic group of 1 to 30 carbon atoms, or part of an aromatic ring or an aliphatic ring.
(This is with the proviso that $R_{16}$, $R_{17}$ and $R_{18}$ are not all hydrogen.)

In formula (E1), when the ends are modified acid dianhydrides, i.e. when a1 is an ester group, applying heat during the post-development baking results in restoration to the acid dianhydride, such that crosslinking by post-development baking is difficult. Since a1 is an amide bond, imide bond, urea bond or urethane bond for this embodiment, there is no risk of restoration to the acid dianhydride during post-development baking, and crosslinking by post-development baking can be efficiently carried out.

In formulas (E1) and (F1), b1 and g1 are preferably reactive substituents with double bonds at the ends, from the viewpoint of crosslinking by post-development baking.

If formulas (E1) and (F1) are compared, the preferred one is formula (F1). This is because diamine ends have lower steric hindrance, allowing the ends to be more easily cross-linked. The chemical resistance is therefore higher.

Preferably, f1 includes at least one amide, imide bond, urea or urethane group. If f1 is an ester group, hydrolysis will be facilitated and crosslinking may not occur. Since these four groups (amide, imide bond, urea and urethane groups) are less susceptible to hydrolysis, crosslinking by post-development baking takes place more efficiently. The chemical resistance is therefore higher.

The reactive substituent that crosslinks by heat or light b1 is preferably at least one selected from the group consisting of acryl, methacryl, vinyl, alkenyl, cycloalkenyl, alkadienyl, cycloalkadienyl, styryl, ethynyl, imino, isocyanato, cyanato, cycloalkyl, epoxy, oxetanyl, carbonate, hydroxyl, mercapto, methylol and alkoxyalkyl groups, for example.

From the viewpoint of film thickness homogeneity, b1 is preferably at least one selected from among acryl, methacryl, vinyl, alkenyl, cycloalkenyl, alkadienyl, cycloalkadienyl styryl and ethynyl groups. It is most preferably a methacryl group.

A compound having a reactive substituent that reacts by heat or light, and that has a site that also reacts with amino groups, is then reacted with the amino groups. The site that reacts with amino groups may be an acid anhydride, epoxy or isocyanate group. Conversely, the following method may be used instead. Specifically, first during amide polycondensation, a partially esterified tetracarboxylic acid is charged in excess to form carboxyl groups at both ends of the main chain. A compound having a reactive substituent that reacts by heat or light, and that has a site that also reacts with carboxyl groups, is then reacted with the carboxyl groups. The site that reacts with carboxyl groups may be an amine, alcohol or the like.

An example of a synthesis method for a photosensitive polyimide precursor is shown below, with no limitation to the one shown.

[Chemical Formula 74]

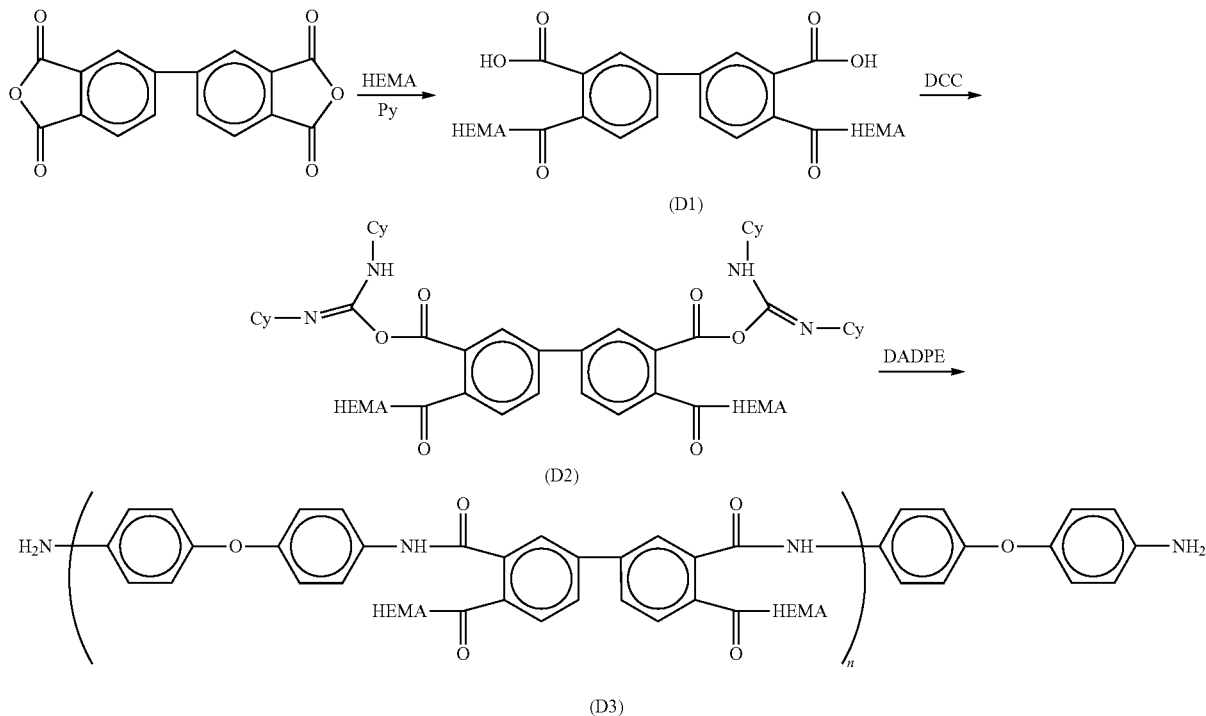

The reactive substituent that crosslinks by heat or light g1 is at least one selected from the group consisting of acryl, methacryl, vinyl, alkenyl, cycloalkenyl, alkadienyl cycloalkadienyl, styryl, ethynyl, imino, isocyanato, cyanato, cycloalkyl, epoxy, oxetanyl, carbonate, hydroxyl mercapto, methylol and alkoxyalkyl groups, for example.

From the viewpoint of film thickness homogeneity, g1 is preferably at least one selected from among acryl, methacryl, vinyl, alkenyl, cycloalkenyl, alkadienyl, cycloalkadienyl, styryl and ethynyl groups. It is most preferably a methacryl group.

The following method may be mentioned as a method of introducing a reactive substituent that reacts by heat or light at the ends of the main chain; namely, first, during amide polycondensation, a diamine, for example, is charged in excess to form amino groups at both ends of the main chain.

This is a method of introducing a reactive substituent that reacts by heat or light onto the ends of the main chain, after amide polycondensation. However, when the diamine is in excess either initially or at a mid-stage of the amide polycondensation, a compound having a reactive substituent that reacts by heat or light and having a site that reacts with amino groups may be added. When the partially esterified tetracarboxylic acid is in excess, a compound having a reactive substituent that reacts by heat or light and having a site that reacts with carboxyl groups may be added.

(Preparation of Acid/Ester)

According to the invention, tetracarboxylic dianhydrides having a tetravalent organic group X, that may be suitably used to prepare an ester bond-type polyimide precursor, include the acid dianhydrides having the structure represented by formula (30), as well as, for example, pyromellitic anhydride, diphenyl ether-3,3',4,4'-tetracarboxylic dianhydride, benzophenone-3,3',4,4'-tetracarboxylic dianhydride, biphenyl-3,3',4,4'-tetracarboxylic dianhydride, diphenylsulfone-3,3',4,4'-tetracarboxylic dianhydride, diphenylmethane-3,3',4,4'-tetracarboxylic dianhydride, 2,2-bis(3,4-phthalic anhydride)propane and 2,2-bis(3,4-phthalic anhydride)-1,1,1,3,3,3-hexafluoropropane. Preferred are pyromellitic anhydride, diphenyl ether-3,3',4,4'-tetracarboxylic dianhydride and biphenyl-3,3',4,4'-tetracarboxylic dianhydride. Also preferred are pyromellitic anhydride, diphenyl ether-3,3',4,4'-tetracarboxylic dianhydride, benzophenone-3,3',4,4'-tetracarboxylic dianhydride and biphenyl-3,3',4,4'-tetracarboxylic dianhydride. More preferred are pyromellitic anhydride, diphenyl ether-3,3',4,4'-tetracarboxylic dianhydride and biphenyl-3,3',4,4'-tetracarboxylic dianhydride, with no limitation to these. These may be used alone, or two or more may be used in admixture.

According to the invention, examples of alcohols having a photopolymerizable group, that may be suitably used to prepare an ester bond-type polyimide precursor, include 2-acryloyloxyethyl alcohol, 1-acryloyloxy-3-propyl alcohol, 2-acrylamideethyl alcohol, methylolvinyl ketone, 2-hydroxyethylvinyl ketone, 2-hydroxy-3-methoxypropyl acrylate, 2-hydroxy-3-butoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol (2-hydroxyethyl methacrylate), 1-methacryloyloxy-3-propyl alcohol, 2-methacrylamide ethyl alcohol, 2-hydroxy-3-methoxypropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate and 2-hydroxy-3-cyclohexyloxypropyl methacrylate.

Saturated aliphatic alcohols that may be optionally used together with the alcohol having a photopolymerizable group are preferably saturated aliphatic alcohols of 1 to 4 carbon atoms. Specific examples include methanol, ethanol n-propanol, isopropanol n-butanol and tert-butanol.

The tetracarboxylic dianhydride and alcohol suitable for the invention are mixed by stirring for 4 to 10 hours at a temperature of 20 to 50° C., preferably in the presence of a basic catalyst such as pyridine and preferably in an appropriate reaction solvent. This promotes esterification reaction of the acid anhydride, allowing the desired acid/ester to be obtained (formula (D1) above).

The reaction solvent is preferably one that completely dissolves the tetracarboxylic dianhydride and alcohol starting materials, as well as the acid/ester product. More preferably, it is a solvent that completely dissolves the photosensitive polyimide precursor as well, which is the amide polycondensation product of the acid/ester and the diamine. Examples of such solvents include N-methyl-2-pyrrolidone, N,N-dimethylacetamide, N,N-dimethylformamide, dimethyl sulfoxide, tetramethylurea, ketones, esters, lactones, ethers, halogenated hydrocarbons and hydrocarbons.

Specific examples of these include:

as ketones, acetone, methyl ethyl ketone, methyl isobutyl ketone and cyclohexanone;

as esters, methyl acetate, ethyl acetate, butyl acetate and diethyl oxalate;

as a lactone, γ-butyrolactone;

as ethers, ethyleneglycol dimethyl ether, diethyleneglycol dimethyl ether and tetrahydrofuran;

as halogenated hydrocarbons, dichloromethane, 1,2-dichloroethane, 1,4-dichlorobutane, chlorobenzene and o-dichlorobenzene; and as hydrocarbons, hexane, heptane, benzene, toluene and xylene. If necessary, these may be used alone, or two or more may be used in admixture.

(Preparation of Photosensitive Polyimide Precursor)

Preferably, an appropriate dehydrating condensation agent is added to and mixed with the acid/ester (typically as a solution, dissolved in the aforementioned reaction solvent), while cooling on ice, to convert the acid/ester to a polyacid chloride (formula (D2)). Alternatively, an appropriate chloride may be added and mixed to convert the acid/ester to a polyacid chloride. Next, a diamine having a divalent organic group Y that can be suitably used for the invention, which has been separately dissolved or dispersed in a solvent, is loaded in dropwise. Also, by subjecting both to amide polycondensation it is possible to obtain the desired photosensitive polyimide precursor (formula (D3) above). A diaminosiloxane may also be used in combination with the diamine having the divalent organic group Y.

Examples for the dehydrating condensation agent include dicyclohexylcarbodiimide, 1-ethoxycarbonyl-2-ethoxy-1,2-dihydroquinoline, 1,1-carbonyldioxy-di-1,2,3-benzotriazole and N,N'-disuccinimidyl carbonate. Examples for the chloride include thionyl chloride and phosphorus pentachloride.

This yields a polyacid anhydride or polyacid chloride intermediate.

According to the invention, examples of diamines having a divalent organic group Y, which may be suitably used in the reaction between the polyacid anhydride and polyacid chloride obtained as described above, include diamines having the structure represented by formula (31) above, as well as p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl]ether, bis[4-(3-aminophenoxy)phenyl] ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, ortho-tolidinesulfone and 9,9-bis(4-aminophenyl)fluorene; and those compounds having some of the hydrogens on the benzene ring replaced by methyl, ethyl, hydroxymethyl or hydroxyethyl groups or halogen atoms;

as well as mixtures of the same.

Specific examples of substituents include 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl, 2,2'-bis(trifluoromethyl)-4,4'-diaminobiphenyl, 2,2'-bis(fluoro)-4,4'-diaminobiphenyl and 4,4'-diaminooctafluorobiphenyl; and mixtures of the same. Preferred for use among these are p-phenylenediamine, 4,4'-diaminodiphenyl ether, 2,2'-dimethyl-4,4'-diaminobiphenyl, 2,2'-bis(trifluoromethyl)-4,4'- diaminobiphenyl, 2,2'-bis(fluoro)-4,4'-diaminobiphenyl and 4,4'-diaminooctafluorobiphenyl. More preferred are p-phenylenediamine and 4,4'-diaminodiphenyl ether, as well as their mixtures. Diamines are not limited to the examples mentioned above.

A diaminosiloxane is used in combination with the diamine containing the divalent organic group Y during preparation of the photosensitive polyimide precursor, for the purpose of increasing the adhesiveness of the coating film formed from the photosensitive resin composition of the invention with different substrates. Specific examples of such diaminosiloxanes include 1,3-bis(3-aminopropyl)tetramethyldisiloxane and 1,3-bis(3-aminopropyl)tetraphenyldisiloxane.

Examples of compounds having reactive substituents that react by heat or light and having a site that reacts with amino groups, to be used to introduce a reactive substituent that reacts by heat or light onto the ends of the main chain, include maleic anhydride, 5-norbornane-2,3-dicarboxylic anhydride, itaconic anhydride, methacrylic anhydride, 2-isocyanatoethyl methacrylate, 2-isocyanatoethyl acrylate, 4-ethynylphthalic anhydride, 4-vinylphthalic anhydride and di-t-butyl dicarbonate. Examples of compounds having reactive substituents that react by heat or light and having sites that react with carboxyl groups include 4-aminostyrene and 4-ethynylaniline.

Below are listed specific examples of compounds having reactive substituents that react by heat or light and having sites that react with carboxyl groups, the ends of the main chains of polyimide precursors being modified with the reactive substituents. However, the invention is in no way limited by the examples.

(1) Maleic Anhydride:

[Chemical Formula 75]

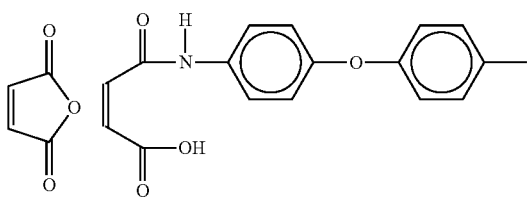

(2) 2-Isocyanatoethyl Methacrylate:

[Chemical Formula 76]

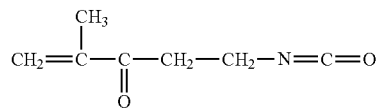

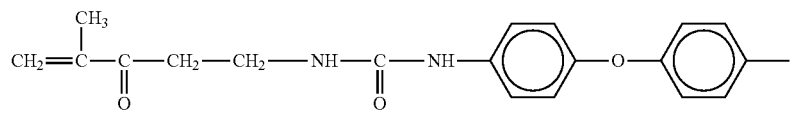

(3) Ethynylphthalic Anhydride:

[Chemical Formula 77]

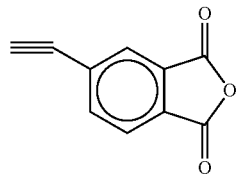

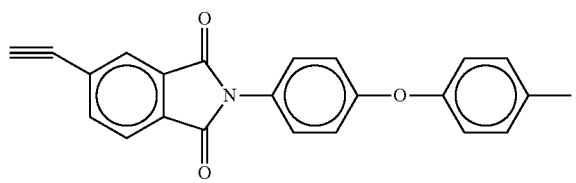

(4) di-t-Butyl Carbonate:

[Chemical Formula 78]

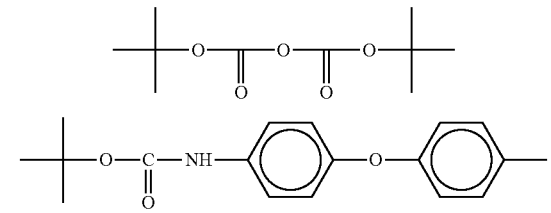

(5) Methacrylic Anhydride:

[Chemical Formula 79]

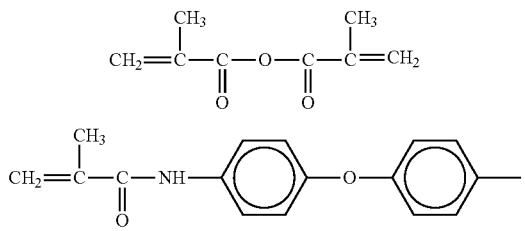

(6) Itaconic Anhydride:

[Chemical Formula 80]

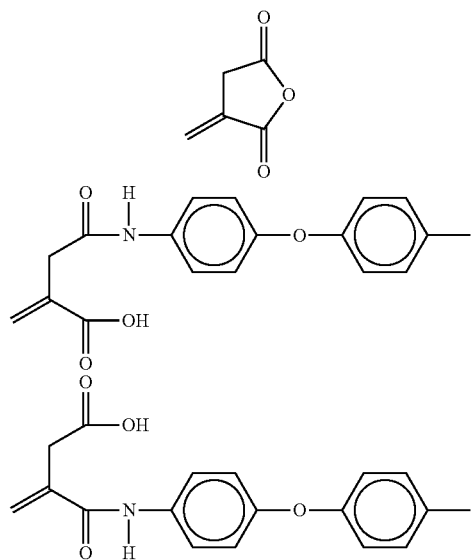

(7) Epoxytetrahydrophthalic Anhydride:

[Chemical Formula 81]

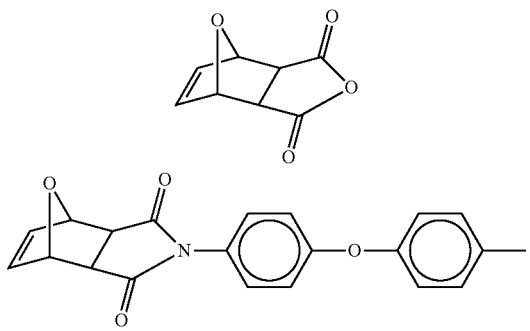

After completion of the amide polycondensation reaction, the by-products of water absorption with the dehydrating condensation agent in the reaction mixture are filtered, if necessary. Next, an appropriate poor solvent (such as water, an aliphatic lower alcohol or a mixture thereof) is poured into a solution containing a polymer component to precipitate the polymer component. If necessary, the processes of redissolution and reprecipitation are repeated to purify the polymer. Vacuum drying is then carried out to isolate the target photosensitive polyimide precursor. In order to increase the purity, a solution of the polymer may be passed through a column packed with an anion- and/or cation-exchange resin that has been swelled with an appropriate organic solvent, to remove the ionic impurities.

The weight-average molecular weight (Mw) of the ester bond-type polyimide precursor is preferably 1,000 or greater and more preferably 3,000 or greater, in terms of polystyrene according to gel permeation chromatography (GPC), from the viewpoint of the heat resistance and mechanical properties of the film obtained after heat treatment. The upper limit for the weight-average molecular weight (Mw) is preferably no greater than 100,000. From the viewpoint of solubility in the developing solution, the upper limit for the weight-average molecular weight (Mw) is more preferably no greater than 50,000. Tetrahydrofuran or N-methyl-2-pyrrolidone is recommended as the developing solvent for gel permeation chromatography. The molecular weight can be determined from a calibration curve drawn using standard monodisperse polystyrene. It is recommended to select the standard monodisperse polystyrene from among the organic solvent-based reference samples STANDARD SM-105 by Showa Denko K.K.

Depending on the molecular structure, the photosensitive polyimide precursor synthesized by this method may have various values for the i-line absorbance of the pre-baked film formed alone. However, the i-line absorbance of the mixture is the arithmetic mean of the i-line absorbances of each of the components. Therefore, combination of two or more photosensitive polyimide precursors in an appropriate proportion allows the pre-baked 10 μm-thick film of the photosensitive polyimide precursor to have an i-line absorbance of 0.1 to 2.0, while maintaining a balance between mechanical properties and thermal properties.

[Other Components]

The photosensitive resin composition of the invention may further contain components other than the photosensitive polyimide precursor.

A photopolymerization initiator will usually be used as the photosensitive agent in the photosensitive resin composition of the invention. Photoradical polymerization initiators are preferred as photopolymerization initiators, and benzophenone derivatives such as benzophenone, methyl o-benzoylbenzoate, 4-benzoyl-4'-methyldiphenyl ketone, dibenzyl ketone and fluorenone, acetophenone derivatives such as 2,2'-diethoxyacetophenone, 2-hydroxy-2-methylpropiophenone and 1-hydroxycyclohexylphenyl ketone, thioxanthone derivatives such as thioxanthone, 2-methylthioxanthone, 2-isopropylthioxanthone and diethylthioxanthone, benzyl derivatives such as benzyl, benzyldimethylketal and benzyl-β-methoxyethylacetal, benzoin derivatives such as benzoin and benzoinmethyl ether, oximes such as 1-phenyl-1,2-butanedione-2-(o-methoxycarbonyl)oxime 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o-ethoxycarbonyl)oxime, 1-phenyl-3-ethoxypropanetrione-2-(o-benzoyl)oxime, N-arylglycines such as N-phenylglycine, peroxides such as benzoyl perchloride, aromatic biimidazoles and titanocenes are preferred, with no limitation to these. Oximes are preferred among these photopolymerization initiators, particularly from the viewpoint of photosensitivity.

The content of such photosensitive agents is 1 to 50 parts by mass, and from the viewpoint of photosensitivity 2 to 15 parts by mass, with respect to 100 parts by mass of the photosensitive polyimide precursor. The photosensitivity is excellent if the content of the photosensitive agent is 1 part by mass or greater, and the thick film curability is excellent if the content is no greater than 50 parts by mass, with respect to 100 parts by mass of the photosensitive polyimide precursor.

The photosensitive resin composition of the invention will typically be used as a liquid photosensitive resin composition, with the aforementioned components and optional components that are used as necessary dissolved in a solvent and prepared as a varnish. Therefore, the solvent may also be mentioned as an additional component. Examples of other additional components include resins other than the photosensitive polyimide precursor, sensitizing agents, monomers with photopolymerizable unsaturated bonds, adhesion aids, thermal polymerization inhibitors, azole compounds and hindered phenol compounds.

Examples for the solvent include polar organic solvents, alcohols and the like.

The solvent used is preferably a polar organic solvent from the viewpoint of solubility for the photosensitive polyimide precursor. Specific examples include N,N-dimethylformamide, N-methyl-2-pyrrolidone, N-ethyl-2-pyrrolidone, N,N-dimethylacetamide, dimethyl sulfoxide, diethyleneglycol dimethyl ether, cyclopentanone, γ-butyrolactone, α-acetyl-γ-butyrolactone, tetramethylurea, 1,3-dimethyl-2-imidazolinone and N-cyclohexyl-2-pyrrolidone. These may be used alone or in combinations of two or more.

The solvent of the invention is preferably a solvent containing an alcohol, from the viewpoint of improving the storage stability of the photosensitive resin composition. Alcohols that may be suitably used are typically alcohols having an alcoholic hydroxyl group in the molecule, and without an olefin-based double bond.

Specific examples include alkyl alcohols such as methyl alcohol, ethyl alcohol, n-propyl alcohol, isopropyl alcohol, n-butyl alcohol, isobutyl alcohol and tert-butyl alcohol;

lactic acid esters such as ethyl lactate;

propyleneglycol monoalkyl ethers such as propyleneglycol-1-methyl ether, propyleneglycol-2-methyl ether, propyleneglycol-1-ethyl ether, propyleneglycol-2-ethyl ether, propyleneglycol-1-(n-propyl)ether and propyleneglycol-2-(n-propyl)ether;

monoalcohols such as ethyleneglycol methyl ether, ethyleneglycol ethyl ether and ethylene glycol-n-propyl ether;

2-hydroxyisobutyric acid esters; and dialcohols such as ethylene glycol and propylene glycol.

Preferred among these are lactic acid esters, propyleneglycol monoalkyl ethers, 2-hydroxyisobutyric acid esters and ethyl alcohol. More particularly preferred are ethyl lactate, propyleneglycol-1-methyl ether and propyleneglycol-1-ethyl ether and propyleneglycol-1-(n-propyl)ether.

The solvent may be used in a range of 30 to 1500 parts by mass and preferably 100 to 1000 parts by mass, for example, with respect to 100 parts by mass of the photosensitive polyimide precursor, depending on the coated film thickness and viscosity desired for the photosensitive resin composition. When the solvent contains an alcohol without an olefin-based double bond, the content of the alcohol without an olefin-based double bond is preferably 5 to 50 mass % and more preferably 10 to 30 mass % of the total solvent. If the content of the alcohol without an olefin-based double bond is 5 mass % or greater, the storage stability of the photosensitive resin composition will be satisfactory. If the content of the alcohol without an olefin-based double bond is 50 mass % or lower, the solubility of the photosensitive polyimide precursor will be satisfactory.

The photosensitive resin composition of the invention may further contain a resin component other than the photosensitive polyimide precursor. Examples of resin components that may be added include polyimides, polyoxazoles, polyoxazole precursors, phenol resins, polyamides, epoxy resins, siloxane resins and acrylic resins. The content of such resin components is in the range of preferably 0.01 to 20 parts by mass with respect to 100 parts by mass of the photosensitive polyimide precursor.

The photosensitive resin composition of the invention may also have a sensitizing agent optionally added in order to increase the photosensitivity. Examples of sensitizing agents include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino)chalcone, p-dimethylaminocinnamylideneindanone, p-dimethylaminobenzylideneindanone, 2-(p-dimethylaminophenylbiphenylene)-benzothiazole, 2-(p-dimethylaminophenylvinylene)benzothiazole, 2-(p-dimethylaminophenylvinylene)isonaphthothiazole, 1,3-bis(4'-dimethylaminobenzal)acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzthiazole, 2-(p-dimethylaminostyryl)naphtho(1,2-d)thiazole, 2-(p-dimethylaminobenzoyl)styrene, diphenylacetamide, benzanilide, N-methylacetoanilide and 3',4'-dimethylacetoanilide. Any of these may be used alone or in combinations of 2 to 5 different types, for example.

When the photosensitive resin composition contains a sensitizing agent to improve the photosensitivity, its content is preferably in the range of 0.1 to 25 parts by mass with respect to 100 parts by mass of the photosensitive polyimide precursor.

The photosensitive resin composition of the invention may have a monomer with a photopolymerizable unsaturated bond optionally added in order to increase the relief pattern resolution. Such a monomer is preferably a (meth) acrylic compound that undergoes radical polymerization reaction with a photopolymerization initiator.

In particular these include, but are not limited to, compounds such as mono- or di(meth)acrylate of ethylene glycol or polyethylene glycol, representative of which are diethyleneglycol dimethacrylate and tetraethyleneglycol dimethacrylate:

mono- or di(meth) acrylates of propylene glycol or polypropylene glycol;

mono-, di- or tri(meth)acrylate of glycerol;

cyclohexane di(meth)acrylate;

diacrylate and dimethacrylate of 1,4-butanediol and di(meth)acrylate of 1,6-hexanediol;

di(meth)acrylate of neopentyl glycol;

mono- or di(meth)acrylate of bisphenol A;

benzene trimethacrylate;

isobornyl (meth)acrylate;

acrylamide and its derivatives;

methacrylamide and its derivatives;

trimethylolpropane tri(meth)acrylate;

di- or tri(meth)acrylate of glycerol;

di-, tri- or tetra(meth)acrylate of pentaerythritol; and ethylene oxide or propylene oxide addition products of these compounds.

When the photosensitive resin composition of the invention contains a monomer having the aforementioned photopolymerizable unsaturated bond in order to increase the relief pattern resolution, its content is preferably 1 to 50 parts by mass with respect to 100 parts by mass of the photosensitive polyimide precursor.

An adhesion aid may also be optionally added to the photosensitive resin composition in order to increase the adhesion of the film formed using the photosensitive resin composition of the invention with the substrate. Examples of adhesion aids include silane coupling agents such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-(triethoxysilyl)propyl]phthalamic acid, benzophenone-3,3'-bis(N-[3-triethoxysilyl]propylamide)-4,4'-dicarboxylic acid, benzene-1,4-bis(N-[3-triethoxysilyl]propylamide)-2,5-dicarboxylic acid, 3-(triethoxysilyl)propylsuccinic anhydride and N-phenylaminopropyltrimethoxysilane, and aluminum-based adhesion aids such as aluminum tris(ethyl acetoacetate), aluminum tris(acetylacetonate) and ethyl acetoacetate aluminum diisopropylate.

Among these adhesion aids it is more preferred to use a silane coupling agent, from the viewpoint of adhesive force. When the photosensitive resin composition contains an adhesion aid, its content is preferably in the range of 0.5 to 25 parts by mass with respect to 100 parts by mass of the photosensitive polyimide precursor.

Particularly when the photosensitive resin composition of the invention is in the state of a solution containing a solvent, a thermal polymerization inhibitors may be optionally added to the photosensitive resin composition in order to improve the stability of the viscosity and photosensitivity during storage. Examples of such thermal polymerization inhibitors that may be used include hydroquinone, N-nitrosodiphenylamine, p-tert-butylcatechol, phenothiazine, N-phenylnaphthylamine, ethylenediaminetetraacetic acid, 1,2-cyclohexanediaminetetraacetic acid, glycol etherdiaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salt and N-nitroso-N-(1-naphthyl)hydroxylamine ammonium salt.

The content of the thermal polymerization inhibitors, when added to the photosensitive resin composition, is preferably in the range of 0.005 to 12 parts by mass with respect to 100 parts by mass of the photosensitive polyimide precursor.

For example, when a photosensitive resin composition of the invention is to be used to form a cured film on a substrate made of copper or a copper alloy, a nitrogen-containing heterocyclic compound such as an azole compound or purine derivative may be optionally added to reduce discoloration on the copper. Examples of azole compounds include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl)triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(α,α-dimethylbenzyl)phenyl]-benzotriazole, 2-(3,5-di-t-butyl-2-hydroxyphenyl)benzotriazole, 2-(3-t-butyl-5-methyl-2-hydroxyphenyl)benzotriazole, 2-(3,5-di-t-amyl-2-hydroxyphenyl)benzotriazole, 2-(2'-hydroxy-5'-t-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole and 1-methyl-1H-tetrazole. Particularly preferred are one or more selected from among tolyltriazole, 5-methyl-1H-benzotriazole and 4-methyl-1H-benzotriazole. These azole compounds may be used alone, or mixtures of two or more of them may be used.

Specific examples of purine derivatives include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl)adenine, guanineoxime, N-(2-hydroxyethyl)adenine, 8-aminoadenine, 6-amino-8-phenyl-9H-purine, 1-ethyladenine, 6-ethylaminopurine, 1-benzyladenine, N-methylguanine, 7-(2-hydroxyethyl)guanine, N-(3-chlorophenyl)guanine, N-(3-ethylphenyl)guanine, 2-azaadenine, 5-azaadenine, 8-azaadenine, 8-azaguanine, 8-azapurine, 8-azaxanthine, 8-azahypoxanthine, and derivatives of the same.

When the photosensitive resin composition contains the aforementioned azole compound or purine derivative, its content is preferably 0.1 to 20 parts by mass with respect to 100 parts by mass of the photosensitive polyimide precursor. It is more preferably 0.5 to 5 parts by mass from the viewpoint of photosensitivity. If the content of the azole compound is at least 0.1 part by mass with respect to 100 parts by mass of the photosensitive polyimide precursor, discoloration of the copper or copper alloy surface will be reduced when the photosensitive resin composition of the invention is formed on a copper or copper alloy. If the azole compound content is no greater than 20 parts by mass, on the other hand, the photosensitivity will be excellent.

In order to inhibit discoloration of the copper surface, a hindered phenol compound may optionally be added instead of the azole compound, or together with the azole compound. Examples of hindered phenol compounds include 2,6-di-t-butyl-4-methylphenol, 2,5-di-t-butyl-hydroquinone, octadecyl-3-(3,5-di-t-butyl-4-hydroxyphenyl) propionate, isooctyl-3-(3,5-di-t-butyl-4-hydroxyphenyl)propionate, 4,4'-methylenebis(2,6-di-t-butylphenol), 4,4'-thio-bis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis[3-(3,5-di-t-butyl-4-hydroxyphenyl)propionate], 2,2-thiodiethylenebis[3-(3,5-di-t-butyl-4-hydroxyphenyl) propionate], N,N'-hexamethylenebis(3,5-di-t-butyl-4-hydroxy-hydrocinnamamide), 2,2'-methylene-bis(4-methyl-6-t-butylphenol), 2,2'-methylene-bis(4-ethyl-6-t-butylphenol), pentaerythrityl-tetrakis[3-(3,5-di-t-butyl-4-hydroxyphenyl)propionate], tris-(3,5-di-t-butyl-4-hydroxybenzyl)-isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6- ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione and 1,3,5-tris(4-t-butyl-5-ethyl-3-hydroxy-2-methylbenzyl)-1,3,5-triazine-2,4,6-(1H,3H,5H)-trione, with no limitation to these. Particularly preferred among these is 1,3,5-tris(4-t-butyl-3-hydroxy-2,6-dimethylbenzyl)-1,3,5-triazine-2,4,6-(1H,3H,5H)-trione.

The content of a hindered phenol compound is preferably 0.1 to 20 parts by mass with respect to 100 parts by mass of the photosensitive polyimide precursor, and from the viewpoint of photosensitivity it is more preferably 0.5 to 10 parts by mass. If the content of the hindered phenol compound is at least 0.1 part by mass with respect to 100 parts by mass of the photosensitive polyimide precursor, discoloration and corrosion of the copper or copper alloy surface will be prevented, when the photosensitive resin composition of the invention has been formed on a copper or copper alloy, for example. If the content of the hindered phenol compound is no greater than 20 parts by mass, on the other hand, the excellent photosensitivity of the photosensitive resin composition will be maintained.

The photosensitive resin composition of the invention may also contain a crosslinking agent. The crosslinking agent may be a crosslinking agent that can crosslink the polyimide produced by heat curing, or that can form a crosslinked network by the crosslinking agent itself when the relief pattern formed using the photosensitive resin composition of the invention is subjected to heat curing. A crosslinking agent can further augment the heat resistance and chemical resistance of the cured film formed from the photosensitive resin composition.

Examples of crosslinking agents include SAIMEL$^R$ 300, 301, 303, 370, 325, 327, 701, 266, 267, 238, 1141, 272, 202, 1156, 1158, 1123, 1170 and 1174; UFR65 and 300; MYCOAT 102 and 105 (all by Mitsui Saitech Co., Ltd.), NIKALAC$^R$ MX-270, -280 and -290; NIKALAC MS-11; NIKALAC MW-30, -100, -300, -390 and -750 (all by Sanwa Chemical Co., Ltd.), DML-OCHP, DML-MBPC, DML-BPC, DML-PEP, DML-34X, DML-PSBP, DML-PTBP, DML-PCHP, DML-POP, DML-PFP, DML-MBOC, Bis-CMP-F, DML-BisOC-Z, DML-BisOCHP-Z, DML-BisOC-P, DMOM-PTBT, TMOM-BP, TMOM-BPA and TML-BPAF-MF (all by Honshu Chemical Industry Co., Ltd.), benzenedimethanol, bis(hydroxymethyl)cresol, bis(hydroxymethyl)dimethoxybenzene, bis(hydroxymethyl)diphenyl ether, bis(hydroxymethyl)benzophenone, hydroxymethylhydroxymethylphenyl benzoate, bis(hydroxymethyl) biphenyl, dimethylbis(hydroxymethyl)biphenyl, bis(methoxymethyl)benzene, bis(methoxymethyl)cresol, bis(methoxymethyl)dimethoxybenzene, bis(methoxymethyl) diphenyl ether, bis(methoxymethyl)benzophenone, methoxymethylmethoxyylmethoxymethylphenyl benzoate, bis(methoxymethyl)biphenyl and dimethylbis(methoxymethyl)biphenyl, which are compounds containing methylol and/or alkoxymethyl groups.

Others include oxirane compounds, namely phenol-novolac-type epoxy resin, cresol-novolac-type epoxy resin, bisphenol-type epoxy resin, trisphenol-type epoxy resin, tetraphenol-type epoxy resin, phenol-xylylene-type epoxy resin, naphthol-xylylene-type epoxy resin, phenol-naphthol-type epoxy resin, phenol-dicyclopentadiene-type epoxy resin, alicyclic epoxy resin, aliphatic epoxy resin, diethyleneglycol diglycidyl ether, sorbitol polyglycidyl ether, propyleneglycol diglycidyl ether, trimethylolpropane polyglycidyl ether, 1,1,2,2-tetra(p-hydroxyphenyl)ethane tetraglycidyl ether, glycerol triglycidyl ether, ortho-secondary butylphenyl glycidyl ether, 1,6-bis(2,3-epoxypropoxy) naphthalene, diglycerol polyglycidyl ether, polyethyleneglycol glycidyl ether, YDB-340, YDB-412, YDF-2001, YDF-2004 (all trade names of Nippon Steel Chemical Co., Ltd.), NC-3000-H, EPPN-501H, EOCN-1020, NC-7000 L, EPPN-201 L, XD-1000 and EOCN-4600 (all trade names of Nippon Kayaku Co., Ltd.), EPIKOTE$^R$ 1001, EPIKOTE 1007, EPIKOTE 1009, EPIKOTE 5050, EPIKOTE 5051, EPIKOTE 10315, EPIKOTE 180S65, EPIKOTE 157H70 and YX-315-75 (all trade names of Japan Epoxy Resins Co., Ltd.), EHPE3150, PLACCEL G402, PUE101 and PUE105 (all trade names of Daicel Chemical Industries, Ltd.). EPICLON$^R$ 830, 850, 1050, N-680, N-690, N-695, N-770, HP-7200, HP-820 and EXA-4850-1000 (all trade names of DIC Co., Ltd). DENACOLR EX-201, EX-251, EX-203, EX-313, EX-314, EX-321, EX-411, EX-511. EX-512, EX-612, EX-614, EX-614B, EX-711, EX-731, EX-810, EX-911 and EM-150 (all trade names of Nagase ChemteX Corp.), and EPOLITE$^R$ 70P and EPOLITE 100MF (both trade names of Kyoeisha Chemical Co., Ltd.).

Still others include isocyanate group-containing compounds, namely 4,4'-diphenylmethane diisocyanate, tolylene diisocyanate, 1,3-phenylenebismethylene diisocyanate, dicyclohexylmethane-4,4'-diisocyanate, isophorone diisocyanate, hexamethylene diisocyanate, TAKENATE$^R$ 500 and 600, COSMONATE$^R$ NBDI and ND (all trade names of Mitsui Chemicals, Inc.), and DURANATE$^R$ 17B-60PX, TPA-B80E, MF-B60X, MF-K60X and E402-B80T (all trade names of Asahi Kasei Chemicals Corp.).

Still others include bismaleimide compounds, namely 4,4'-diphenylmethanebismaleimide, phenylmethanemaleimide, m-phenylenebismaleimide, bisphenol A diphenyl ether bismaleimide, 3,3'-dimethyl-5,5'-diethyl-4,4'-diphenylmethanebismaleimide, 4-methyl-1,3-phenylenebismaleimide, 1,6'-bismaleimide-(2,2,4-trimethyl)hexane, 4,4'-diphenyl etherbismaleimide, 4,4'-diphenylsulfone bismaleimide, 1,3-bis(3-maleimidephenoxy)benzene, 1,3-bis(4-maleimidephenoxy)benzene, BMI-1000, BMI-1100, BMI-2000, BMI-2300, BMI-3000, BMI-4000, BMI-5100, BMI-7000, BMI-TMH, BMI-6000, BM1-8000 (all trade names of Daiwa Fine Chemicals Co., Ltd.), with no limitation to these so long as they are compounds that undergo thermal crosslinking as mentioned above.

When a crosslinking agent is used, its content is preferably 0.5 to 20 parts by mass and more preferably 2 to 10 parts by mass, with respect to 100 parts by mass of the photosensitive polyimide precursor. If the content is 0.5 part by mass or greater, satisfactory heat resistance and chemical resistance will be exhibited. If the content is no greater than 20 parts by mass, on the other hand, the storage stability will be excellent.

The viscosity of the photosensitive resin composition of the invention is 80 poise or lower, preferably 40 poise or lower and more preferably 20 poise or lower. The viscosity referred to here is that measured at 25° C. using an E-type viscometer (Model RE80 by Toki Sangyo Co., Ltd.). If the viscosity is 80 poise or lower, preferably 40 poise or lower and more preferably 20 poise or lower, the in-plane uniformity of the film thickness after coating will be improved. By introducing a reactive substituent that reacts by heat or light onto the ends of the main chain, and lowering the viscosity of the composition, the flow property of the resin during spin coating is improved due to the lowered viscosity, and the state of interaction between the polymers during pre-baking changes, whereby presumably, the in-plane uniformity of the coated film thickness increases.

The lower limit for the viscosity of the photosensitive resin composition is not particularly restricted, but it may be 1 poise or greater or even 3 poise or greater. It may also be 5 poise or greater, or 8 poise or greater.

<Method of Forming Cured Relief Pattern>

The invention also provides a method of forming a cured relief pattern.

The method of forming a cured relief pattern according to the invention includes, for example, the following steps in order:

(1) a coating step in which the photosensitive resin composition according to the invention is coated onto a substrate to form a photosensitive resin layer on the substrate, (2) an exposure step in which the photosensitive resin layer is exposed to light, (3) a developing step in which the exposed photosensitive resin layer is developed to form a relief pattern, and (4) a heating step in which the relief pattern is heat treated to form a cured relief pattern.

Typical modes for each of the steps will now be described.

(1) Coating Step

In this step, a photosensitive resin composition of the invention is coated onto a substrate and then dried if necessary, to form a photosensitive resin layer.

Examples of substrates that may be used include:
metal substrates made of silicon, aluminum, copper or copper alloy;
resin substrates such as epoxy, polyimide or polybenzooxazole;
substrates having metal circuits formed on such resin substrates; and
substrates comprising multiple metals, or metals and resins, laminated in multilayers.

The coating method used may be a method conventionally used for coating of photosensitive resin compositions. For example, a method of coating with a spin coater, bar coater, blade coater, curtain coater, screen printer or the like, or a method of spray coating with a spray coater, may be used.

The photosensitive resin composition film may be dried if necessary. The drying method used may be air-drying, heat drying with an oven or hot plate, or vacuum drying. Drying of the coating film is preferably carried out under conditions in which imidization of the photosensitive polyimide precursor does not take place in the photosensitive resin composition. Specifically, for air-drying or heat drying, the drying may be carried out under conditions of 20° C. to 140° C. for 1 minute to 1 hour. A photosensitive resin layer can be formed on a substrate in this manner.

(2) Exposure Step

In this step, the photosensitive resin layer formed as described above is exposed to light. Examples of exposure devices that may be used include exposure devices such as a contact aligner, mirror projector or stepper. The exposure may be carried out either directly or through a photomask or reticle having a pattern. The light rays used for exposure may be from an ultraviolet ray light source, for example.

After exposure, if necessary, it may be subjected to post-exposure baking (PEB) and/or pre-development baking with a prescribed combination of temperature and time, for the purpose of improving the photosensitivity. The range of the baking conditions is preferably a temperature of 40 to 120° C. and a time of 10 seconds to 240 seconds. However, there is no limitation to this range so long as the properties of the photosensitive resin composition of the invention are not inhibited.

(3) Developing Step

In this step, the unexposed sections of the exposed photosensitive resin layer are developed and removed. The developing method selected for development of the exposed (irradiated) photosensitive resin layer may be a commonly known photoresist developing method. For example, it may be a rotating spray method, a paddle method, or an immersion method with ultrasonic treatment. Following development, post-development baking may be carried out with the desired combination of temperature and time, as necessary for the purpose of adjusting the relief pattern shape. The temperature for the post-development baking may be 80 to 130° C., for example. The post-development baking time may be 0.5 to 10 minutes, for example.

The developing solution used for developing is preferably a good solvent for the photosensitive resin composition, or a combination of a good solvent and a poor solvent. Preferred good solvents are N-methyl-2-pyrrolidone, N-cyclohexyl-2-pyrrolidone, N,N-dimethylacetamide, cyclopentanone, cyclohexanone, γ-butyrolactone, a-acetyl-γ-butyrolactone and the like. Preferred poor solvents are toluene, xylene, methanol, ethanol, isopropyl alcohol, ethyl lactate, propyleneglycol methyl ether acetate, water and the like. When a good solvent and a poor solvent are used in admixture, the proportion of the poor solvent with respect to the good solvent is preferably adjusted according to the solubility of the polymer in the photosensitive resin composition. The solvents may be used in combinations of two or more, such as several.

(4) Heating Step

In this step, the relief pattern obtained by development is heated to rarify the photosensitive component, while imidizing the photosensitive polyimide precursor to convert it to a cured relief pattern comprising a polyimide.

The heat curing method may be selected from among various methods including those using a hot plate, using an oven, or using a temperature program-settable heating oven.

The heating may be carried out under conditions of 200° C. to 400° C. for 30 minutes to 5 hours, for example. The atmosphere gas used during heat curing may be air, or an inert gas such as nitrogen or argon may be used.

A cured relief pattern can be produced in the manner described above.

By using a photosensitive resin composition of the invention, the flow property of the resin during spin coating is improved, and the state of interaction between the polymers during pre-baking changes. This allows a photosensitive resin layer with improved in-plane uniformity of coated film thickness to be formed. A cured relief pattern can therefore be formed with high resolution.

In addition to application in semiconductor devices as described above, the photosensitive resin composition of the invention is also useful for use in interlayer dielectric films for multilayer circuits, cover coats for flexible copper-clad sheets, solder resist films and liquid crystal oriented films.

EXAMPLES

Examples and Comparative Examples for First Embodiment

The present invention will now be explained in more specific detail through the following examples, with the understanding that the invention is in no way limited thereby. In the examples, comparative examples and production examples, the physical properties of the negative-type photosensitive resin compositions were measured and evaluated by the following methods.

(1) Weight-Average Molecular Weight (Mw)

The weight-average molecular weight (Mw) of each polyimide precursor (A) was measured by gel permeation chromatography (in terms of standard polystyrene). Three columns, "Shodex KD-805" "Shodex KD-804" and "Shodex KD-803", trade names of Showa Denko K.K., were used for measurement in series in that order. The standard monodisperse polystyrene selected was "Shodex STANDARD SM-105", trade name of Showa Denko K.K. The developing solvent used was N-methyl-2-pyrrolidone containing 0.01 mol/L lithium bromide, with measurement at a flow rate of 1.0 mL/min. Measurement was conducted with "RI-2031 Plus", trade name of JASCO Corp., as the differential refractometer, "PU-2080 Plus", trade name of JASCO Corp., as the pump and "CO-2065 Plus", trade name of JASCO Corp., as the column oven.

(2) Chemical Resistance Test

The negative-type photosensitive resin composition of the invention was spin coated onto a 6-inch silicon wafer (product of Fujimi Denshi Kogyo, 625±25 μm thickness), and dried to form a coating film with a thickness of about 11 μm as a photosensitive resin layer. Using a test patterned reticle, the coating film was irradiated with an energy of 500 mJ/cm$^2$ by a ghi stepper (Prisma-ghi, product of Ultratech Co.), for exposure. Next, the coating film formed on the wafer was subjected to spray development with a developing machine (Model D-SPIN636, Dainippon Screen Mfg. Co., Ltd., Japan), using cyclopentanone. It was then rinsed with propyleneglycol methyl ether acetate to develop and remove the unexposed sections, and obtain a relief pattern of a polyimide precursor. The relief pattern-formed wafer was cured at 200° C. for 2 hours under a nitrogen atmosphere using a temperature-elevating program-type curing furnace (Model VF-2000, product of Koyo Lindbergh Co., Japan), to obtain a polyimide cured relief pattern with a thickness of approximately 9 μm.

The obtained polyimide pattern was immersed in a solution comprising 1 wt % potassium hydroxide, 39 wt % 3-methoxy-3-methyl-1-butanol and 60 wt % dimethyl sulfoxide, at 100° C. for 1 hour. After rinsing and air-drying, the polyimide coating film was evaluated by measuring the film thickness and observing it under an optical microscope.

For the evaluation, "VG" was assigned if the coating film after immersion had a film thickness fluctuation of within ±1% for the coating film with respect to before immersion and exhibited no cracking, "G" was assigned if the film thickness fluctuation of the coating film was within ±3% and no cracking was exhibited, "F" was assigned if the film thickness fluctuation of the coating film was within ±5% and no cracking was exhibited, and "P" was assigned if the film thickness fluctuation exceeded ±5% or cracking was exhibited.

(3) Copper Void Generation Test

On a 6-inch silicon wafer (product of Fujimi Denshi Kogyo, thickness: 625±25 μm), a sputtering apparatus (Model L-440S-FHL, product of Canon Anelva Corp.) was used for sputtering of Ti to a 200 nm thickness and copper to a 400 nm thickness, in that order. Next, a photosensitive polyamic acid ester composition prepared by the following method was spin coated onto the wafer using a coater developer (D-Spin Model 60A, product of Sokudo), and dried to form a 10 μm-thick coating film. The coating film was irradiated with an energy of 300 mJ/cm$^2$ by a parallel ray mask aligner (Model PLA-501FA, product of Canon, Inc.), using a test patterned mask. The coating film was then spray developed with a coater developer (D-Spin Model 60A, product of Sokudo), using cyclopentanone as the developing solution. It was then rinsed with propyleneglycol methyl ether acetate to obtain a relief pattern on copper.

The wafer on which the relief pattern had been formed on copper was heat treated for 2 hours at the temperatures listed for each of the Examples, under a nitrogen atmosphere, using a temperature-elevating program-type curing furnace (Model VF-2000, product of Koyo Lindbergh). An approximately 6 to 7 μm-thick cured relief pattern made of a polyimide resin was thus obtained on copper.

The area of copper void generation in the obtained cured relief pattern was confirmed by the following high-temperature storage test.

First, the wafer on which the cured relief pattern had been formed on copper was heated at 150° C. for 168 hours in air at a humidity of 5%, using a temperature-elevating program-type curing furnace (Model VF-2000, product of Koyo Lindbergh). Next, a plasma surface treatment apparatus (Model EXAM, product of Shinko Seiki Co., Ltd.) was used to remove the polyimide resin layer on the copper by plasma etching. The plasma etching conditions were as follows.

Output: 133 W
Gas type/flow rate: $O_2$: 40 ml/min+$CF_4$: 1 ml/min
Gas pressure: 50 Pa
Mode: Hard mode
Etching time: 1800 seconds The copper surface from which the polyimide resin layer had been entirely removed was observed from directly above using an FE-SEM (Model S-4800, product of Hitachi High-Technologies Corp.) at 1000× magnification. Also, an area of 126 μm×87 μm was photographed at a resolution of 1280×960. The void area ratio of the surface of the copper layer in the photographed image was calculated using image analysis software (A-Zou Kun, product of Asahi Kasei Corp.). Specifically, the void portions and the non-void portions were separated based on contrast in the SEM image. The number of pixels of the void portions was divided by the number of pixels of the entire photograph, to calculate the area ratio of voids as seen from above the copper surface.

"VG" was assigned when the area ratio of generated copper voids was 0 to 3%, "G+" was assigned when it was 3 to 4%, "G" was assigned when it was 4 to 5%, "F" was assigned when it was 5% to 10%, and "P" was assigned when it was larger than 10%.

<Production Example 1> (Synthesis of Polymer (A)-1)

After placing 147.1 g of 3,3',4,4'-biphenyltetracarboxylic dianhydride (BPDA) in a 2 L separable flask, 131.2 g of 2-hydroxyethyl methacrylate (HEMA) and 400 mL of γ-butyrolactone were added, the mixture was stirred at room temperature, and 81.5 g of pyridine was added while stirring to obtain a reaction mixture. When heat release from the reaction was complete, it was allowed to cool to room temperature and allowed to stand for 16 hours.

Next, a solution of 206.3 g of dicyclohexylcarbodiimide (DCC) dissolved in 180 mL of γ-butyrolactone was added to the reaction mixture over a period of 40 minutes while stirring and cooling on ice. A suspension of 40.0 g of 4,4'-diaminodiphenyl ether (DADPE) in 350 mL of γ-butyrolactone was then added over a period of 60 minutes while stirring. The mixture was stirred at room temperature for 2 hours, and then 30 mL of ethyl alcohol was added, stirring was continued for 1 hour, and 400 mL of γ-butyrolactone was then added. The precipitate produced in the reaction mixture was removed off by filtration to obtain a reaction solution.

The obtained reaction solution was added to 3 L of ethyl alcohol to form a precipitate comprising a crude polymer. The produced crude polymer was filtered and dissolved in 1.5 L of γ-butyrolactone to obtain a crude polymer solution. The obtained crude polymer solution was added dropwise into 28 L of water to precipitate the polymer, and after filtering out the obtained precipitate, it was vacuum dried to obtain a powdered polymer (polymer (A)-1).

When the molecular weight of the polymer (A)-1 was measured by gel permeation chromatography (in terms of standard polystyrene), the weight-average molecular weight (Mw) was found to be 2,000.

<Production Example 2> (Synthesis of Polymer (A)-2)

Synthesis was performed in the same manner as Production Example 1, except that the amount of 4,4'-diaminodiphenyl ether (DADPE) added in Production Example 1 was changed from 40.0 g to 45.1 g. The weight-average molecular weight (Mw) of the obtained powdered polymer (polymer (A)-2) was 3,000.

<Production Example 3> (Synthesis of Polymer (A)-3)

Synthesis was performed in the same manner as Production Example 1, except that the amount of 4,4'-diaminodiphenyl ether (DADPE) added in Production Example 1 was changed from 40.0 g to 57.1 g.

The weight-average molecular weight (Mw) of the obtained powdered polymer (polymer (A)-3) was 11,000.

<Production Example 4> (Synthesis of Polymer (A)-4)

Synthesis was performed in the same manner as Production Example 1, except that the amount of 4,4'-diaminodiphenyl ether (DADPE) added in Production Example 1 was changed from 40.0 g to 60.1 g.

The weight-average molecular weight (Mw) of the obtained powdered polymer (polymer (A)-4) was 12,000.

<Production Example 5> (Synthesis of Polymer (A)-5)

Synthesis was performed in the same manner as Production Example 1, except that the amount of 4,4'-diaminodiphenyl ether (DADPE) added in Production Example 1 was changed from 40.0 g to 67.1 g.

The weight-average molecular weight (Mw) of the obtained powdered polymer (polymer (A)-5) was 15.000.

<Production Example 6> (Synthesis of Polymer (A)-6)

Synthesis was performed in the same manner as Production Example 1, except that the amount of 4,4'-diaminodiphenyl ether (DADPE) added in Production Example 1 was changed from 40.0 g to 70.1 g.

The weight-average molecular weight (Mw) of the obtained powdered polymer (polymer (A)-6) was 16,000.

<Production Example 7> (Synthesis of Polymer (A)-7)

Synthesis was performed in the same manner as Production Example 1, except that the amount of 4,4'-diaminodiphenyl ether (DADPE) added in Production Example 1 was changed from 40.0 g to 75.1 g.

The weight-average molecular weight (Mw) of the obtained powdered polymer (polymer (A)-7) was 17,000.

<Production Example 8> (Synthesis of Polymer (A)-8)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA).

The weight-average molecular weight (Mw) of the obtained powdered polymer (polymer (A)-8) was 2,000.

<Production Example 9> (Synthesis of Polymer (A)-9)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the amount of 4,4'-diaminodiphenyl ether (DADPE) added was changed from 40.0 g to 45.1 g.

The weight-average molecular weight (Mw) of the obtained powdered polymer (polymer (A)-9) was 3,000.

<Production Example 10> (Synthesis of Polymer (A)-10)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the amount of 4,4'-diaminodiphenyl ether (DADPE) added was changed from 40.0 g to 57.1 g.

The weight-average molecular weight (Mw) of the obtained powdered polymer (polymer (A)-10) was 11,000.

<Production Example 11> (Synthesis of Polymer (A)-11)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the amount of 4,4'-diaminodiphenyl ether (DADPE) added was changed from 40.0 g to 60.1 g.

The weight-average molecular weight (Mw) of the obtained powdered polymer (polymer (A)-11) was 12,000.

<Production Example 12> (Synthesis of Polymer (A)-12)

Synthesis was performed in the same manner as Production Example 1, except that the 147.1 g of 3.3',4,4'-biphenyltetracarboxylic dianhydride (BPDA) in Production Example 1 was changed to 155.1 g of 4,4'-oxydiphthalic acid dianhydride (ODPA), and the amount of 4,4'-diaminodiphenyl ether (DADPE) added was changed from 40.0 g to 67.1 g.

The weight-average molecular weight (Mw) of the obtained powdered polymer (polymer (A)-12) was 15,000.

<Production Example 13> (Synthesis of Polymer (A)-13)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the amount of 4,4'-diaminodiphenyl ether (DADPE) added was changed from 40.0 g to 70.1 g.

The weight-average molecular weight (Mw) of the obtained powdered polymer (polymer (A)-13) was 16,000.

<Production Example 14> (Synthesis of Polymer (A)-14)

Synthesis was performed in the same manner as Production Example 1, except that the 147.1 g of 3.3',4,4'-biphenyltetracarboxylic dianhydride (BPDA) in Production Example 1 was changed to 155.1 g of 4,4'-oxydiphthalic acid dianhydride (ODPA), and the amount of 4,4'-diaminodiphenyl ether (DADPE) added was changed from 40.0 g to 75.1 g.

The weight-average molecular weight (Mw) of the obtained powdered polymer (polymer (A)-14) was 17,000.

<Production Example 15> (Synthesis of Polymer (A)-15)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 21.6 g of 1,4-phenylenediamine (PPD). The weight-average molecular weight (Mw) of the obtained powdered polymer (polymer (A)-15) was 2,000.

<Production Example 16> (Synthesis of Polymer (A)-16)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 24.3 g of 1,4-phenylenediamine (PPD). The weight-average molecular weight (Mw) of the obtained powdered polymer (polymer (A)-16) was 3,000.

<Production Example 17> (Synthesis of Polymer (A)-17)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 30.8 g of 1,4-phenylenediamine (PPD).

The weight-average molecular weight (Mw) of the obtained powdered polymer (polymer (A)-17) was 11,000.

<Production Example 18> (Synthesis of Polymer (A)-18)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 32.4 g of 1,4-phenylenediamine (PPD). The weight-average molecular weight (Mw) of the obtained powdered polymer (polymer (A)-18) was 12,000.

<Production Example 19> (Synthesis of Polymer (A)-19)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 36.2 g of 1,4-phenylenediamine (PPD). The weight-average molecular weight (Mw) of the obtained powdered polymer (polymer (A)-19) was 15,000.

<Production Example 20> (Synthesis of Polymer (A)-20)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 37.8 g of 1,4-phenylenediamine (PPD).

The weight-average molecular weight (Mw) of the obtained powdered polymer (polymer (A)-20) was 16,000.

<Production Example 21> (Synthesis of Polymer (A)-21)

Synthesis was performed in the same manner as Production Example 1, except that the 147.1 g of 3.3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 40.6 g of 1,4-phenylenediamine (PPD).

The weight-average molecular weight (Mw) of the obtained powdered polymer (polymer (A)-21) was 17,000.

<Production Example 22> (Synthesis of Polymer (A)-22)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 42.5 g of 1,4-2,2'-dimethylbenzidine (m-TB).

The weight-average molecular weight (Mw) of the obtained powdered polymer (polymer (A)-22) was 2,000.

<Production Example 23> (Synthesis of Polymer (A)-23)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 47.8 g of 1,4-2,2'-dimethylbenzidine (m-TB).

The weight-average molecular weight (Mw) of the obtained powdered polymer (polymer (A)-23) was 3,000.

<Production Example 24> (Synthesis of Polymer (A)-24)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 60.5 g of 1,4-2,2'-dimethylbenzidine (m-TB). The weight-average molecular weight (Mw) of the obtained powdered polymer (polymer (A)-24) was 11,000.

<Production Example 25> (Synthesis of Polymer (A)-25)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 63.7 g of 1,4-2,2'-dimethylbenzidine (m-TB). The weight-average molecular weight (Mw) of the obtained powdered polymer (polymer (A)-25) was 12,000.

<Production Example 26> (Synthesis of Polymer (A)-26)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 71.1 g of 1,4-2,2'-dimethylbenzidine (m-TB). The weight-average molecular weight (Mw) of the obtained powdered polymer (polymer (A)-26) was 15,000.

<Production Example 27> (Synthesis of Polymer (A)-27)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 74.3 g of 1,4-2,2'-dimethylbenzidine (m-TB). The weight-average molecular weight (Mw) of the obtained powdered polymer (polymer (A)-27) was 16,000.

<Production Example 28> (Synthesis of Polymer (A)-28)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 79.6 g of 1,4-2,2'-dimethylbenzidine (m-TB). The weight-average molecular weight (Mw) of the obtained powdered polymer (polymer (A)-28) was 17,000.

<Production Example 29> (Synthesis of Polymer (A)-29)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 64.0 g of 2,2'-bis(trifluoromethyl)benzidine (TFMB).

The weight-average molecular weight (Mw) of the obtained powdered polymer (polymer (A)-29) was 2,000.

<Production Example 30> (Synthesis of Polymer (A)-30)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 72.1 g of 2,2'-bis(trifluoromethyl)benzidine (TFMB).

The weight-average molecular weight (Mw) of the obtained powdered polymer (polymer (A)-30) was 3,000.

<Production Example 31> (Synthesis of Polymer (A)-31)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 91.3 g of 2,2'-bis(trifluoromethyl)benzidine (TFMB).

The weight-average molecular weight (Mw) of the obtained powdered polymer (polymer (A)-31) was 11,000.

<Production Example 32> (Synthesis of Polymer (A)-32)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 96.1 g of 2,2'-bis(trifluoromethyl)benzidine (TFMB).

The weight-average molecular weight (Mw) of the obtained powdered polymer (polymer (A)-32) was 12,000.

<Production Example 33> (Synthesis of Polymer (A)-33)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 107.3 g of 2,2'-bis(trifluoromethyl)benzidine (TFMB).

The weight-average molecular weight (Mw) of the obtained powdered polymer (polymer (A)-33) was 15,000.

<Production Example 34> (Synthesis of Polymer (A)-34)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 112.1 g of 2,2'-bis(trifluoromethyl)benzidine (TFMB).

The weight-average molecular weight (Mw) of the obtained powdered polymer (polymer (A)-34) was 16,000.

<Production Example 35> (Synthesis of Polymer (A)-35)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 120.1 g of 2,2'-bis(trifluoromethyl)benzidine (TFMB).

The weight-average molecular weight (Mw) of the obtained powdered polymer (polymer (A)-35) was 17,000.

<Production Example 36> (Synthesis of Polymer (A)-36)

Synthesis was performed in the same manner as Production Example 1, except that the 147.1 g of 3,3',4,4'-biphenyltetracarboxylic dianhydride (BPDA) in Production Example 1 was changed to 134.0 g of 2,3,6,7-naphthalenetetracarboxylic dianhydride (NTCDA), and the 40.0 g of 4,4'-diaminodiphenyl ether (DADPE) was changed to 59.5 g of 4,4'-thiodianiline (TDA).

The weight-average molecular weight (Mw) of the obtained powdered polymer (polymer (A)-36) was 10,000.

<Production Example 37> (Synthesis of Polymer (A2)-1)

Synthesis was performed in the same manner as Production Example 1, except that the 40.0 g of 4,4'-diaminodiphenyl ether (DADPE) in Production Example 1 was changed to 24.3 g of 1,4-phenylenediamine (PPD).

The weight-average molecular weight (Mw) of the obtained powdered polymer (polymer (A2)-1) was 3.000.

<Production Example 38> (Synthesis of Polymer (A2)-2)

Synthesis was performed in the same manner as Production Example 1, except that the 40.0 g of 4,4'-diaminodiphenyl ether (DADPE) in Production Example 1 was changed to 30.8 g of 1,4-phenylenediamine (PPD).

The weight-average molecular weight (Mw) of the obtained powdered polymer (polymer (A2)-2) was 11,000.

<Production Example 39> (Synthesis of Polymer (A2)-3)

Synthesis was performed in the same manner as Production Example 1, except that the 40.0 g of 4,4'-diaminodiphenyl ether (DADPE) in Production Example 1 was changed to 32.4 g of 1,4-phenylenediamine (PPD).

The weight-average molecular weight (Mw) of the obtained powdered polymer (polymer (A2)-3) was 12,000.

<Production Example 40> (Synthesis of Polymer (A2)-4)

Synthesis was performed in the same manner as Production Example 1, except that the 40.0 g of 4,4'-diaminodiphenyl ether (DADPE) in Production Example 1 was changed to 36.2 g of 1,4-phenylenediamine (PPD).

The weight-average molecular weight (Mw) of the obtained powdered polymer (polymer (A2)-4) was 15,000.

<Production Example 41> (Synthesis of Polymer (A2)-5)

Synthesis was performed in the same manner as Production Example 1, except that the 40.0 g of 4,4'-diaminodiphenyl ether (DADPE) in Production Example 1 was changed to 37.8 g of 1,4-phenylenediamine (PPD).

The weight-average molecular weight (Mw) of the obtained powdered polymer (polymer (A2)-5) was 16,000.

<Production Example 42> (Synthesis of Polymer (A2)-6)

Synthesis was performed in the same manner as Production Example 1, except that the 40.0 g of 4,4'-diaminodiphenyl ether (DADPE) in Production Example 1 was changed to 47.8 g of 2,2'-dimethylbenzidine (m-TB).

The weight-average molecular weight (Mw) of the obtained powdered polymer (polymer (A2)-6) was 3,000.

<Production Example 43> (Synthesis of Polymer (A2)-7)

Synthesis was performed in the same manner as Production Example 1, except that the 40.0 g of 4,4'-diaminodiphenyl ether (DADPE) in Production Example 1 was changed to 60.5 g of 2,2'-dimethylbenzidine (m-TB).

The weight-average molecular weight (Mw) of the obtained powdered polymer (polymer (A2)-7) was 11,000.

<Production Example 44> (Synthesis of Polymer (A2)-8)

Synthesis was performed in the same manner as Production Example 1, except that the 40.0 g of 4,4'-diaminodiphenyl ether (DADPE) in Production Example 1 was changed to 63.7 g of 2,2'-dimethylbenzidine (m-TB).

The weight-average molecular weight (Mw) of the obtained powdered polymer (polymer (A2)-8) was 12,000.

<Production Example 45> (Synthesis of Polymer (A2)-9)

Synthesis was performed in the same manner as Production Example 1, except that the 40.0 g of 4,4'-diaminodiphenyl ether (DADPE) in Production Example 1 was changed to 71.1 g of 2,2'-dimethylbenzidine (m-TB).

The weight-average molecular weight (Mw) of the obtained powdered polymer (polymer (A2)-9) was 15,000.

<Production Example 46> (Synthesis of Polymer (A2)-10)

Synthesis was performed in the same manner as Production Example 1, except that the 40.0 g of 4,4'-diaminodiphenyl ether (DADPE) in Production Example 1 was changed to 74.3 g of 2,2'-dimethylbenzidine (m-TB).

The weight-average molecular weight (Mw) of the obtained powdered polymer (polymer (A2)-10) was 16,000.

<Production Example 47> (Synthesis of Polymer (A2)-11)

Synthesis was performed in the same manner as Production Example 1, except that the 40.0 g of 4,4'-diaminodiphenyl ether (DADPE) in Production Example 1 was changed to 72.1 g of 2,2'-bis(trifluoromethyl)benzidine (TFMB).

The weight-average molecular weight (Mw) of the obtained powdered polymer (polymer (A2)-11) was 3,000.

<Production Example 48> (Synthesis of Polymer (A2)-12)

Synthesis was performed in the same manner as Production Example 1, except that the 40.0 g of 4,4'-diaminodiphenyl ether (DADPE) in Production Example 1 was changed to 91.3 g of 2,2'-bis(trifluoromethyl)benzidine (TFMB).

The weight-average molecular weight (Mw) of the obtained powdered polymer (polymer (A2)-12) was 11,000.

<Production Example 49> (Synthesis of Polymer (A2)-13)

Synthesis was performed in the same manner as Production Example 1, except that the 40.0 g of 4,4'-diaminodiphenyl ether (DADPE) in Production Example 1 was changed to 96.1 g of 2,2'-bis(trifluoromethyl)benzidine (TFMB).

The weight-average molecular weight (Mw) of the obtained powdered polymer (polymer (A2)-13) was 12,000.

<Production Example 50> (Synthesis of Polymer (A2)-14)

Synthesis was performed in the same manner as Production Example 1, except that the 40.0 g of 4,4'-diaminodiphenyl ether (DADPE) in Production Example 1 was changed to 107.3 g of 2,2'-bis(trifluoromethyl)benzidine (TFMB).

The weight-average molecular weight (Mw) of the obtained powdered polymer (polymer (A2)-14) was 15,000.

<Production Example 51> (Synthesis of Polymer (A2)-15)

Synthesis was performed in the same manner as Production Example 1, except that the 40.0 g of 4,4'-diaminodiphenyl ether (DADPE) in Production Example 1 was changed to 112.1 g of 2,2'-bis(trifluoromethyl)benzidine (TFMB).

The weight-average molecular weight (Mw) of the obtained powdered polymer (polymer (A2)-15) was 16,000.

<Production Example 52> (Synthesis of Polymer (A2)-16)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 48.1 g. The weight-average molecular weight (Mw) of the obtained powdered polymer (polymer (A2)-16) was 5,000.

<Production Example 53> (Synthesis of Polymer (A2)-17)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 52.1 g.

The weight-average molecular weight (Mw) of the obtained powdered polymer (polymer (A2)-17) was 9,500.

<Production Example 54> (Synthesis of Polymer (A2)-18)

Synthesis was performed in the same manner as Production Example 1, except that the 147.1 g of 3,3',4,4'-biphenyltetracarboxylic dianhydride (BPDA) in Production Example 1 was changed to 155.1 g of 4,4'-oxydiphthalic acid dianhydride (ODPA), and the 40.0 g of 4,4'-diaminodiphenyl ether (DADPE) was changed to 62.1 g.

The weight-average molecular weight (Mw) of the obtained powdered polymer (polymer (A2)-18) was 13,000.

<Production Example 55> (Synthesis of Polymer (A2)-19)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 24.3 g of 1,4-phenylenediamine (PPD).

The weight-average molecular weight (Mw) of the obtained powdered polymer (polymer (A2)-19) was 3,000.

<Production Example 56> (Synthesis of Polymer (A2)-20)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 30.8 g of 1,4-phenylenediamine (PPD).

The weight-average molecular weight (Mw) of the obtained powdered polymer (polymer (A2)-20) was 11,000.

<Production Example 57> (Synthesis of Polymer (A2)-21)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 32.4 g of 1,4-phenylenediamine (PPD).

The weight-average molecular weight (Mw) of the obtained powdered polymer (polymer (A2)-21) was 12,000.

<Production Example 58> (Synthesis of Polymer (A2)-22)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 36.2 g of 1,4-phenylenediamine (PPD).

The weight-average molecular weight (Mw) of the obtained powdered polymer (polymer (A2)-22) was 15,000.

<Production Example 59> (Synthesis of Polymer (A2)-23)

Synthesis was performed in the same manner as Production Example 1, except that the 147.1 g of 3,3',4,4'-biphenyltetracarboxylic dianhydride (BPDA) in Production Example 1 was changed to 109.6 g of pyromellitic anhydride (PMDA), and the 40.0 g of 4,4'-diaminodiphenyl ether (DADPE) was changed to 37.8 g of 1,4-phenylenediamine (PPD).

The weight-average molecular weight (Mw) of the obtained powdered polymer (polymer (A2)-23) was 16,000.

<Production Example 60> (Synthesis of Polymer (A3)-1)

In a 0.5 liter flask equipped with a stirrer and thermometer there were charged 15.48 g of 4,4'-diphenyletherdicarboxylic acid as a dicarboxylic acid and N-methylpyrrolidone, and after cooling the flask to 5° C., thionyl chloride was added dropwise, and reaction was conducted for 30 minutes to obtain a dicarboxylic acid chloride solution. Next, N-methylpyrrolidone was charged into a 0.5 liter flask equipped with a stirrer and thermometer, and 28.57 g of bis(3-amino-4-hydroxyphenyl)hexafluoropropane (6FAP) as a bisaminophenol and 2.18 g of m-aminophenol were stirred and dissolved in it, after which pyridine was added and a solution of dicarboxylic acid chloride was added dropwise over a period of 30 minutes while maintaining a temperature of 0 to 5° C., and then stirring was continued for 30 minutes. The solution was poured into 3 liters of water, and the precipitate was recovered and rinsed 3 times with purified water and then dried under reduced pressure, to obtain a polymer (polybenzooxazole precursor (polymer (A3)-1)).

The weight-average molecular weight (Mw) of the obtained powdered polymer (polymer (A3)-1) was 10,000.

<Production Example 61> (Synthesis of Polymer (A3)-2)

A polybenzooxazole precursor (A3)-2 was obtained by reaction in the same manner as the method described above for polymer (A3)-1, except that the dicarboxylic acid was changed to sebacic acid (12.13 g).

The weight-average molecular weight (Mw) of the obtained powdered polymer (polymer (A3)-2) was 11,000.

<Production Example 62> (Synthesis of Polymer (A3)-3)

A polybenzooxazole precursor (A3)-3 was obtained by reaction in the same manner as the method described above for polymer (A3)-1, except that the dicarboxylic acid was changed to dicyclopentadienedicarboxylic acid (DCPD) (11.3 g).

The weight-average molecular weight (Mw) of the obtained powdered polymer (polymer (A3)-3) was 9,000.

The polymers (A)-1 to (A)-36, (A2)-1 to (A2)-23 and (A3)-1 to (A3)-3 are listed in summary in Table 1.

TABLE 1

| | Component | Weight-average molecular weight (Mw) |
|---|---|---|
| (A)-1 | BPDA/DADPE | 2000 |
| (A)-2 | ↑ | 3000 |
| (A)-3 | ↑ | 11,000 |
| (A)-4 | ↑ | 12,000 |
| (A)-5 | ↑ | 15,000 |
| (A)-6 | ↑ | 16,000 |
| (A)-7 | ↑ | 17,000 |
| (A2)-1 | BPDA/PPD | 3000 |
| (A2)-2 | ↑ | 11,000 |
| (A2)-3 | ↑ | 12,000 |
| (A2)-4 | ↑ | 15,000 |
| (A2)-5 | ↑ | 16,000 |
| (A2)-6 | BPDA/m-TB | 3000 |
| (A2)-7 | ↑ | 11,000 |
| (A2)-8 | ↑ | 12,000 |
| (A2)-9 | ↑ | 15,000 |
| (A2)-10 | ↑ | 16,000 |
| (A2)-11 | BPDA/TFMB | 3000 |
| (A2)-12 | ↑ | 11,000 |
| (A2)-13 | ↑ | 12,000 |
| (A2)-14 | ↑ | 15,000 |
| (A2)-15 | ↑ | 16,000 |
| (A)-8 | ODPA/DADPE | 2000 |
| (A)-9 | ↑ | 3000 |
| (A2)-16 | ↑ | 5000 |
| (A2)-17 | ↑ | 9500 |
| (A)-10 | ↑ | 11,000 |
| (A)-11 | ↑ | 12,000 |
| (A2)-18 | ↑ | 13,000 |
| (A)-12 | ↑ | 15,000 |
| (A)-13 | ↑ | 16,000 |
| (A)-14 | ↑ | 17,000 |
| (A)-15 | ODPA/PPD | 2000 |
| (A)-16 | ↑ | 3000 |
| (A)-17 | ↑ | 11,000 |
| (A)-18 | ↑ | 12,000 |
| (A)-19 | ↑ | 15,000 |
| (A)-20 | ↑ | 16,000 |
| (A)-21 | ↑ | 17,000 |
| (A2)-19 | PMDA/PPD | 3000 |
| (A2)-20 | ↑ | 11,000 |
| (A2)-21 | ↑ | 12,000 |
| (A2)-22 | ↑ | 15,000 |
| (A2)-23 | ↑ | 16,000 |
| (A)-22 | ODPA/m-TB | 2000 |
| (A)-23 | ↑ | 3000 |
| (A)-24 | ↑ | 11,000 |
| (A)-25 | ↑ | 12,000 |
| (A)-26 | ↑ | 15,000 |
| (A)-27 | ↑ | 16,000 |
| (A)-28 | ↑ | 17,000 |
| (A)-29 | PMDA/TFMB | 2000 |
| (A)-30 | ↑ | 3000 |
| (A)-31 | ↑ | 11,000 |
| (A)-32 | ↑ | 12,000 |
| (A)-33 | ↑ | 15,000 |
| (A)-34 | ↑ | 16,000 |

TABLE 1-continued

| | Component | Weight-average molecular weight (Mw) |
|---|---|---|
| (A)-35 | ↑ | 17,000 |
| (A)-36 | NTCDA/TDA | 10,000 |
| (A3)-1 | 4,4'-Diphenylether dicarboxylic acid/6FAP | 10,000 |
| (A3)-2 | Sebacic acid/6FAP | 11,000 |
| (A3)-3 | DCPD/6FAP | 9000 |

Example 1

A negative-type photosensitive resin composition was prepared by the following method using polymer (A)-2.

A 100 g portion of polymer (A)-2 (corresponding to polyimide precursor (A)) was dissolved in a mixed solvent comprising 4 g of component B-1 (corresponding to a photopolymerization initiator) and 4 g of tetraethyleneglycol dimethacrylate (corresponding to (C)-1), together with 80 g of N-methyl-2-pyrrolidone (corresponding to (D)-1) and 20 g of ethyl lactate ((E)-1). The viscosity of the obtained solution was adjusted to approximately 35 poise by further adding a small amount of the mixed solvent, to prepare a negative-type photosensitive resin composition.

Upon curing at 200° C. by the method described above in a chemical resistance test, the composition was evaluated as "G". A cured relief pattern was also formed on a copper layer by the method described above. After a high-temperature storage test, an evaluation of voids occupying the surface of the copper layer was conducted with a result of "G+".

Examples 2 to 49

Negative-type photosensitive resin compositions were prepared with the added components listed in Table 2.

When the compositions were subjected to a chemical resistance test by the method described above, their evaluations for chemical resistance and voids occupying the surface of the copper layer were as shown in Table 2-1.

Examples 50 to 52

Positive-type photosensitive resin compositions were prepared with the added components listed in Table 2.

When the compositions were subjected to a chemical resistance test by the method described above, their evaluations for chemical resistance and voids occupying the surface of the copper layer were as shown in Table 2-1.

In the tables and specification,
B-1 represents:

[Chemical Formula 82]

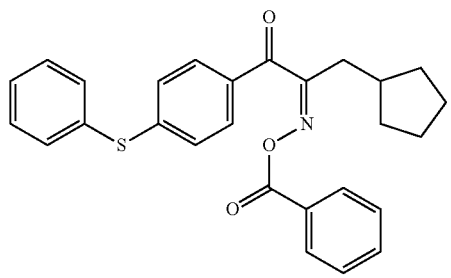

B-2 represents:

[Chemical Formula 83]

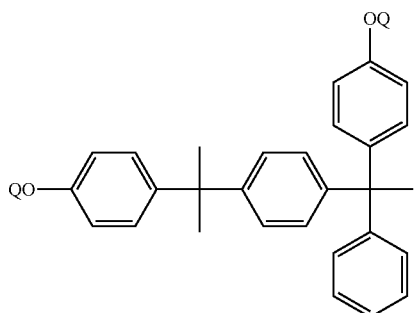

Q:

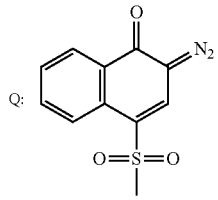

B-4 represents:

[Chemical Formula 84]

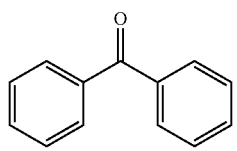

(D)-2 represents γ-butyrolactone, and (E)-2 represents propyleneglycol monomethyl ether acetate.

Comparative Example 1

A negative-type photosensitive resin composition was prepared in the same manner as Example 1, except that polymer (A)-2 in Example 1 was changed to (A)-1 and (B)-1 was changed to (B)-4.

When the composition was subjected to a chemical resistance test by the method described above, the chemical resistance was evaluated as "P". Also, an evaluation of voids occupying the surface of the copper layer was conducted with a result of "P".

Comparative Example 2

A negative-type photosensitive resin composition was prepared in the same manner as Example 1, except that polymer (A)-2 in Example 1 was changed to (A)-7 and (B)-1 was changed to (B)-4.

When the composition was subjected to a chemical resistance test by the method described above, the chemical resistance was evaluated as "P". Also, an evaluation of voids occupying the surface of the copper layer was conducted with a result of "P".

Comparative Example 3

A negative-type photosensitive resin composition was prepared in the same manner as Example 1, except that polymer (A)-2 in Example 1 was changed to (A)-1.

When the composition was subjected to a chemical resistance test by the method described above, the chemical resistance was evaluated as "P". Also, an evaluation of voids occupying the surface of the copper layer was conducted with a result of "F".

Comparative Example 4

A negative-type photosensitive resin composition was prepared in the same manner as Example 1, except that polymer (A)-2 in Example 1 was changed to (A)-7.

When the composition was subjected to a chemical resistance test by the method described above, the chemical resistance was evaluated as "P". Also, an evaluation of voids occupying the surface of the copper layer was conducted with a result of "G".

Comparative Example 5

A negative-type photosensitive resin composition was prepared in the same manner as Example 1, except that polymer (A)-2 in Example 1 was changed to (A)-8.

When the composition was subjected to a chemical resistance test by the method described above, the chemical resistance was evaluated as "P". Also, an evaluation of voids occupying the surface of the copper layer was conducted with a result of "F".

Comparative Example 6

A negative-type photosensitive resin composition was prepared in the same manner as Example 1, except that polymer (A)-2 in Example 1 was changed to (A)-14.

When the composition was subjected to a chemical resistance test by the method described above, the chemical resistance was evaluated as "P". Also, an evaluation of voids occupying the surface of the copper layer was conducted with a result of "G".

Comparative Example 7

A negative-type photosensitive resin composition was prepared in the same manner as Example 1, except that polymer (A)-2 in Example 1 was changed to (A)-15.

When the composition was subjected to a chemical resistance test by the method described above, the chemical resistance was evaluated as "P". Also, an evaluation of voids occupying the surface of the copper layer was conducted with a result of "F".

Comparative Example 8

A negative-type photosensitive resin composition was prepared in the same manner as Example 1, except that polymer (A)-2 in Example 1 was changed to (A)-21.

When the composition was subjected to a chemical resistance test by the method described above, the chemical resistance was evaluated as "P". Also, an evaluation of voids occupying the surface of the copper layer was conducted with a result of "G".

Comparative Example 9

A negative-type photosensitive resin composition was prepared in the same manner as Example 1, except that polymer (A)-2 in Example 1 was changed to (A)-22.

When the composition was subjected to a chemical resistance test by the method described above, the chemical resistance was evaluated as "P". Also, an evaluation of voids occupying the surface of the copper layer was conducted with a result of "F".

Comparative Example 10

A negative-type photosensitive resin composition was prepared in the same manner as Example 1, except that polymer (A)-2 in Example 1 was changed to (A)-28.

When the composition was subjected to a chemical resistance test by the method described above, the chemical resistance was evaluated as "P". Also, an evaluation of voids occupying the surface of the copper layer was conducted with a result of "G".

Comparative Example 11

A negative-type photosensitive resin composition was prepared in the same manner as Example 1, except that polymer (A)-2 in Example 1 was changed to (A)-29.

When the composition was subjected to a chemical resistance test by the method described above, the chemical resistance was evaluated as "P". Also, an evaluation of voids occupying the surface of the copper layer was conducted with a result of "F".

Comparative Example 12

A negative-type photosensitive resin composition was prepared in the same manner as Example 1, except that polymer (A)-2 in Example 1 was changed to (A)-35.

When the composition was subjected to a chemical resistance test by the method described above, the chemical resistance was evaluated as "P". Also, an evaluation of voids occupying the surface of the copper layer was conducted with a result of "G".

The results for Examples 1 to 52 are summarized in Table 2, and the results for Comparative Examples 1 to 12 are summarized in Table 3.

TABLE 2

| | Polymer (A) | | | Photopolymerization initiator (B) | | (C)-1 | (D) | | (E) | | | |
|---|---|---|---|---|---|---|---|---|---|---|---|---|
| | Type | Molecular weight (Mw) | Added component (g) | Type | Added component (g) | Added component (g) | Type | Added component (g) | Type | Added component (g) | Chemical resistance | Cu voids |
| Example 1 | (A)-2 | 3000 | 100 | (B)-1 | 4 | 4 | (D)-1 | 80 | (E)-1 | 20 | G | G+ |
| Example 2 | (A)-3 | 11,000 | 100 | (B)-1 | 4 | 4 | (D)-1 | 80 | (E)-1 | 20 | VG | G+ |
| Example 3 | (A)-4 | 12,000 | 100 | (B)-1 | 4 | 4 | (D)-1 | 80 | (E)-1 | 20 | G | G+ |

TABLE 2-continued

|  | Polymer (A) | | Photopolymerization initiator (B) | | (C)-1 | (D) | | (E) | | | |
|---|---|---|---|---|---|---|---|---|---|---|---|
|  | Type | Molecular weight (Mw) | Added component (g) | Type | Added component (g) | Added component (g) | Type | Added component (g) | Type | Added component (g) | Chemical resistance | Cu voids |
| Example 4 | (A)-5 | 15,000 | 100 | (B)-1 | 4 | 4 | (D)-1 | 80 | (E)-1 | 20 | F | G |
| Example 5 | (A)-6 | 16,000 | 100 | (B)-1 | 4 | 4 | (D)-1 | 80 | (E)-1 | 20 | F | G |
| Example 6 | (A)-9 | 3000 | 100 | (B)-1 | 4 | 4 | (D)-1 | 80 | (E)-1 | 20 | VG | VG |
| Example 7 | (A)-10 | 11,000 | 100 | (B)-1 | 4 | 4 | (D)-1 | 80 | (E)-1 | 20 | VG | VG |
| Example 8 | (A)-11 | 12,000 | 100 | (B)-1 | 4 | 4 | (D)-1 | 80 | (E)-1 | 20 | VG | VG |
| Example 9 | (A)-12 | 15,000 | 100 | (B)-1 | 4 | 4 | (D)-1 | 80 | (E)-1 | 20 | G | G |
| Example 10 | (A)-13 | 16,000 | 100 | (B)-1 | 4 | 4 | (D)-1 | 80 | (E)-1 | 20 | G | G |
| Example 11 | (A)-16 | 3000 | 100 | (B)-1 | 4 | 4 | (D)-1 | 80 | (E)-1 | 20 | G | G+ |
| Example 12 | (A)-17 | 11,000 | 100 | (B)-1 | 4 | 4 | (D)-1 | 80 | (E)-1 | 20 | VG | G+ |
| Example 13 | (A)-18 | 12,000 | 100 | (B)-1 | 4 | 4 | (D)-1 | 80 | (E)-1 | 20 | G | G+ |
| Example 14 | (A)-19 | 15,000 | 100 | (B)-1 | 4 | 4 | (D)-1 | 80 | (E)-1 | 20 | F | G |
| Example 15 | (A)-20 | 16,000 | 100 | (B)-1 | 4 | 4 | (D)-1 | 80 | (E)-1 | 20 | F | G |
| Example 16 | (A)-23 | 3000 | 100 | (B)-1 | 4 | 4 | (D)-1 | 80 | (E)-1 | 20 | G | F |
| Example 17 | (A)-24 | 11,000 | 100 | (B)-1 | 4 | 4 | (D)-1 | 80 | (E)-1 | 20 | VG | F |
| Example 18 | (A)-25 | 12,000 | 100 | (B)-1 | 4 | 4 | (D)-1 | 80 | (E)-1 | 20 | G | F |
| Example 19 | (A)-26 | 15,000 | 100 | (B)-1 | 4 | 4 | (D)-1 | 80 | (E)-1 | 20 | F | F |
| Example 20 | (A)-27 | 16,000 | 100 | (B)-1 | 4 | 4 | (D)-1 | 80 | (E)-1 | 20 | F | F |
| Example 21 | (A)-30 | 3000 | 100 | (B)-1 | 4 | 4 | (D)-1 | 80 | (E)-1 | 20 | G | F |
| Example 22 | (A)-31 | 11,000 | 100 | (B)-1 | 4 | 4 | (D)-1 | 80 | (E)-1 | 20 | VG | F |
| Example 23 | (A)-32 | 12,000 | 100 | (B)-1 | 4 | 4 | (D)-1 | 80 | (E)-1 | 20 | G | F |
| Example 24 | (A)-33 | 15,000 | 100 | (B)-1 | 4 | 4 | (D)-1 | 80 | (E)-1 | 20 | F | F |
| Example 25 | (A)-34 | 16,000 | 100 | (B)-1 | 4 | 4 | (D)-1 | 80 | (E)-1 | 20 | F | F |
| Example 26 | (A)-36 | 10,000 | 100 | (B)-1 | 4 | 4 | (D)-1 | 80 | (E)-1 | 20 | F | F |
| Example 27 | (A2)-1 | 3000 | 100 | (B)-1 | 4 | 4 | (D)-1 | 80 | (E)-1 | 20 | G | G+ |
| Example 28 | (A2)-2 | 11,000 | 100 | (B)-1 | 4 | 4 | (D)-1 | 80 | (E)-1 | 20 | VG | G+ |
| Example 29 | (A2)-3 | 12,000 | 100 | (B)-1 | 4 | 4 | (D)-1 | 80 | (E)-1 | 20 | G | G+ |
| Example 30 | (A2)-4 | 15,000 | 100 | (B)-1 | 4 | 4 | (D)-1 | 80 | (E)-1 | 20 | F | G |
| Example 31 | (A2)-5 | 16,000 | 100 | (B)-1 | 4 | 4 | (D)-1 | 80 | (E)-1 | 20 | F | G |
| Example 32 | (A2)-6 | 3000 | 100 | (B)-1 | 4 | 4 | (D)-1 | 80 | (E)-1 | 20 | G | G+ |
| Example 33 | (A2)-7 | 11,000 | 100 | (B)-1 | 4 | 4 | (D)-1 | 80 | (E)-1 | 20 | VG | G+ |
| Example 34 | (A2)-8 | 12,000 | 100 | (B)-1 | 4 | 4 | (D)-1 | 80 | (E)-1 | 20 | G | G+ |
| Example 35 | (A2)-9 | 15,000 | 100 | (B)-1 | 4 | 4 | (D)-1 | 80 | (E)-1 | 20 | F | G |
| Example 36 | (A2)-10 | 16,000 | 100 | (B)-1 | 4 | 4 | (D)-1 | 80 | (E)-1 | 20 | F | G |
| Example 37 | (A2)-11 | 3000 | 100 | (B)-1 | 4 | 4 | (D)-1 | 80 | (E)-1 | 20 | G | G+ |
| Example 38 | (A2)-12 | 11,000 | 100 | (B)-1 | 4 | 4 | (D)-1 | 80 | (E)-1 | 20 | VG | G+ |
| Example 39 | (A2)-13 | 12,000 | 100 | (B)-1 | 4 | 4 | (D)-1 | 80 | (E)-1 | 20 | G | G+ |
| Example 40 | (A2)-14 | 15,000 | 100 | (B)-1 | 4 | 4 | (D)-1 | 80 | (E)-1 | 20 | F | G |
| Example 41 | (A2)-15 | 16,000 | 100 | (B)-1 | 4 | 4 | (D)-1 | 80 | (E)-1 | 20 | F | G |
| Example 42 | (A2)-16 | 5,000 | 100 | (B)-1 | 4 | 4 | (D)-1 | 80 | (E)-1 | 20 | VG | VG |
| Example 43 | (A2)-17 | 9500 | 100 | (B)-1 | 4 | 4 | (D)-1 | 80 | (E)-1 | 20 | VG | VG |
| Example 44 | (A2)-18 | 13,000 | 100 | (B)-1 | 4 | 4 | (D)-1 | 80 | (E)-1 | 20 | VG | VG |
| Example 45 | (A2)-19 | 3000 | 100 | (B)-1 | 4 | 4 | (D)-1 | 80 | (E)-1 | 20 | G | G+ |
| Example 46 | (A2)-20 | 11,000 | 100 | (B)-1 | 4 | 4 | (D)-1 | 80 | (E)-1 | 20 | VG | G+ |
| Example 47 | (A2)-21 | 12,000 | 100 | (B)-1 | 4 | 4 | (D)-1 | 80 | (E)-1 | 20 | G | G+ |
| Example 48 | (A2)-22 | 15,000 | 100 | (B)-1 | 4 | 4 | (D)-1 | 80 | (E)-1 | 20 | F | G |
| Example 49 | (A2)-23 | 16,000 | 100 | (B)-1 | 4 | 4 | (D)-1 | 80 | (E)-1 | 20 | F | G |
| Example 50 | (A3)-1 | 10,000 | 100 | (B)-2 | 10 | — | (D)-2 | 225 | (E)-2 | 25 | G | F |
| Example 51 | (A3)-2 | 11,000 | 100 | (B)-2 | 10 | — | (D)-2 | 225 | (E)-2 | 25 | G | F |
| Example 52 | (A3)-3 | 9000 | 100 | (B)-2 | 10 | — | (D)-2 | 225 | (E)-2 | 25 | F | F |

TABLE 3

|  | Polymer (A) | | Photopolymerization initiator (B) | | (C)-1 | (D) | | (E) | | | |
|---|---|---|---|---|---|---|---|---|---|---|---|
|  | Type | Molecular weight (Mw) | Added component (g) | Type | Added component (g) | Added component (g) | Type | Added component (g) | Type | Added component (g) | Chemical resistance | Cu voids |
| Comp. Example 1 | (A)-1 | 2000 | 100 | (B)-4 | 4 | 4 | (D)-1 | 80 | (E)-1 | 20 | P | P |
| Comp. Example 2 | (A)-7 | 17,000 | 100 | (B)-4 | 4 | 4 | (D)-1 | 80 | (E)-1 | 20 | P | P |
| Comp. Example 3 | (A)-1 | 2000 | 100 | (B)-1 | 4 | 4 | (D)-1 | 80 | (E)-1 | 20 | P | F |
| Comp. Example 4 | (A)-7 | 17,000 | 100 | (B)-1 | 4 | 4 | (D)-1 | 80 | (E)-1 | 20 | P | G |
| Comp. Example 5 | (A)-8 | 2000 | 100 | (B)-1 | 4 | 4 | (D)-1 | 80 | (E)-1 | 20 | P | F |

TABLE 3-continued

| | Polymer (A) | | | Photopolymerization initiator (B) | | (C)-1 | (D) | | (E) | | Chemical resistance | Cu voids |
|---|---|---|---|---|---|---|---|---|---|---|---|---|
| | Type | Molecular weight (Mw) | Added component (g) | Type | Added component (g) | Added component (g) | Type | Added component (g) | Type | Added component (g) | | |
| Comp. Example 6 | (A)-14 | 17,000 | 100 | (B)-1 | 4 | 4 | (D)-1 | 80 | (E)-1 | 20 | P | G |
| Comp. Example 7 | (A)-15 | 2000 | 100 | (B)-1 | 4 | 4 | (D)-1 | 80 | (E)-1 | 20 | P | F |
| Comp. Example 8 | (A)-21 | 17,000 | 100 | (B)-1 | 4 | 4 | (D)-1 | 80 | (E)-1 | 20 | P | G |
| Comp. Example 9 | (A)-22 | 2000 | 100 | (B)-1 | 4 | 4 | (D)-1 | 80 | (E)-1 | 20 | P | F |
| Comp. Example 10 | (A)-28 | 17,000 | 100 | (B)-1 | 4 | 4 | (D)-1 | 80 | (E)-1 | 20 | P | G |
| Comp. Example 11 | (A)-29 | 2000 | 100 | (B)-1 | 4 | 4 | (D)-1 | | (E)-1 | 20 | P | F |
| Comp. Example 12 | (A)-35 | 17,000 | 100 | (B)-1 | 4 | 4 | (D)-1 | 80 | (E)-1 | 20 | P | G |

As clearly seen from Table 2 and Table 3, in the examples using polymers having a weight-average molecular weight (Mw) of 3,000 or greater and less than 16,000 as the polyimide precursor (A), all exhibited satisfactory results for chemical resistance and inhibition of copper void generation. Among these, the examples using polymers having a weight-average molecular weight (Mw) of 3,000 or greater and less than 12,000 exhibited particularly satisfactory results for chemical resistance and inhibition of copper void generation.

In contrast, the comparative examples using polymers having a weight-average molecular weight (Mw) of less than 3,000 or 16,000 or greater exhibited inferior results for chemical resistance and inhibition of copper void generation.

Furthermore, as seen by comparing Example 26 with the other examples, by specifying the structure of $X_1$ as a tetravalent organic group of 6 to 40 carbon atoms in a polyimide precursor (A) represented by formula (1), it is possible to obtain particularly excellent results for chemical resistance and inhibition of copper void generation.

Moreover, as seen by comparing Example 50 to Example 52 with the other examples, by using an oxime ester compound in the photopolymerization initiator (B) it is possible to obtain particularly excellent results for chemical resistance and inhibition of copper void generation.

These results confirmed that by using a photosensitive resin having a specific weight-average molecular weight (Mw) according to the invention, it is possible to provide a photosensitive resin composition that can produce a resin layer with high chemical resistance, and a method for producing a cured relief pattern using the photosensitive resin composition.

This is because using a photosensitive resin with a specific weight-average molecular weight (Mw) allows imide ring-forming reaction (imidization) of a polyimide to proceed satisfactorily even under low-temperature curing conditions of 200° C. or below. Presumably for this reason the polyimide precursor therefore does not remain in the resin film.

Examples and Comparative Examples for Second Embodiment

The present invention will now be explained in more specific detail through the following examples, with the understanding that the invention is in no way limited thereby. The physical properties of the photosensitive resin compositions of the examples, comparative examples and production examples were measured and evaluated by the following methods.

(1) Weight-Average Molecular Weight

The weight-average molecular weight (Mw) of each polyamic acid ester synthesized by the method described blow was measured using gel permeation chromatography (GPC), in terms of standard polystyrene. The GPC analysis conditions were as follows.

Column: Shodex 805M/806M series, trade name of Showa Denko K.K.

Standard monodisperse polystyrene: Shodex STANDARD SM-105 by Showa Denko K.K.

Eluent: N-methyl-2-pyrrolidone, 40° C.

Flow rate: 1.0 ml/min

Detector: Shodex RI-930, trade name of Showa Denko K.K.

(2) Formation of Coated Film and Evaluation of in-Plane Uniformity of Film Thickness A photosensitive resin composition prepared by the method described below was spin coated onto a 6-inch silicon wafer (product of Fujimi Denshi Kogyo, thickness: 625±25 μm) using a coater developer (D-Spin Model 60 Å, product of Sokudo) and dried to form a coated film with a thickness of 10 μm. The film thickness of the coated film was measured at 39 points on the plane using a non-contact film thickness meter (NANOSPEC/AFT Model 5100, product of Nanometrics, Inc.), and the average value and difference between the maximum and minimum were determined. The difference between the maximum and minimum film thickness was used as an index of the in-plane uniformity.

(3) Chemical Resistance Test

The negative-type photosensitive resin composition of the invention was spin coated onto a 6-inch silicon wafer (product of Fujimi Denshi Kogyo, 625 ±+25 μm thickness), and dried to form a coating film with a thickness of about 11 μm as a photosensitive resin layer. Using a test patterned reticle, the coating film was irradiated with an energy of 500 mJ/cm$^2$ by a ghi stepper (Prisma-ghi, product of Ultratech Co.), for exposure. Next, the coating film formed on the wafer was subjected to spray development with a developing machine (Model D-SPIN636, Dainippon Screen Mfg. Co., Ltd., Japan)., using cyclopentanone. It was then rinsed with propyleneglycol methyl ether acetate to develop and remove the unexposed sections, and obtain a relief pattern of a polyimide precursor. The relief pattern-formed wafer was cured at 200° C. for 2 hours under a nitrogen atmosphere using a temperature-elevating program-type curing furnace (Model VF-2000, product of Koyo Lindbergh Co., Japan), to obtain a polyimide cured relief pattern with a thickness of approximately 9 µm.

The obtained polyimide pattern was immersed in a solution comprising 1 wt % potassium hydroxide, 39 wt % 3-methoxy-3-methyl-1-butanol and 60 wt % dimethyl sulfoxide, at 100° C. for 1 hour. After rinsing and air-drying, the polyimide coating film was evaluated by measuring the film thickness and observing it under an optical microscope.

For the evaluation, "VG" was assigned if the coating film after immersion had a film thickness fluctuation of within ±1% for the coating film with respect to before immersion and exhibited no cracking, "G" was assigned if the film thickness fluctuation of the coating film was within ±3% and no cracking was exhibited, "F" was assigned if the film thickness fluctuation of the coating film was within ±5% and no cracking was exhibited, and "P" was assigned if the film thickness fluctuation exceeded ±5% or cracking was exhibited.

Example 1

After placing 155.1 g of 4,4'-oxydiphthalic acid dianhydride (ODPA) as an acid component in a 2 liter-volume separable flask, 134.0 g of 2-hydroxyethyl methacrylate (HEMA) and 400 ml of γ-butyrolactone were added. By adding 79.1 g of pyridine while stirring at room temperature, a reaction mixture was obtained. When heat release from the reaction was complete, it was allowed to cool to room temperature and then stationed for another 16 hours.

Next, while cooling on ice, a solution of 206.3 g of dicyclohexylcarbodiimide (DCC) dissolved in 180 ml of γ-butyrolactone was added to the reaction mixture over a period of 40 minutes while stirring. A suspension of 120.14 g of 4,4'-diaminodiphenyl ether (DADPE) as a diamine component in 360 ml of γ-butyrolactone was then added over a period of 60 minutes while stirring. After further stirring at room temperature for 2 hours, 37.2 g of 2-isocyanatoethyl methacrylate was added as an end modifier, and the mixture was stirred for 2 hours. This was followed by addition of 400 ml of γ-butyrolactone. The precipitate produced in the reaction mixture was removed off by filtration to obtain a reaction solution.

The obtained reaction solution was added to 3 liters of ethyl alcohol to form a precipitate comprising a crude polymer. The produced crude polymer was filtered and dissolved in 1.5 liters of tetrahydrofuran to obtain a crude polymer solution. The obtained crude polymer solution was added dropwise into 28 liters of water to precipitate the polymer, and after filtering out the obtained precipitate, it was vacuum dried to obtain a powdered polymer A-1.

The weight-average molecular weight (Mw) of polymer A-1 was measured to be 20.000.

A 100 g portion of polymer A-1 as a polyimide precursor was dissolved in a mixed solvent comprising 80 g of N-methyl-2-pyrrolidone (hereunder, "NMP") and 20 g of ethyl lactate, together with 4 g of 1-phenyl-1,2-propanedione-2-(O-ethoxycarbonyl)-oxime, 8 g of tetraethyleneglycol dimethacrylate, 0.5 g of benzotriazole and 1.5 g of N-[3-(triethoxysilyl)propyl]phthalamic acid. The viscosity of the obtained solution was adjusted to 15 poise by further adding the mixed solvent, to prepare a negative-type photosensitive resin composition solution.

The solution was coated onto a silicon wafer by the method described above, and the in-plane uniformity of film thickness and chemical resistance were determined. The evaluation result for the in-plane uniformity was 0.03 rm. The result for the chemical resistance test was "VG".

The type and amount of the acid component used in Example 1, the type and amount of diamine component and the type and amount of the end modifier are shown in Table 1, together with the evaluation results for the viscosity (poise) of the negative-type photosensitive resin composition solution, and the weight-average molecular weight (Mw) and in-plane uniformity of the obtained polymer, as well as the results for chemical resistance testing.

For the acid end/diamine end columns in Table 1, for acid ends, both ends of the main chain of the polymer are indicated as having the structure:

[Chemical Formula 85]

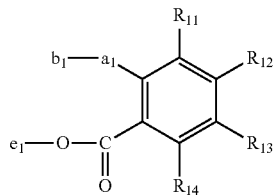

(E1)

(wherein a1 includes at least one amide bond, imide bond, urea bond or urethane bond, b1 is a reactive substituent that crosslinks by heat or light, e1 is a monovalent organic group of 1 to 30 carbon atoms, $R_{11}$ and $R_{14}$ are each independently a hydrogen atom or a monovalent organic group of 1 to 30 carbon atoms, and $R_{12}$ and $R_{13}$ are each independently a hydrogen atom, a monovalent organic group of 1 to 30 carbon atoms or a part of an aromatic ring or an aliphatic ring (with the proviso that $R_{12}$ and $R_{13}$ are not both hydrogen atoms)), and for amine ends, in the acid end/diamine end columns, both ends of the main chain of the polymer are indicated as having the structure:

[Chemical Formula 86]

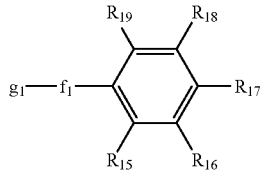

(F1)

(wherein f1 includes at least one amide bond, imide bond, urea bond, urethane bond or ester bond, g1 is a reactive substituent that crosslinks by heat or light, and $R_{15}$-$R_{19}$ are each independently a hydrogen atom, a monovalent organic group of 1 to 30 carbon atoms or a part of an aromatic ring or an aliphatic ring (with the proviso that $R_{16}$, $R_{17}$ and $R_{18}$ are not all hydrogen atoms)).

In the bond type column in Table 1, when both ends of the main chain of the polymer are (E1), it indicates the type of a1 bond, and when both ends of the main chain of the polymer are (F1), it indicates the type of f1 bond.

Examples 2 to 29

Negative-type photosensitive resin composition solutions for Examples 2 to 29 were obtained by the same method as described in Example 1, except that the types and amounts of acid components, the types and amounts of diamine components, the types and amounts of end modifiers and the viscosities (poise) of the negative-type photosensitive resin composition solutions were changed, as shown in Table 1.

The weight-average molecular weights (Mw) of the obtained polymers, the evaluation results for in-plane uniformity and the results for chemical resistance testing were as shown in Table 1.

Reference Examples 1 to 4

Negative-type photosensitive resin composition solutions for Reference Examples 1 to 4 were obtained by the same method as described in Example 1, except that the types and amounts of acid components, the types and amounts of diamine components, the types and amounts of end modifiers and the viscosities (poise) of the negative-type photosensitive resin composition solutions were changed, as shown in Table 1.

For the negative-type photosensitive resin composition solutions of Reference Examples 1 to 4, the viscosities (poise) of the negative-type photosensitive resin composition solutions were 90. The weight-average molecular weights (Mw) of the obtained polymers, the evaluation results for in-plane uniformity and the results for chemical resistance testing were as shown in Table 1.

Comparative Example 1

After placing 155.1 g of 4,4'-oxydiphthalic acid dianhydride (ODPA) as an acid component in a 2 liter-volume separable flask, 134.0 g of 2-hydroxyethyl methacrylate (HEMA) and 400 ml of γ-butyrolactone were added. By adding 79.1 g of pyridine while stirring at room temperature, a reaction mixture was obtained. When heat release from the reaction was complete, it was allowed to cool to room temperature and then stationed for another 16 hours.

Next, while cooling on ice, a solution of 206.3 g of dicyclohexylcarbodiimide (DCC) dissolved in 180 ml of γ-butyrolactone was added to the reaction mixture over a period of 40 minutes while stirring. Next, a suspension of 84.1 g of 4,4'-diaminodiphenyl ether (DADPE) as a diamine component in 240 ml of γ-butyrolactone was added over a period of 60 minutes while stirring. The mixture was stirred at room temperature for 2 hours, and then 30 ml of ethyl alcohol was added, stirring was continued for 1 hour, and 400 ml of γ-butyrolactone was added. The precipitate produced in the reaction mixture was removed off by filtration to obtain a reaction solution.

The obtained reaction solution was added to 3 liters of ethyl alcohol to form a precipitate comprising a crude polymer. The produced crude polymer was filtered and dissolved in 1.5 liters of tetrahydrofuran to obtain a crude polymer solution. The obtained crude polymer solution was added dropwise into 28 liters of water to precipitate the polymer, and after filtering out the obtained precipitate, it was vacuum dried to obtain a powdered polymer B-1.

The weight-average molecular weight (Mw) of polymer B-1 was measured to be 20,000. The polymer B-1 did not have reactive substituents that react by heat or light on the ends of the main chain.

A 100 g portion of polymer B-1 as a polyimide precursor was dissolved in a mixed solvent comprising 80 g of N-methyl-2-pyrrolidone (hereunder, "NMP") and 20 g of ethyl lactate, together with 4 g of 1-phenyl-1,2-propane-dione-2-(O-ethoxycarbonyl)-oxime, 8 g of tetraethyleneglycol dimethacrylate, 0.5 g of benzotriazole and 1.5 g of N-[3-(triethoxysilyl)propyl]phthalamic acid. The viscosity of the obtained solution was adjusted to 15 poise by further adding the mixed solvent, to prepare a negative-type photosensitive resin composition solution.

The solution was coated onto a silicon wafer by the method described above, and the in-plane uniformity of film thickness and chemical resistance were determined.

The evaluation results for the in-plane uniformity of film thickness and chemical resistance were as shown in Table 1.

Comparative Example 2

A negative-type photosensitive resin composition solution for Comparative Example 2 was obtained by the same method as described in Comparative Example 1, except that the types and amounts of acid components, the types and amounts of diamine components, the types and amounts of end modifiers and the viscosities (poise) of the negative-type photosensitive resin composition solutions were changed, as shown in Table 1. The weight-average molecular weights (Mw) of the obtained polymers, the evaluation results for in-plane uniformity and the results for chemical resistance testing were as shown in Table 4.

The types and amounts of the acid components, the types and amounts of diamine components and the types and amounts of the end modifiers used in the examples and comparative examples are shown in Table 4, together with the evaluation results for the viscosity (poise) of the negative-type photosensitive resin composition solution, and the weight-average molecular weight (Mw) and in-plane uniformity of the obtained polymer, as well as the results for chemical resistance testing.

TABLE 4

| | Acid component type | Acid component amount (g) | Diamine component type | Diamine component amount (g) | Acid end/diamine end | End modifier type |
|---|---|---|---|---|---|---|
| Example 1 | ODPA | 155.1 | DADPE | 120.14 | Amine | 2-Isocyanatoethyl methacrylate |
| Example 2 | ODPA | 155.1 | DADPE | 120.14 | Amine | Methacrylic anhydride |
| Example 3 | ODPA | 155.1 | DADPE | 120.14 | Amine | 4-Ethynylphthalic anhydride |
| Example 4 | ODPA | 155.1 | DADPE | 120.14 | Amine | Exo-3,6-epoxy-1,2,3,6-tetrahydrophthalic anhydride |
| Example 5 | ODPA | 155.1 | DADPE | 120.14 | Amine | Maleic anhydride |
| Example 6 | ODPA | 155.1 | DADPE | 120.14 | Amine | Allyl chloroformate |

TABLE 4-continued

| | | | | | | |
|---|---|---|---|---|---|---|
| Example 7 | ODPA | 155.1 | DADPE | 84.1 | Acid | 4-Vinylaniline |
| Example 8 | ODPA | 155.1 | DADPE | 84.1 | Acid | 2-Hydroxyethyl acrylate |
| Example 9 | ODPA | 155.1 | M-TB | 127.4 | Amine | 2-Isocyanatoethyl methacrylate |
| Example 10 | ODPA | 155.1 | M-TB | 127.4 | Amine | Methacrylic anhydride |
| Example 11 | ODPA | 155.1 | M-TB | 127.4 | Amine | 4-Ethynylphthalic anhydride |
| Example 12 | ODPA | 155.1 | M-TB | 127.4 | Amine | Exo-3,6-epoxy-1,2,3,6-tetrahydrophthalic anhydride |
| Example 13 | ODPA | 155.1 | M-TB | 127.4 | Amine | Maleic anhydride |
| Example 14 | ODPA | 155.1 | M-TB | 127.4 | Amine | Allyl chloroformate |
| Example 15 | ODPA | 155.1 | M-TB | 89.2 | Acid | 4-Vinylaniline |
| Example 16 | ODPA | 155.1 | M-TB | 89.2 | Acid | 2-Hydroxyethyl acrylate |
| Example 17 | BTPA | 161.1 | BAPS | 259.5 | Amine | 2-Isocyanatoethyl methacrylate |
| Example 18 | BTPA | 161.1 | BAPS | 259.5 | Amine | Methacrylic anhydride |
| Example 19 | BTPA | 161.1 | BAPS | 259.5 | Amine | 4-Ethynylphthalic anhydride |
| Example 20 | BTPA | 161.1 | BAPS | 259.5 | Amine | Exo-3,6-epoxy-1,2,3,6-tetrahydrophthalic anhydride |
| Example 21 | BTPA | 161.1 | BAPS | 259.5 | Amine | Maleic anhydride |
| Example 22 | BPDA | 147.1 | DADPE | 120.14 | Amine | 2-Isocyanatoethyl methacrylate |
| Example 23 | BPDA | 147.1 | DADPE | 120.14 | Amine | Methacrylic anhydride |
| Example 24 | BPDA | 147.1 | DADPE | 120.14 | Amine | 4-Ethynylphthalic anhydride |
| Example 25 | BPDA | 147.1 | DADPE | 120.14 | Amine | Exo-3,6-epoxy-1,2,3,6-tetrahydrophthalic anhydride |
| Example 26 | BPDA | 147.1 | DADPE | 120.14 | Amine | Maleic anhydride |
| Example 27 | BPDA | 147.1 | DADPE | 120.14 | Amine | Allyl chloroformate |
| Example 28 | BPDA | 147.1 | DADPE | 84.1 | Acid | 4-Vinylaniline |
| Example 29 | BPDA | 147.1 | DADPE | 84.1 | Acid | 2-Hydroxyethyl acrylate |
| Reference Example 1 | ODPA | 155.1 | DADPE | 120.14 | Amine | 2-Isocyanatoethyl methacrylate |
| Reference Example 2 | ODPA | 155.1 | DADPE | 120.14 | Amine | Methacrylic anhydride |
| Reference Example 3 | ODPA | 155.1 | M-TB | 127.4 | Amine | 2-Isocyanatoethyl methacrylate |
| Reference Example 4 | ODPA | 155.1 | M-TB | 127.4 | Amine | Methacrylic anhydride |
| Comp. Example 1 | ODPA | 155.1 | DADPE | 84.1 | Acid | None |
| Comp. Example 2 | ODPA | 155.1 | M-TB | 89.2 | Acid | None |

| | End modifier amount (g) | Bond type a1 for acid end f1 for amine end | Polymer weight-average molecular type | Viscosity (poise) | Film thickness homogeneity (μm) | Chemical resistance |
|---|---|---|---|---|---|---|
| Example 1 | 37.2 | Urea bond | 20,000 | 15 | 0.03 | VG |
| Example 2 | 37.0 | Amide bond | 20,000 | 15 | 0.04 | VG |
| Example 3 | 41.3 | Imide bond | 20,000 | 35 | 0.07 | VG |
| Example 4 | 39.9 | Imide bond | 20,000 | 35 | 0.06 | VG |
| Example 5 | 23.5 | Amide bond | 20,000 | 75 | 0.08 | VG |
| Example 6 | 28.9 | Urethane bond | 21,000 | 15 | 0.09 | VG |
| Example 7 | 23.8 | Amide bond | 19,000 | 15 | 0.08 | G |
| Example 8 | 23.2 | Ester bond | 20,000 | 15 | 0.06 | F |
| Example 9 | 37.2 | Urea bond | 21,000 | 15 | 0.04 | VG |
| Example 10 | 37.0 | Amide bond | 21,000 | 15 | 0.04 | VG |
| Example 11 | 41.3 | Imide bond | 21,000 | 35 | 0.06 | VG |
| Example 12 | 39.9 | Imide bond | 21,000 | 35 | 0.05 | VG |
| Example 13 | 23.5 | Amide bond | 21,000 | 75 | 0.08 | VG |
| Example 14 | 28.9 | Urethane bond | 22,000 | 15 | 0.09 | VG |
| Example 15 | 23.8 | Amide bond | 20,000 | 15 | 0.09 | G |
| Example 16 | 23.2 | Ester bond | 21,000 | 15 | 0.08 | F |
| Example 17 | 37.2 | Urea bond | 22,000 | 15 | 0.06 | VG |
| Example 18 | 37.0 | Amide bond | 22,000 | 15 | 0.07 | VG |
| Example 19 | 41.3 | Imide bond | 22,000 | 35 | 0.08 | VG |
| Example 20 | 39.9 | Imide bond | 22,000 | 35 | 0.09 | VG |
| Example 21 | 23.5 | Amide bond | 22,000 | 75 | 0.09 | VG |
| Example 22 | 37.2 | Urea bond | 19,000 | 15 | 0.03 | VG |
| Example 23 | 37.0 | Amide bond | 19,000 | 15 | 0.05 | VG |
| Example 24 | 41.3 | Imide bond | 19,000 | 35 | 0.06 | VG |
| Example 25 | 39.9 | Imide bond | 19,000 | 35 | 0.06 | VG |
| Example 26 | 23.5 | Amide bond | 19,000 | 75 | 0.08 | VG |
| Example 27 | 28.9 | Urethane bond | 20,000 | 15 | 0.09 | VG |
| Example 28 | 23.8 | Amide bond | 18,000 | 15 | 0.08 | G |
| Example 29 | 23.2 | Ester bond | 21,000 | 15 | 0.07 | F |
| Reference Example 1 | 37.2 | Urea bond | 20,000 | 90 | 0.13 | G |
| Reference Example 2 | 37.0 | Amide bond | 20,000 | 90 | 0.14 | G |
| Reference Example 3 | 37.2 | Urea bond | 21,000 | 90 | 0.12 | G |
| Reference Example 4 | 37.0 | Amide bond | 21,000 | 90 | 0.14 | G |
| Comp. Example 1 | | None | 20,000 | 15 | 0.16 | P |
| Comp. Example 2 | | None | 20,000 | 15 | 0.17 | P |

As clearly seen in the table, with the negative-type photosensitive resin compositions of the examples, which contained a photosensitive polyimide precursor having on the ends of the main chain a reactive substituent that reacts by heat or light, and which had viscosity of 80 poise or lower, the homogeneity of film thickness and the chemical resistance were excellent.

The embodiments of the invention described above are not intended to place limitations on the invention, and various modifications may be incorporated such as fall within the gist of the invention.

INDUSTRIAL APPLICABILITY

Industrial Applicability of First Embodiment

The negative-type photosensitive resin composition of the invention can be cured at low temperature and has excellent chemical resistance, and can therefore be suitably utilized in the field of photosensitive materials that are useful for production of electrical and electronic materials for semiconductor devices, multilayer circuit boards and the like.

Industrial Applicability of Second Embodiment

By using a negative-type photosensitive polyimide precursor with improved in-plane uniformity of film thickness according to the invention, it is possible to achieve both the resolution and reliability required for materials suited for production of advanced electronic devices.

The invention claimed is:

1. A negative-type photosensitive resin composition comprising:
    (A) a polyimide precursor at 100 parts by mass; and
    (B) a photopolymerization initiator at 0.1 part by mass to 20 parts by mass;
    wherein
    the polyimide precursor (A) is a polyamic acid ester or polyamic acid salt represented by the following formula (1):

[Chemical Formula 1]

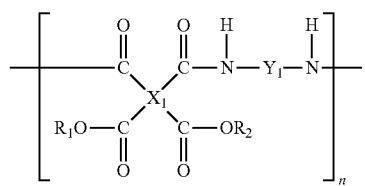

(1)

{wherein $X_1$ is a tetravalent organic group of 6 to 40 carbon atoms, $Y_1$ is a divalent organic group of 6 to 40 carbon atoms, n is an integer of 2 to 50, and $R_1$ and $R_2$ each independently represent a hydrogen atom, a group represented by the following formula (2):

[Chemical Formula 2]

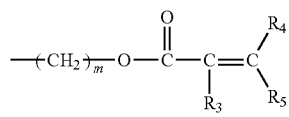

(2)

(wherein $R_3$, $R_4$ and $R_5$ are each independently a hydrogen atom or a monovalent organic group of 1 to 3 carbon atoms, and m is an integer of 2 to 10), or a group represented by the following formula (3):

[Chemical Formula 3]

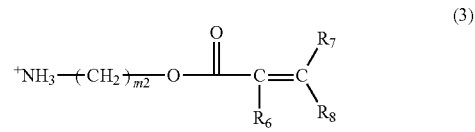

(3)

(wherein $R_6$, $R_7$ and $R_8$ are each independently a hydrogen atom or an organic group of 1 to 3 carbon atoms, and $m_2$ is an integer of 2 to 10),
with the proviso that $R_1$ and $R_2$ are not both hydrogen},
in formula (1):
    $X_1$ include formula (5) and $Y_1$ include formula (8); or
    $X_1$ include formula (6) and $Y_1$ include formula (8); or
    $X_1$ include formula (6) and $Y_1$ include formula (7);

[Chemical Formula 5]

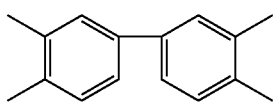

(5)

[Chemical Formula 6]

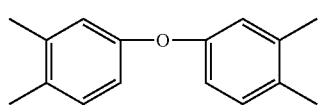

(6)

[Chemical Formula 7]

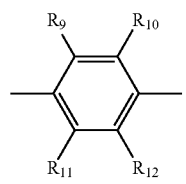

(7)

(wherein $R_9$-$R_{12}$ are each a hydrogen atom or a monovalent aliphatic group of 1 to 4 carbon atoms, which may be different from each other or the same), the following formula (8):

[Chemical Formula 8]

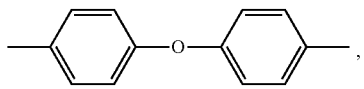

(8)

and the weight-average molecular weight (Mw) of the polyimide precursor (A) is 3,000 or greater and 13,000 or less in terms of polystyrene, according to gel permeation chromatography (GPC).

2. The negative-type photosensitive resin composition according to claim 1, wherein the weight-average molecular weight (Mw) of the polyimide precursor (A) is 3,000 or greater and less than 10,000, in terms of polystyrene, according to gel permeation chromatography (GPC).

3. A method for producing a cured relief pattern, comprising:
   (1) coating a photosensitive resin composition according to claim 1 onto a substrate to form a photosensitive resin layer on the substrate,
   (2) exposing the photosensitive resin layer to light,
   (3) developing the exposed photosensitive resin layer to form a relief pattern, and
   (4) heat treating the relief pattern to form a cured relief pattern.

4. The method for producing a cured relief pattern according to claim 3, wherein the substrate is made of copper or a copper alloy.

* * * * *